US012631968B2

(12) United States Patent
Sokolov et al.

(10) Patent No.: US 12,631,968 B2
(45) Date of Patent: May 19, 2026

(54) METROLOGY SYSTEM AND COHERENCE ADJUSTERS

(71) Applicant: ASML Netherlands B.V., Veldhoven (NL)

(72) Inventors: Sergei Sokolov, Eindhoven (NL); Simon Reinald Huisman, Eindhoven (NL); Jin Lian, Eindhoven (NL); Sebastianus Adrianus Goorden, Eindhoven (NL); Muhsin Eralp, Bethel, CT (US); Henricus Petrus Maria Pellemans, Veldhoven (NL); Justin Lloyd Kreuzer, Trumbull, CT (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 294 days.

(21) Appl. No.: 18/255,261

(22) PCT Filed: Dec. 2, 2021

(86) PCT No.: PCT/EP2021/084043
§ 371 (c)(1),
(2) Date: May 31, 2023

(87) PCT Pub. No.: WO2022/122560
PCT Pub. Date: Jun. 16, 2022

(65) Prior Publication Data
US 2024/0027913 A1    Jan. 25, 2024

Related U.S. Application Data

(60) Provisional application No. 63/122,619, filed on Dec. 8, 2020, provisional application No. 63/156,450, filed
(Continued)

(51) Int. Cl.
*G03F 7/00* (2006.01)

(52) U.S. Cl.
CPC ...... *G03F 7/70091* (2013.01); *G03F 7/70625* (2013.01); *G03F 7/70633* (2013.01)

(58) Field of Classification Search
CPC ........... G02B 2006/0098; G02B 6/262; G02B 6/32; G02B 6/3504; G03F 7/70091; G03F 7/70625; G03F 7/70633
See application file for complete search history.

(56) References Cited

U.S. PATENT DOCUMENTS 6,297,876 B1    10/2001    Bornebroek
6,961,116 B2    11/2005    Den Boef et al.
(Continued)

FOREIGN PATENT DOCUMENTS

EP    2196839 A1    6/2010
GB    2462444 A    2/2010
(Continued)

OTHER PUBLICATIONS

International Search Report and Written Opinion of the International Searching Authority directed to International Patent Application No. PCT/EP2021/084043, mailed Apr. 8, 2022; 14 pages.
(Continued)

*Primary Examiner* — Peter B Kim
(74) *Attorney, Agent, or Firm* — Pillsbury Winthrop Shaw Pittman, LLP

(57) ABSTRACT

A metrology system (400) includes a multi-source radiation system. The multi-source radiation system includes a waveguide device (502) and the multi-source radiation system is configured to generate one or more beams of radiation. The metrology system (400) further includes a coherence adjuster (500) including a multimode waveguide device (504). The multimode waveguide device (504) includes an
(Continued)

input configured to receive the one or more beams of radiation from the multi-source radiation system (514) and an output (518) configured to output a coherence adjusted beam of radiation for irradiating a target (418). The metrology system (400) further includes an actuator (506) coupled to the waveguide device (502) and configured to actuate the waveguide device (502) so as to change an impingement characteristic of the one or more beams of radiation at the input of the multimode waveguide device (504).

16 Claims, 24 Drawing Sheets

Related U.S. Application Data on Mar. 4, 2021, provisional application No. 63/192,910, filed on May 25, 2021.

(56) References Cited

U.S. PATENT DOCUMENTS

| | | | |
|---|---|---|---|
| 8,706,442 B2 | 4/2014 | Mos et al. | |
| 2004/0136665 A1 | 7/2004 | Furman et al. | |
| 2005/0141810 A1 | 6/2005 | Vaez-Iravani et al. | |
| 2009/0195768 A1 | 8/2009 | Bijnen et al. | |
| 2013/0148925 A1* | 6/2013 | Muendel | G02B 6/4216 |
| | | | 385/27 |
| 2014/0036361 A1* | 2/2014 | Woodgate | G02B 6/0061 |
| | | | 385/9 |
| 2014/0240951 A1 | 8/2014 | Brady et al. | |
| 2015/0268415 A1* | 9/2015 | Schowengerdt | G02B 27/0101 |
| 2016/0146998 A1* | 5/2016 | Tissot | G02B 6/0003 |
| | | | 362/558 |
| 2018/0372955 A1* | 12/2018 | Hodge | G02B 6/424 |
| 2019/0129316 A1* | 5/2019 | Zhou | G03F 7/70633 |
| 2022/0382175 A1* | 12/2022 | Sokolov | G03F 9/7088 |

FOREIGN PATENT DOCUMENTS

| | | |
|---|---|---|
| WO | WO 2014/004564 A1 | 1/2014 |
| WO | WO 2021/058338 A1 | 4/2021 |
| WO | WO 2021/110391 A1 | 6/2021 |

OTHER PUBLICATIONS

International Preliminary Report on Patentability directed to International Patent Application No. PCT/EP2021/084043, issued Jun. 13, 2023; 10 pages.

Ma et al., "Speckle Reduction by Optimized Multimode Fiber Combined With Dielectric Elastomer Actuator and Lightpipe Homogenizer," Journal of Display Technology, vol. 12, No. 10, May 13, 2016; pp. 1162-1167.

Pillai et al., "Deep-tissue access with confocal fluorescence microendoscopy through hypodermic needles," Optics Express, vol. 19, No. 8, Apr. 11, 2011; pp. 7213-7221.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Proc. SPIE, vol. 2725, Metrology, Inspection, and Process Control for Microlithography X, May 21, 1996; pp. 361-368.

* cited by examiner

1500

1502

1504

1506

1508

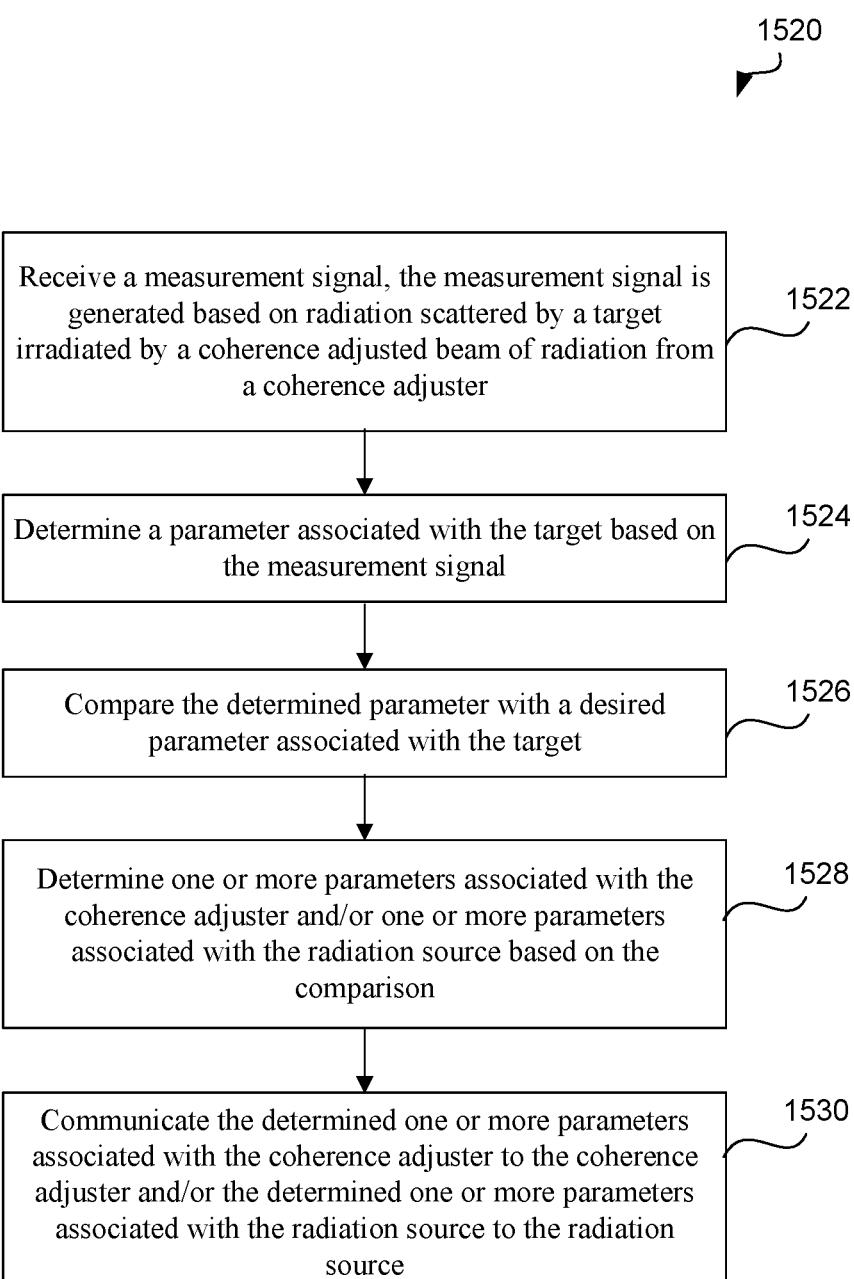

1520

Receive a measurement signal, the measurement signal is generated based on radiation scattered by a target irradiated by a coherence adjusted beam of radiation from a coherence adjuster    1522

Determine a parameter associated with the target based on the measurement signal    1524

Compare the determined parameter with a desired parameter associated with the target    1526

Determine one or more parameters associated with the coherence adjuster and/or one or more parameters associated with the radiation source based on the comparison    1528

Communicate the determined one or more parameters associated with the coherence adjuster to the coherence adjuster and/or the determined one or more parameters associated with the radiation source to the radiation source    1530

METROLOGY SYSTEM AND COHERENCE ADJUSTERS

CROSS-REFERENCE TO RELATED APPLICATIONS

This application claims priority of (1) U.S. Patent Application No. 63/122,619, which was filed on Dec. 8, 2020; (2) U.S. Patent Application No. 63/156,450, which was filed on Mar. 4, 2021; and (3) U.S. Patent Application No. 63/192,910, which was filed on May 25, 2021, all of which are incorporated herein in their entirety by reference.

FIELD

The present disclosure relates to illumination systems, for example, a coherence adjuster for metrology systems used in conjunction with lithographic processes.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Production speed and throughput is of great importance in lithographic fabrication of ICs and electronic devices. It is desirable for metrology systems used in fabrication to acquire measurements quickly for increasing wafer throughput. To increase measurement speed, the amount of radiation detected by the metrology system can be increased (e.g., use a brighter source) to shorten measurement time intervals while maintaining high accuracy.

SUMMARY

Accordingly, it is desirable to improve illumination systems of metrology apparatuses for improving accuracy in measurements performed in conjunction with lithographic processes.

In some embodiments, a metrology system comprises a radiation source, a coherence adjuster, a detector, and a processor. The coherence adjuster comprises a waveguide device having an input and an output, a multimode waveguide device having an input and an output, and an actuator. The radiation source is configured to generate spatially coherent radiation. The input of the waveguide device is configured to receive the coherent radiation. The input of the multimode waveguide device is configured to receive radiation from the waveguide device. The output of the multimode waveguide device is configured to output a coherence adjusted beam of radiation for irradiating a target. The actuator is coupled to the waveguide device and is configured to actuate the waveguide device so as to change an impingement characteristic of the received radiation at the input of the multimode waveguide device. An interference pattern of the coherence adjusted beam is adjusted based on the change of the impingement characteristic. The detector is configured to receive radiation scattered by the target based on the irradiating and to generate a measurement signal based on the received radiation at the detector. The processor is configured to analyze the measurement signal to determine a characteristic of the target.

In some embodiments, a coherence adjuster comprises a waveguide device having an input and an output, a multimode waveguide device having an input and an output, and an actuator. The input of the waveguide device is configured to receive coherent radiation. The input of the multimode waveguide device is configured to receive radiation from the waveguide device. The output of the multimode waveguide device is configured to output a coherence adjusted beam of radiation for irradiating a target. The actuator is coupled to the waveguide device and is configured to actuate the waveguide device so as to change an impingement characteristic of the received radiation at the input of the multi-mode waveguide device. An interference pattern of the coherence adjusted beam is adjusted based on the change of the impingement characteristic.

In some embodiments, a coherence adjuster comprises a multimode waveguide device having an input and an output, and an adjusting device. The input of the multimode waveguide device is configured to receive spatially coherent radiation. The output of the multimode waveguide device is configured to output a coherence adjusted beam of radiation for irradiating a target. The adjusting device is coupled to a portion of the coherence adjuster and is configured to adjust the portion so as to change an impingement characteristic of the received radiation at the input of the multimode waveguide device. An interference pattern of the coherence adjusted beam is adjusted based on the change of the impingement characteristic. The impingement characteristic comprises a distribution of incidence angles. The coherence adjuster is configured to adjust a beam diameter of the coherence adjusted beam based on a change of the distribution of incidence angles.

In some embodiments, a coherence adjuster comprises a multimode waveguide device having an input and an output, and a diffuser device. The input of the multimode waveguide device is configured to receive spatially coherent radiation. The output of the multimode waveguide device is configured to output a coherence adjusted beam of radiation for irradiating a target. The diffuser device is disposed upstream of the multimode waveguide device. The diffuser device is configured to change an impingement characteristic of the received radiation at the input of the multimode waveguide device. An interference pattern of the coherence adjusted beam is adjusted based on the change of the impingement characteristic. The impingement characteristic comprises a distribution of angles of incidence. The diffuser device is further configured to adjust a beam diameter of the coherence adjusted beam based on a change of the distribution of incidence angles.

In some embodiments, a coherence adjuster comprises a multimode waveguide device having an input and an output, an adjusting device, and an adjustable beam expander. The input of the multimode waveguide device is configured to receive spatially coherent radiation. The output of the multimode waveguide device is configured to output a coherence adjusted beam of radiation for irradiating a target. The adjusting device is coupled to a portion of the coherence adjuster and is configured to adjust the portion so as to change an impingement characteristic of the received radiation at the input of the multimode waveguide device. An interference pattern of the coherence adjusted beam is adjusted based on the change of the impingement characteristic. The impingement characteristic comprises a distribution of incidence angles. The adjustable beam expander is configured to adjust a beam diameter of the coherence adjusted beam.

In some embodiments, a metrology system includes a radiation source configured to generate spatially coherent radiation and a coherence adjuster. The coherence adjuster includes a multimode waveguide device including an input configured to receive the spatially coherent radiation and an output configured to output a coherence adjusted beam of radiation. The metrology system further includes a detector configured to measure a distribution of the coherence adjusted beam of radiation. The metrology system further includes a processor configured to compare the measured distribution with a desired distribution and determine a value of a parameter associated with the coherence adjuster based on the comparison. The processor is further configured to communicate the determined value of the parameter associated with the coherence adjuster to the coherence adjuster. The coherence adjuster is configured to adjust the parameter associated with the coherence adjuster based at least on the determined value.

In some embodiments, a metrology system includes a radiation source configured to generate spatially coherent radiation and a coherence adjuster. The coherence adjuster includes a multimode waveguide device including an input configured to receive the spatially coherent radiation and an output configured to output a coherence adjusted beam of radiation for irradiating a target. The metrology system further includes a detector configured to receive radiation scattered by the target based on the irradiation and to generate a measurement signal based on the received radiation. The metrology system further includes a processor configured to determine a parameter associated with the target based on the measurement signal and compare the determined parameter with a desired parameter associated with the target. The processor is further configured to determine a value of a parameter associated with the coherence adjuster based on the comparison. The processor is further configured to communicate the determined value of the parameter associated with the coherence adjuster to the coherence adjuster. The coherence adjuster is configured to adjust the parameter associated with the coherence adjuster based at least on the determined value.

In some embodiments, a method includes receiving a measurement signal, where the measurement signal is generated based on a measured distribution of a coherence adjusted beam of radiation output from a coherence adjuster. The method further includes comparing the measured distribution with a desired distribution and determining a value of a parameter associated with the coherence adjuster based on the comparison. The method also includes communicating the determined value of the parameter associated with the coherence adjuster to the coherence adjuster. The coherence adjuster is configured to adjust the parameter associated with the coherence adjuster based at least on the determined value.

In some embodiments, a method includes receiving a measurement signal, where the measurement signal is generated based on radiation scattered by a target irradiated by a coherence adjusted beam of radiation from a coherence adjuster. The method further includes determining a parameter associated with the target based on the measurement signal and comparing the determined parameter with a desired parameter associated with the target. The method also includes determining a value of a parameter associated with the coherence adjuster based on the comparison. The method further includes communicating the determined value of the parameter associated with the coherence adjuster to the coherence adjuster. The coherence adjuster is configured to adjust the parameter associated with the coherence adjuster based at least on the determined value.

In some embodiments, a non-transitory computer-readable medium storing instructions that, when executed by a processor, cause the processor to perform operations. The operations include receiving a measurement signal, where the measurement signal is generated based on a measured distribution of a coherence adjusted beam of radiation output from a coherence adjuster. The operations further include comparing the measured distribution with a desired distribution and determining a value of a parameter associated with the coherence adjuster based on the comparison. The operations also include communicating the determined value of the parameter associated with the coherence adjuster to the coherence adjuster. The coherence adjuster is configured to adjust the parameter associated with the coherence adjuster based at least on the determined value.

In some embodiments, a non-transitory computer-readable medium storing instructions that, when executed by a processor, cause the processor to perform operations. The operations include receiving a measurement signal, where the measurement signal is generated based on radiation scattered by a target irradiated by a coherence adjusted beam of radiation from a coherence adjuster. The operations further include determining a parameter associated with the target based on the measurement signal and comparing the determined parameter with a desired parameter associated with the target. The operations also include determining a value of a parameter associated with the coherence adjuster. The operations further include communicating the determined value of the parameter associated with the coherence adjuster to the coherence adjuster. The coherence adjuster is configured to adjust the parameter associated with the coherence adjuster based at least on the determined value.

In some embodiments, a metrology system includes a multi-source radiation system. The multi-source radiation system includes a combined waveguide device and the multi-source radiation system is configured to generate one or more beams of radiation. The metrology system further includes a coherence adjuster including a multimode waveguide device. The multimode waveguide device includes an input configured to receive the one or more beams of radiation from the multi-source radiation system and an output configured to output a coherence adjusted beam of radiation for irradiating a target. The metrology system further includes an actuator coupled to the combined waveguide device and configured to actuate the combined waveguide device so as to change an impingement characteristic of the one or more beams of radiation at the input of the multimode waveguide device.

In some embodiments, a metrology system includes a multi-source radiation system. The multi-source radiation system includes a combined waveguide device and the multi-source radiation system is configured to generate one or more beams of radiation. The metrology system further includes a coherence adjuster including a multimode waveguide device. The multimode waveguide device includes an input configured to receive the one or more beams of radiation and an output configured to output a coherence adjusted beam of radiation. The metrology system further includes an adjusting device coupled to a portion of the coherence adjuster and configured to adjust the portion so as to change an impingement characteristic of the one or more beams of radiation at the input of the multimode waveguide device.

In some embodiments, a metrology system includes a multi-source radiation system. The multi-source radiation system includes a first radiation source configured to generate a first radiation with a first polarization state, a second radiations source configured to generate a second radiation with a second polarization state orthogonal to the first polarization state, and combining element configured to generate the spatially coherent radiation by combining the first radiation and the second radiation. The metrology system further includes a coherence adjuster including a multimode waveguide device. The multimode waveguide device includes an input configured to receive the spatially coherent radiation from the multi-source radiation system and an output configured to output a coherence adjusted beam of radiation for irradiating a target.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 15B illustrates another example method for determining parameter(s) for a coherence adjuster and/or a radiation source and adjusting the coherence adjuster and/or the radiation source using the determined parameter(s), according to some embodiments of the disclosure.

Figure 1A:
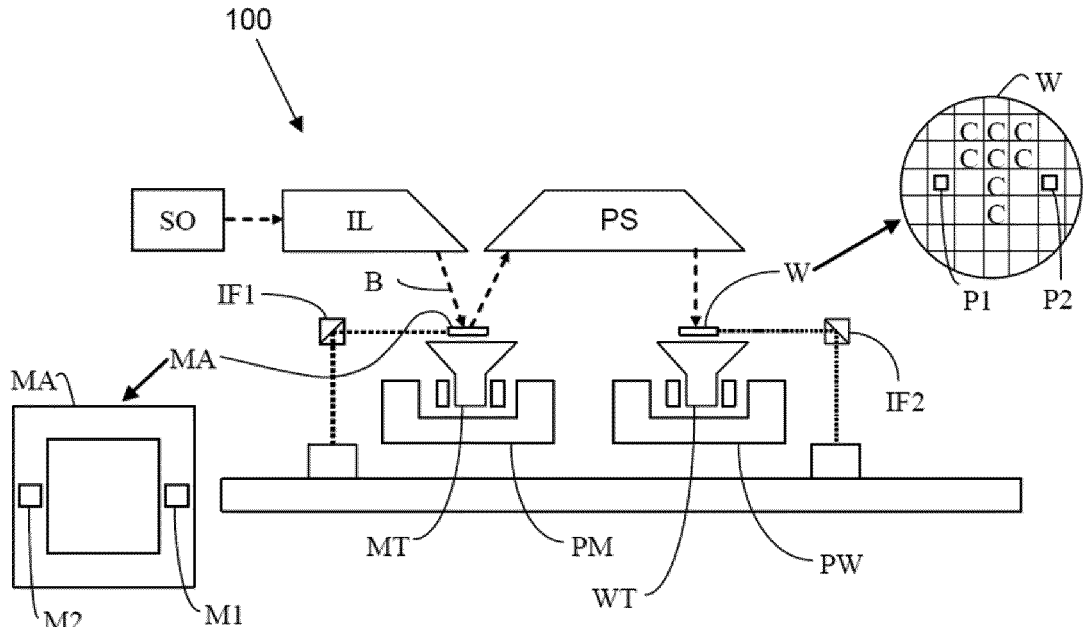
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" or the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
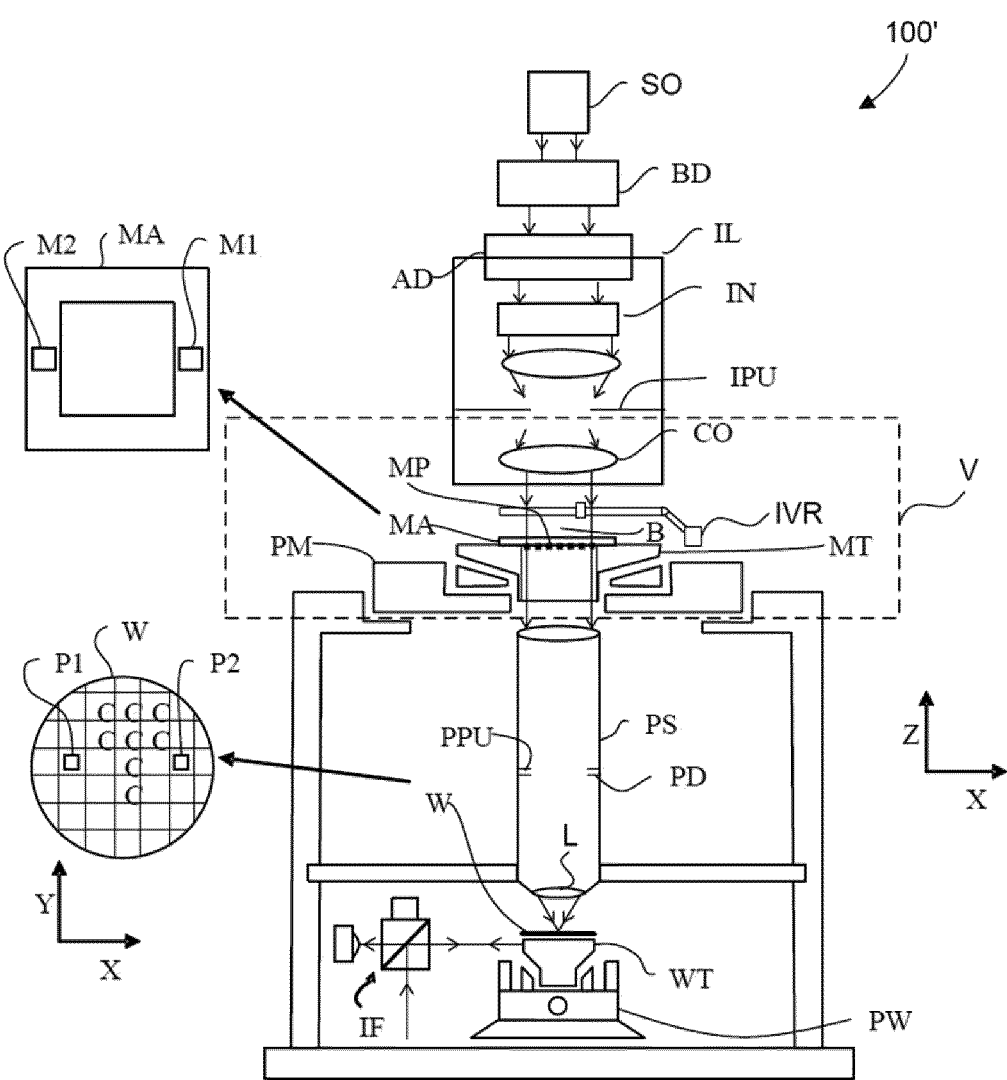
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The terms "inspection apparatus," "metrology apparatus," or the like can be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
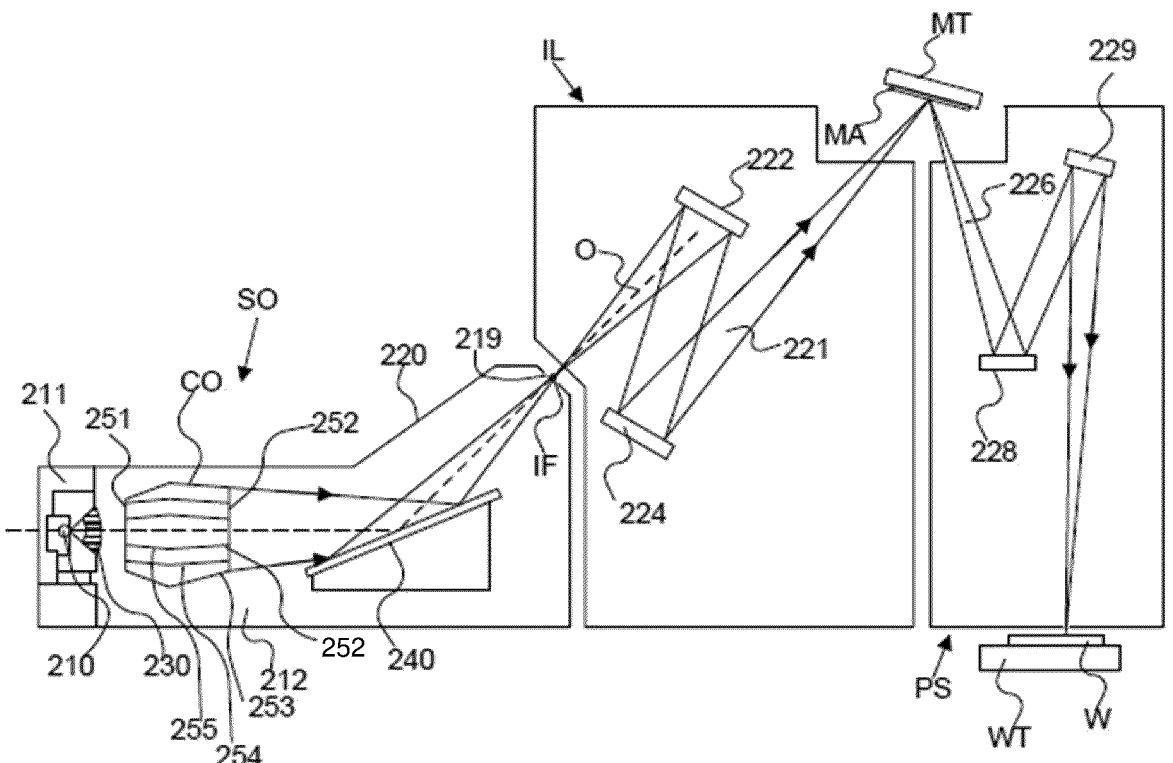
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
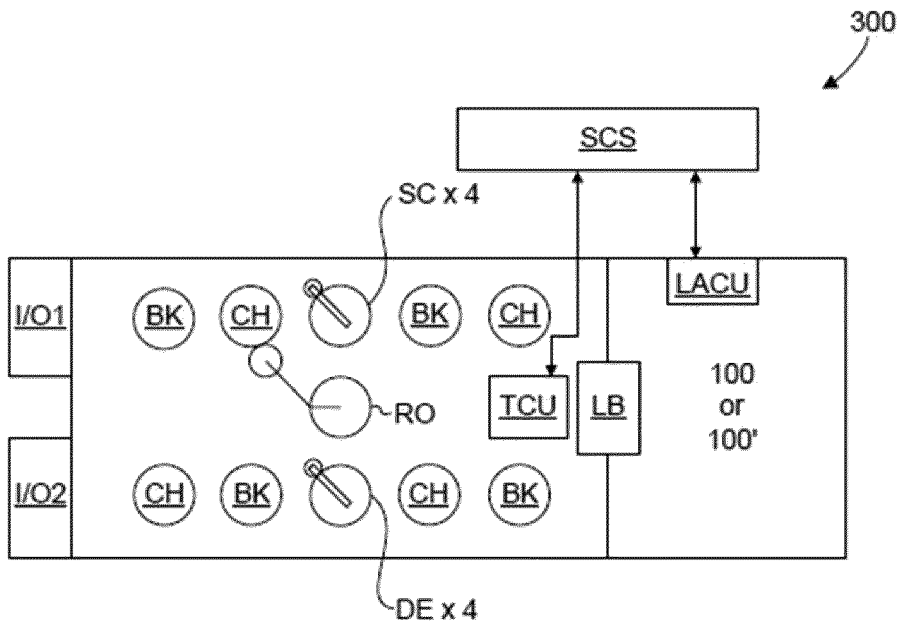
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Metrology System

In order to control the lithographic process to place device features accurately on the substrate, alignment marks are generally provided on the substrate, and the lithographic apparatus includes one or more for accurate positioning of marks on a substrate. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
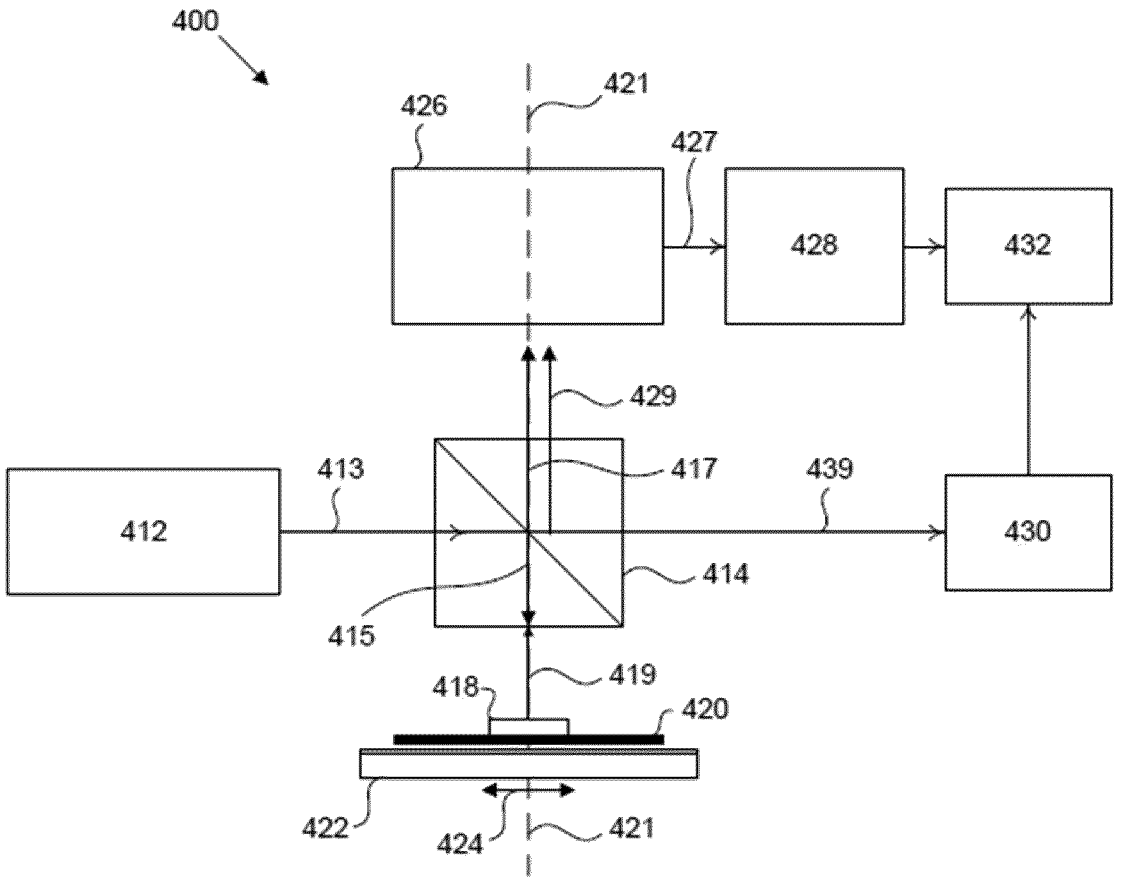
FIGS. 4A and 4B show schematics of inspection apparatuses, according to some embodiments.

FIG. 4A shows a schematic of a cross-sectional view of an metrology system 400 that can be implemented as a part of lithographic apparatus 100 or 100', according to some embodiments. In some embodiments, metrology system 400 can be configured to align a substrate (e.g., substrate W) with respect to a patterning device (e.g., patterning device MA). Metrology system 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, metrology system 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., metrology system 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 1800 and recombine the rotated and unrotated images interferometrically.

In some embodiments, detector 428 can be configured to receive the recombined image via interferometer signal 427 and detect interference as a result of the recombined image when alignment axis 421 of metrology system 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961, 116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of metrology system 400 or any other reference element such that the center of symmetry of alignment mark or target 418 can be known with reference to metrology system 400 or any other reference element. Beam analyzer 430 can be a point or an imaging polarimeter with some form of wavelength-band selectivity. In some embodiments, beam analyzer 430 can be directly integrated into metrology system 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range. In some embodiments, each PIN detector can have a separate pre-amp. The number of elements is therefore limited. CCD linear arrays offer many elements that can be read-out at high speed and are especially of interest if phase-stepping detection is used.

Figure 4B:
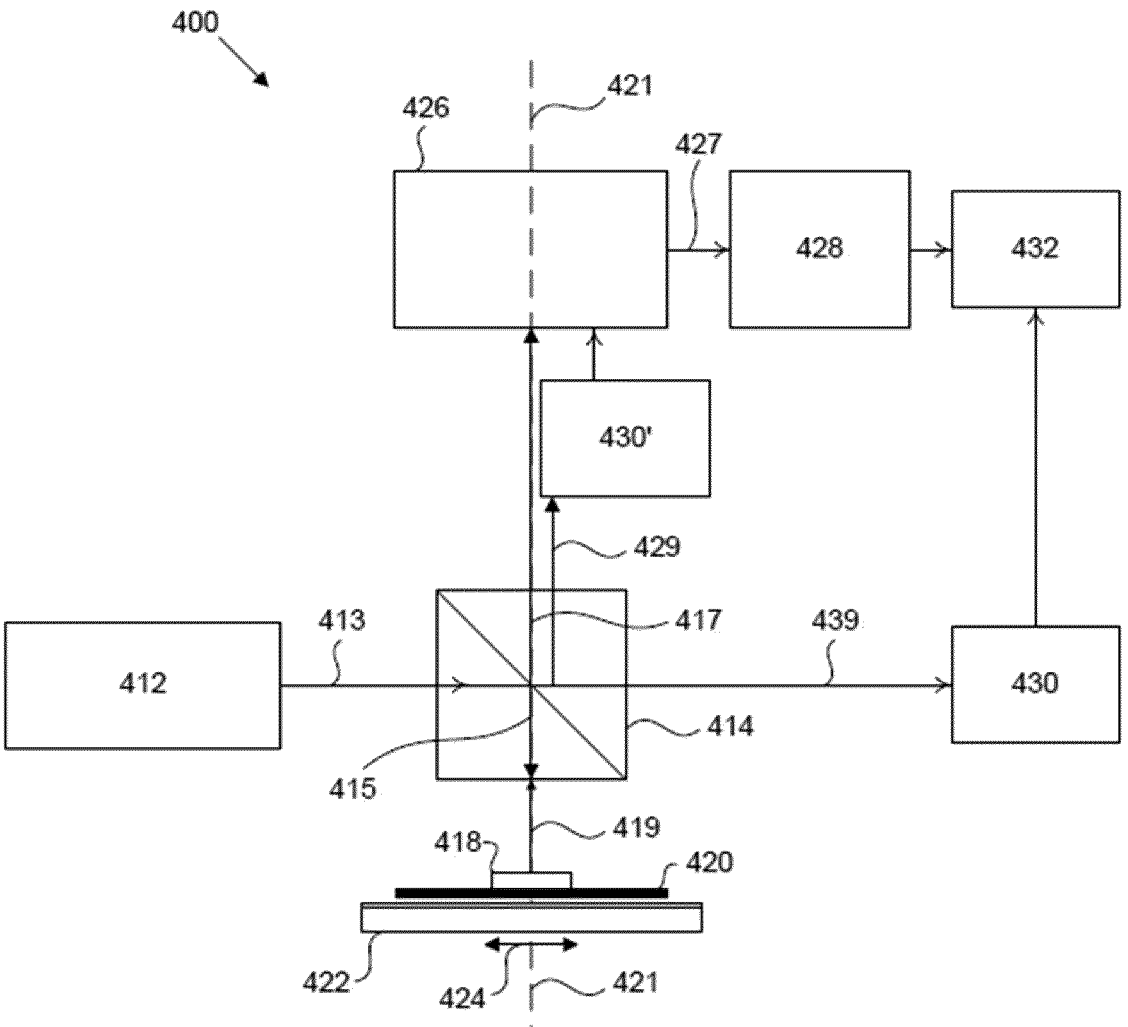

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of metrology system 400, or any other reference element, such that the center of symmetry of alignment mark or target 418 can be known with reference to metrology system 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into metrology system 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the metrology system 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. The process may have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the metrology system 400.

Exemplary Apparatuses for Coherence Scrambling

As ICs continue to shrink, demand is increasing for lithographic tools capable of processing smaller and more densely packed metrology targets (e.g., alignment marks). A single wafer can include numerous targets for measurements (e.g., alignment, overlay, or the like). In turn, the large number of targets on the wafer can introduce delays in production due to the additional measurements, reducing production throughput. Therefore, it is desirable for metrology systems to measure targets faster for increasing wafer throughput.

A solution can be to reduce the time spent measuring each target. However, such an implementation can be challenging. For example, in an attempt to quickly move from target to target, a detection time (e.g., photon collection time or integration time) of a metrology system can be reduced. But in this scenario, the measurements can suffer signal-to-noise issues that degrade the reliability of the measurements. It is analogous to setting a very high shutter speed on a camera used in photography (e.g., a few milliseconds of exposure), resulting in the capture of a poorly resolved image due to the lack of sufficient illumination.

To address this issue, the amount of radiation detected by the metrology system can be increased (e.g., use a brighter source). Radiation sources may come in coherent and incoherent varieties. For metrology, a homogenous beam spot is desirable since inhomogeneity in the beam spot, such as a speckle pattern, can introduce errors in a measurement. The effect of a speckle pattern is analogous to a photograph image having uneven brightness-bright and dark areas.

Bright-source solutions are further constrained depending on the tool they are implemented in. For example, in typical microscopy applications, a light bulb can suffice for a number of reasons. Spatially incoherent radiation sources (e.g., lamps (light bulbs), LEDs, plasma sources (laser pumped plasma light source), or the like), can output bright and homogeneous light. The etendue of a light bulb (e.g., spread out in all directions) is not a problem for many microscopy applications. The term "etendue" can be used herein to refer to a property of light of an optical system that characterizes a spread of radiation intensity in area and angle. On the other hand, high-precision metrology systems, such as ones used in conjunction with lithographic processes, can have highly constraining etendue requirements, which can hinder light-bulb implementation. In the process of conditioning the etendue of a light bulb to conform to a high precision metrology system (e.g., via mirrors, lenses, apertures, and other optical hardware), much radiation can be lost. And lost radiation is counter to the goal of providing a high-brightness source.

In some embodiments, the terms "spatial coherence," "spatially coherent," "spatial incoherence," or the like may be used to refer to coherence phenomena, or lack thereof, in which a portion of radiation (e.g., wavefronts) can interfere with a spatially shifted version of itself. Furthermore, the terms "temporal coherence," temporally coherent," "temporal incoherence," or the like, may be used to refer to coherence phenomena, or lack thereof, in which a portion of radiation can interfere with a time-delayed version of itself. It should be appreciated that, depending on the radiation source, radiation can be spatially coherent, temporally coherent, or both.

For high-precision metrology systems, spatially coherent radiation sources, such as a laser, are desirable for their high brightness and tight etendue (e.g., a highly directional beam). Spatially coherent radiation sources can also be more energy efficient than traditional incoherent sources. However, speckle phenomena—an interference effect—can reduce their desirability. In embodiments described herein, the terms "interference pattern," "speckle," "speckling," "speckling pattern," or the like can be used to refer to coherent radiation having a cross section that exhibits inhomogeneous intensity.

In some embodiments, radiation from a spatially coherent source can be adjusted so as to reduce undesirable effects of speckles. The terms "scrambled," "coherence scrambling," or the like, can be used herein to refer to the phenomena where coherent radiation is converted into incoherent or partially-coherent radiation (either in part or in full) by, e.g., increasing incoherence of the radiation or changing a spatial intensity distribution of wavefronts of the radiation over time (e.g., varying the speckle pattern over time). The term "coherence adjustment" or the like can be used herein to refer to the process of adjusting a state of coherence of radiation—for example, adjusting a speckle pattern. It should be appreciated that, in the process of varying or scrambling a speckle pattern of coherent radiation, the instantaneous speckle pattern is an interference pattern of spatially coherent radiation, but the coherent radiation can appear to be scrambled or incoherent from the perspective of a detector that integrates the variation of the speckle pattern over a given time frame (e.g., averaging). The terms "coherence scrambler," "coherence adjuster," or the like can be used herein to refer to devices that implement adjustment of coherence to achieve coherence scrambling.

One method includes using a mechanical coherence adjuster, such as a diffuser plate. In some embodiments, a mechanical coherence adjuster can comprise a source of spatially coherent radiation and an actuatable diffuser plate. Coherent radiation can be incident on the actuatable diffuser plate. The radiation can scatter with unpredictable phases (e.g., randomized). The phases can be varied by moving the diffuser plate such that the incidence of the radiation on a rough surface changes over time. The radiation scattered (and coherence scrambled) by the diffuser plate can be collected to be sent to a target. The beam of scrambled radiation can have a speckle pattern that continually changes at a rate based on the roughness profile of the diffuser plate and rate of actuation.

In some embodiments, a metrology system can comprise the mechanical coherence adjuster to generate a beam of scrambled radiation to send to a target. As the radiation scattered from the target is received at a detector, the varying speckle pattern is integrated over a finite detection period (e.g., averaged out).

Certain mechanical coherence adjusters, such as a diffuser plate, can suffer a variety of issues. In some embodiments, diffuser plates can cause inefficient use of photons (e.g., some stray photons can be lost). Regarding speed of measurement, demands of the industry are gravitating toward metrology systems that can measure a target in milliseconds or less. It is desirable that a coherence adjuster be able to vary a speckle pattern over numerous distinct patterns in a detection period (e.g., 1000 variations in a millisecond) to attain a suitable averaging (a non-limiting example). However, a typical diffuser plate may be designed for pattern adjustment speeds in the range of kHz. Thus, some diffuser plate implementations can fall short of providing a satisfactory variation speed of a speckle pattern. Another problem of a diffuser plate is that it can produce random speckle patterns, and therefore might not produce enough variants of the pattern to scramble coherence within a given integration time-difficult to achieve optimal coherence scrambling. Additionally, having fast moving mechanical components in a clean environment (e.g., in a lithographic apparatus) can present problems, such as vibrations, release of contaminants, and catastrophic failures. Furthermore, some diffuser plates can be undesirably large and bulky for certain applications. However, if circumstances allow, some diffuser implementations can be used (e.g., as described with respect to FIG. 12).

Embodiments of the present disclosure provide structures and functions to more quickly and efficiently perform inspection of structures on a substrate, for example, using a coherence adjuster to convert a powerful coherent source into a powerful coherence scrambled source for irradiating a target. Furthermore, the structures and functions of embodiments described herein allow for compact coherence scrambler modules that can be roughly pen-sized or fit on the palm of a user's hand. In some embodiments, structures and functions of coherence adjusters can be implemented using, e.g., a multi-mode fiber, a diffuser device, an actuatable fiber, or the like.

Figure 5:
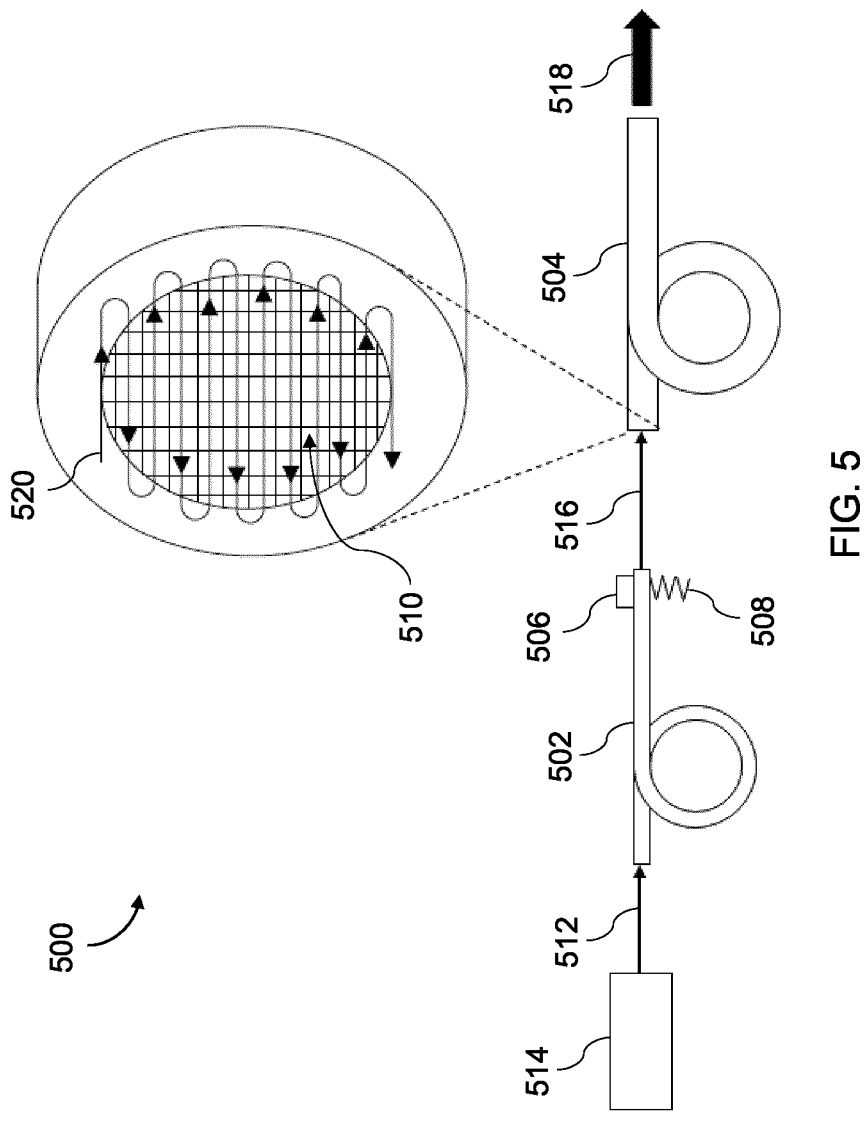
FIGS. 5-12 show schematics of coherence adjusters, according to some embodiments.

FIG. 5 shows a schematic of a coherence adjuster 500, according to some embodiments. In some embodiments, coherence adjuster 500 can comprise a waveguide device 502, a multimode waveguide device 504, and an actuator 506. Coherence adjuster 500 can further comprise a restoring device 508.

In some embodiments, waveguide device 502 can comprise a single-mode fiber. Multimode waveguide device 504 can comprise a multimode fiber. The term "waveguide device" or the like can be used herein to refer to a device that can propagate radiation by directing the radiation along a guide and/or medium. An example of a waveguide device is an optical fiber. Another example of a waveguide device is a microwave cavity. Yet another example of a waveguide device is a strip of light-transmissive material affixed on a substrate (e.g., as can be found in photonic circuits).

In some embodiments, multimode waveguide device 504 can comprise an input facet 510. The dimensions of input facet 510, and the body of multimode waveguide device 504, are capable of supporting multiple modes of propagation of radiation, as opposed to only a single mode.

In some embodiments, actuator 506 can comprise one or more actuator elements (e.g., one for each direction of motion). The actuator elements can comprise piezo devices. Actuator 506 can be coupled to waveguide device 502. Restoring device 508 can comprise one or more restoring elements (e.g., one for each direction of motion). Restoring device 508 can be coupled to waveguide device 502.

In some embodiments, waveguide device 502 can comprise an input for receiving a beam of coherent radiation 512. Coherent radiation 512 can be at least spatially coherent radiation (e.g., can also include temporally coherent radiation) and can be generated by a radiation source 514 (e.g., a laser). Waveguide device 502 can further comprise an output from which a beam of radiation 516 can exit. Radiation 516 is coherent radiation 512 that has been adjusted before being received at input facet 510.

In some embodiments, input facet 510 can receive radiation 516 from waveguide device 502. Multimode waveguide device 504 can further comprise an output for outputting a beam of radiation 518 (also "coherence adjusted beam of radiation"). Beam of radiation 518 is radiation 516 that has been guided by multimode waveguide device 504. Beam of radiation 518 can comprise an interference pattern (e.g., speckles) as a result of constructive and destructive interference. The form of the interference pattern depends on an impingement characteristic of radiation 516 at input facet 510. The impingement characteristic can include, for example, a position and/or size of the beam spot of radiation 516 at input facet 510 (which influences which modes are used for propagation). Additionally or alternatively, the impingement characteristic can include angle(s) of incidence of radiation 516 at input facet 510. In other words, the form of the interference pattern depends on the etendue of radiation 516 at input facet 510.

Consequently, in some embodiments, an adjustment of the interference pattern can be achieved by changing the impingement characteristic (or changing the etendue of radiation 516). Or in other words, the change of the impingement characteristic comprises a change of etendue of the received radiation at input facet 510 of multimode waveguide device 504.

In some embodiments, an apparent coherence of beam of radiation 518, over an integrated time frame, is reduced based on an adjustment of the interference pattern in response to the change of the impingement characteristic. The reference to the 'integrated time frame' relates to how a detector can integrate (e.g., average) the changing speckle pattern over a given time frame such that the detected radiation is indistinguishable from homogeneous, incoherent radiation. In other words, homogeneity of beam of radiation 518, over an integrated time frame, is increased based on an adjustment of the interference pattern in response to the change of the impingement characteristic.

In some embodiments, actuating waveguide device 502 can change the impingement characteristic of beam of radiation 516 at input facet 510. FIG. 5 illustrates an example of changing a position of a focus spot of radiation 516 at input facet 510. In this non-limiting example, the change of the impingement characteristic comprises a change of a position of the focus spot of radiation 516 at input facet 510 of multimode waveguide device 504. Further, in this non-limiting example, the change of position of the focus spot is illustrated as a raster scan pattern 520. Other patterns can also be used, such as spiral scan pattern, Lissajous scan pattern, or the like. The modes of propagation used by radiation launched into multimode waveguide device 504 is changed over time as the focus spot of radiation 516 is moved across input facet 510. The modes of propagation influence the configuration of rays of beam of radiation 518 (which superimpose and interfere to form the speckle pattern). Consequently, the speckle pattern also changes and evolves over time as input facet 510 is scanned. In contrast with the traditional diffuser plate described earlier, scanning a single mode fiber (or scanning galvanic mirrors) can sample the complete mode space of the multimode fiber equally within a given integration time which results in optimally scrambled coherence.

Referring back to the actuation mechanism, actuator 506 can deflect and/or translate waveguide device 502 so as to change the impingement characteristic of radiation 516 at input facet 510. As mentioned, actuator 506 can comprise one or more piezo devices. The piezo device(s) can exhibit a mechanical response (e.g., movement) in response to a received electrical signal. It should be appreciated that actuator 506 can comprise, not only piezos, but other types and/or combinations of suitable motors (e.g., magnet-driven). Optionally, restoring device 508 can be used to restore waveguide device 502 to a resting position. For example, restoring device can comprise a spring(s), a flexure (s), a piston device(s), or the like, or combinations thereof. Restoring device 508 can restore a position of waveguide device 502 along an axis of motion of actuator 506. For multiple actuator elements and restoring elements, sets can be arranged such that waveguide device 502 is translated/deflected and restored along more than one axis (e.g., X and Y axes, with Z being a direction of propagation of radiation 516).

In some embodiments, coherence adjuster 500 can be used in a metrology system. Beam of radiation 518 can be directed to a target on a wafer. The metrology system can be used in conjunction with lithographic apparatuses and processes.

In some embodiments, parts of coherence adjuster 500 can be modular. For example, the output of waveguide device 502 can be fashioned as a fiber connector. Input facet 510 can also be part of a fiber connector. Waveguide device 502 and actuator 506 (and restoring device 508, if present) can be housed in a module that connects to multimode waveguide device 504. In other words, waveguide device 502 and actuator 506 can modularly decouple from multimode waveguide device 504. Furthermore, it is desirable that the general dimensions of coherence adjuster 500 be fairly compact. For example, considering the typical sizes of off-the-shelf actuators and optical fiber connectors, coherence adjuster 500 can be envisaged as pen-sized device (e.g., approximately tens of centimeters in length and few centimeters in width).

Figure 6:
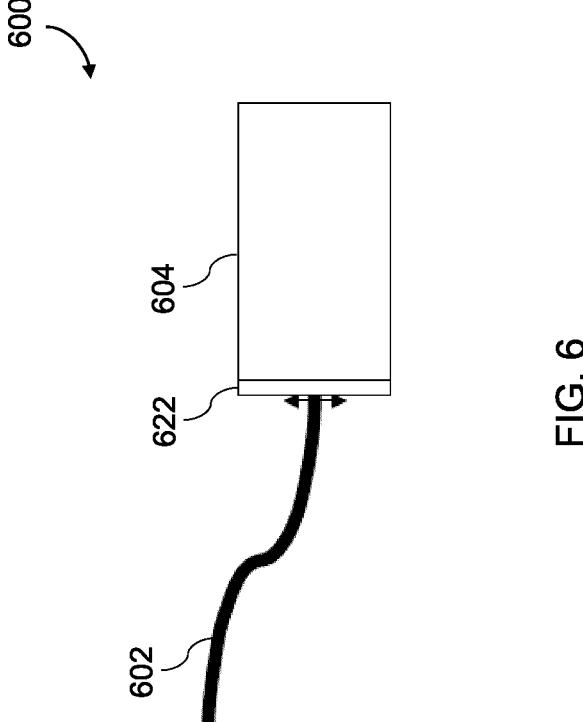

FIG. 6 shows a schematic of a coherence adjuster 600, according to some embodiments. In some embodiments, coherence adjuster 600 can also represent a more detailed view of coherence adjuster 500 (FIG. 5). For example, FIG. 6 illustrates a more detailed view the coupling between two waveguide devices. Unless otherwise noted, elements of FIG. 6 that have similar reference numbers as elements of FIG. 5 (e.g., reference numbers sharing the two right-most numeric digits) can have similar structures and functions. For simplicity, the similar structures, as well as structures that have been omitted from view (for drawing clarity), will not be reintroduced in detail.

In some embodiments, waveguide device 602 can be in contact, or near-contact, with multimode waveguide device 604. To reduce coupling loss, a coupling material 622 can be disposed between waveguide device 602 and multimode waveguide device 604 (e.g., disposed on multimode waveguide device 604 with waveguide device 602 being in contact with coupling material 622). Coupling material 622 can comprise an index matching medium, for example, gel, oil, or the like. When waveguide device 602 is actuated (example vertical motion shown by double-sided arrows), coupling material 622 allows waveguide device 602 to move across an input facet of multimode waveguide device 604 while reducing friction to prevent damage of sensitive optical parts. Performing scan patterns at the input face of multimode waveguide device 604 is facilitated by coupling material 622. However, in some embodiments, certain functionalities are allowed if waveguide device 602 and multimode waveguide device 604 are physically apart, as will be described in reference to FIG. 7.

In some embodiments, size and modularity aspects of coherence adjuster 600 can be as described in reference to FIG. 5.

Figure 7:
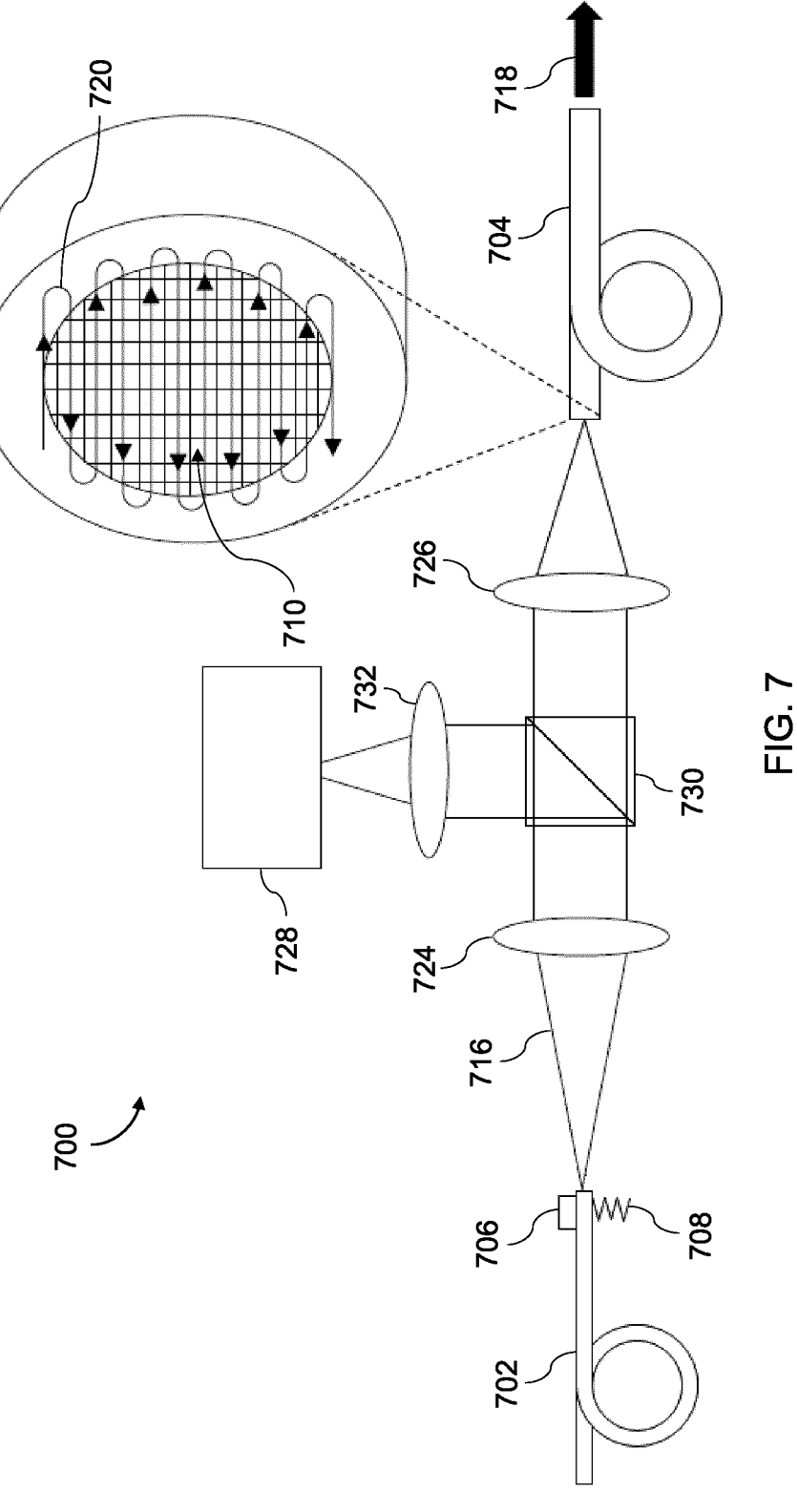

FIG. 7 shows a schematic of a coherence adjuster 700, according to some embodiments. In some embodiments, coherence adjuster 700 can also represent a more detailed view of coherence adjuster 500 (FIG. 5). For example, FIG. 7 illustrates a more detailed view the coupling between two waveguide devices. Unless otherwise noted, elements of FIG. 7 that have similar reference numbers as elements of FIGS. 5 and 6 (e.g., reference numbers sharing the two right-most numeric digits) can have similar structures and functions. For simplicity, the similar structures, as well as structures that have been omitted from view (for drawing clarity), will not be reintroduced in detail.

In some embodiments, coherence adjuster 700 can comprise a waveguide device 702, a multimode waveguide device 704, and optical elements 724 and 726 (e.g., a lens or a system of lenses). Coherence adjuster 700 can also comprise a beam splitter device 730, an optical element 732 (e.g., a lens or a system of lenses), and a detector 728.

In some embodiments, radiation 716, which is output from waveguide device 702, is incident on an input facet 710 of multimode waveguide device 704. Optical arrangements can be disposed between waveguide device 702 and multimode waveguide device 704. For example, optical elements 724 and 726 can be disposed in the path of radiation 716. Optical element 724 can collimate radiation 716 (e.g., make its propagation substantially parallel). Optical element 726 can focus radiation 716 so as to form a beam spot of radiation 716 that is focused at input facet 710. Beam splitter device 730 can direct a portion of radiation 716 toward detector 728. Detector 728 can generate a detection signal based on the received portion of radiation 716. The detection signal can be analyzed (e.g., by a processor) to determine an impingement characteristic of radiation 716 at input facet 710. In this manner, one or more aspects of the impingement characteristic can be observed or monitored (e.g., a position of a focus spot at input facet 710) to ensure that beam of radiation 718 has desired scrambling characteristics (also "coherence adjusted beam of radiation").

In some embodiments, optical element 726 can be removed such that the beam spot of radiation 716 is not focused at input facet 710 (or alternative/additional arrangements of optical elements can be used to achieve the same effect). In this scenario, with the beam spot filling a larger part, or nearly all, of input facet 710, the impingement characteristic can still be changed (e.g., angle(s) of incidence). It should be appreciated that the beam diameter of radiation 716 at its widest has been exaggerated for a clearer drawing (e.g., it can be just wide enough to fill input facet 710 when unfocused). Embodiments that can use an unfocused beam at an input facet of a multimode waveguide device will be described in reference to FIG. 11.

In some embodiments, parts of coherence adjuster 700 can be modular. For example, the output of waveguide device 702 can be fashioned as a fiber connector. Input facet 710 can also be part of a fiber connector. Waveguide device 702 and actuator 706 (and restoring device 708, if present) can be housed in a first module. Detector 728, beam splitter device 730, and optical elements 724, 726, and 732 can be housed in a second module. The second module can decouple from multimode waveguide device 704. The first module (e.g., waveguide device 702 and actuator 706) can modularly decouple from the second module. It should be appreciated that decoupling the second module from multimode waveguide device 704 has the effect of decoupling waveguide device 702 and actuator 706 from multimode waveguide device 704. Furthermore, it is desirable that the general dimensions of coherence adjuster 700 be fairly compact. For example, considering the typical sizes of off-the-shelf camera detectors, lenses, and optical fiber connectors, coherence adjuster 700 can be envisaged as fitting approximately on the palm of a user's hand (e.g., approximately tens of centimeters in breadth).

Figure 8:
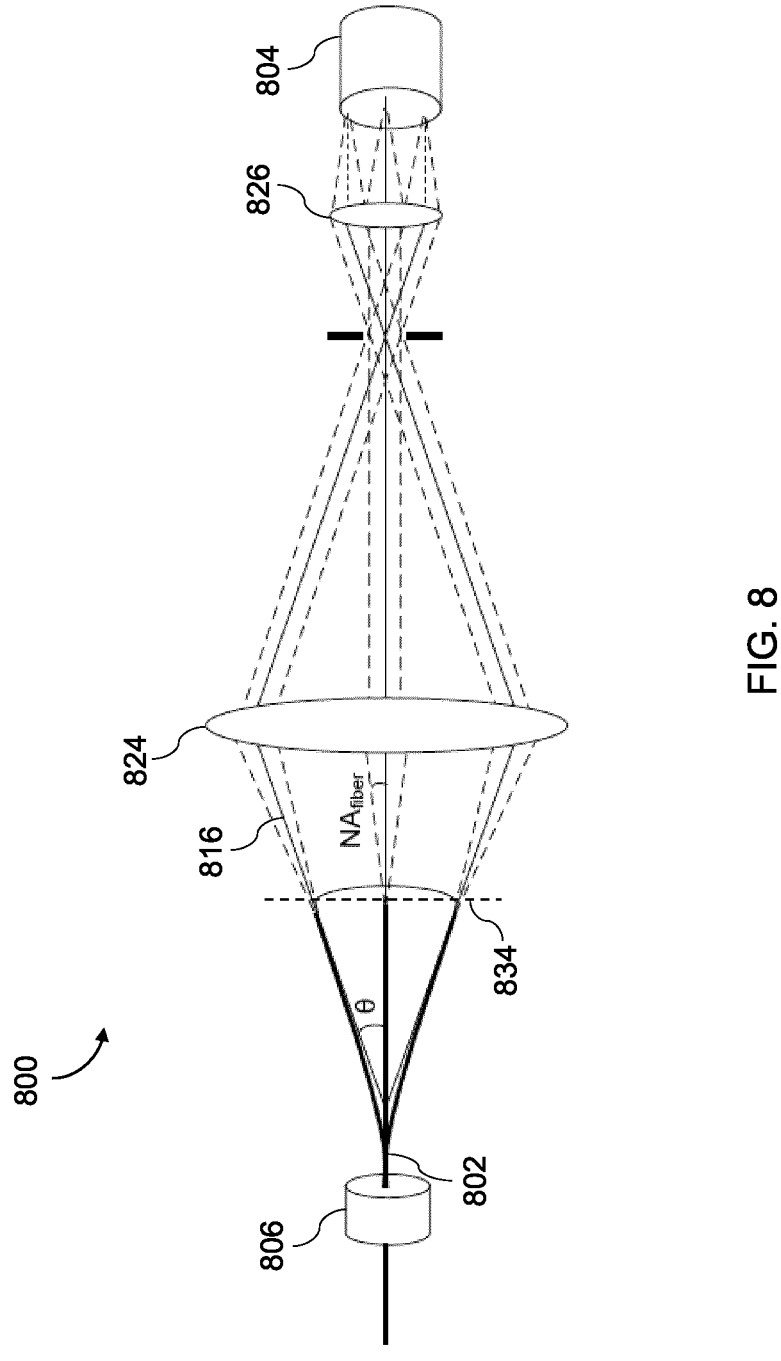

FIG. 8 shows a coherence adjuster 800, according to some embodiments. In some embodiments, coherence adjuster 800 can also represent a more detailed view of coherence adjuster 500 (FIG. 5). For example, FIG. 8 illustrates a more detailed view the coupling between two waveguide devices. Unless otherwise noted, elements of FIG. 8 that have similar reference numbers as elements of FIGS. 5-7 (e.g., reference numbers sharing the two right-most numeric digits) can have similar structures and functions. For simplicity, the similar structures, as well as structures that have been omitted from view (for drawing clarity), will not be reintroduced in detail.

In some embodiments, coherence adjuster 800 can comprise a waveguide device 802, a multimode waveguide device 804, an actuator 806, and optical elements 824 and 826 (e.g., a lens or a system of lenses). Actuator 806 can comprise a piezo tube. The piezo tube can be disposed around waveguide device 802, while leaving a flexible portion of waveguide device 802 to protrude toward multimode waveguide device 804.

In some embodiments, waveguide device 802 can be a fiber (a non-limiting example). The angular range of radiation output by waveguide device 802 is denoted by $NA_{fiber}$. Actuator 806 can be provided a signal (e.g., a current or voltage) to actuate waveguide device 802. The actuation can cause waveguide device 802 to translate and/or deflect by an amount denoted by θ.

In some embodiments, actuating waveguide device 802 can change the impingement characteristic of radiation 816 at an input facet 810 of multimode waveguide device 804. Similar to FIG. 5, FIG. 8 illustrates an example of changing a position of a focus spot of radiation 816 at input facet 810, but this is a non-limiting example and other impingement characteristics can be changed (e.g., as described in reference to FIG. 11). The change of the impingement characteristic comprises a change of a position of the focus spot of radiation 816 at input facet 810 of multimode waveguide device 804. Further, in this non-limiting example, the change of position of the focus spot can be performed as described earlier in reference to raster scan pattern 520 (FIG. 5) (e.g., raster, spiral scan pattern, Lissajous, or the like). The modes of propagation used by radiation launched into multimode waveguide device 804 is changed over time as the focus spot of radiation 816 is moved across input facet 810. Consequently, the speckle pattern also changes and evolves over time as input facet 810 is scanned.

In some embodiments, an apparent coherence of a beam of radiation that is output by multimode waveguide device 804 is reduced based on an adjustment of the speckle pattern in response to the change of the impingement characteristic. In other words, homogeneity of the beam of radiation output by multimode waveguide device 804, over an integrated time frame, is increased based on an adjustment of the interference pattern in response to the change of the impingement characteristic.

In some embodiments, size and modularity aspects of coherence adjuster 800 can be as described in reference to FIG. 7.

In some embodiments, optical elements 824 and 826 can be removed and waveguide device 802 and multimode waveguide device 804 can be disposed closer together, which will be described in reference to FIG. 9.

Figure 9:
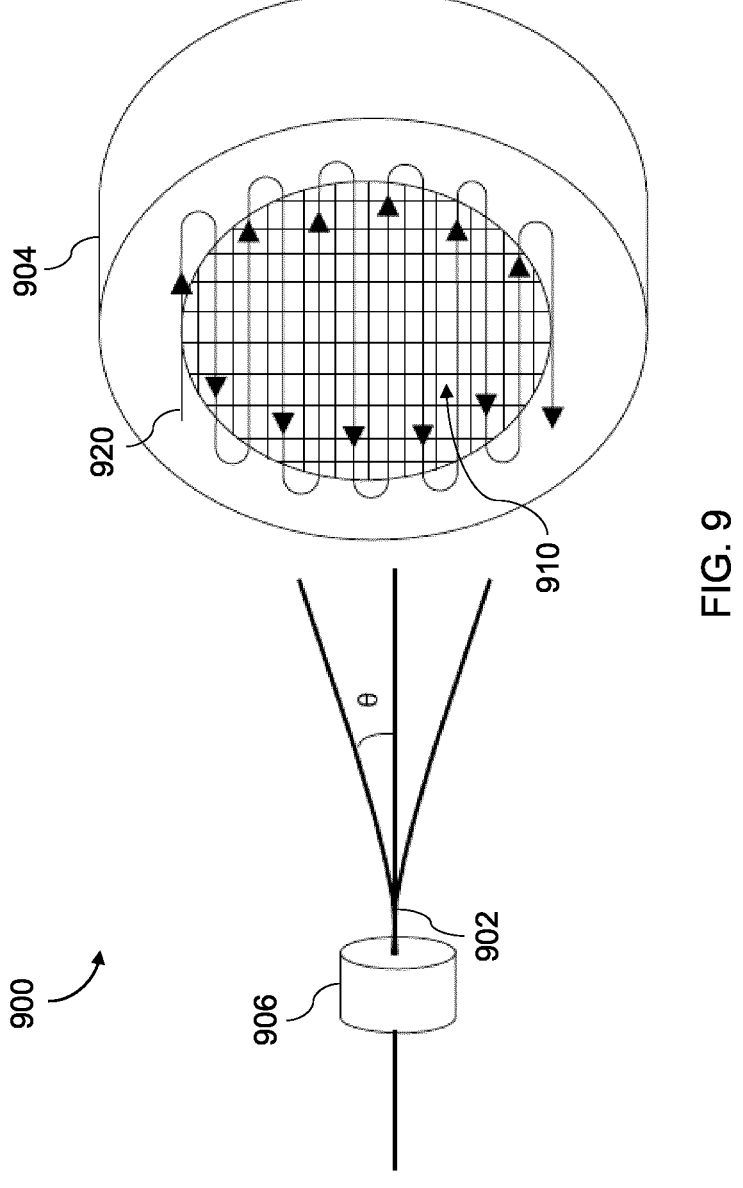

FIG. 9 shows a coherence adjuster 900, according to some embodiments. In some embodiments, coherence adjuster 900 can also represent a more detailed view of coherence adjuster 500 (FIG. 5). For example, FIG. 9 illustrates a more detailed view the coupling between two waveguide devices. Unless otherwise noted, elements of FIG. 9 that have similar reference numbers as elements of FIGS. 5-8 (e.g., reference numbers sharing the two right-most numeric digits) can have similar structures and functions. For simplicity, the similar structures, as well as structures that have been omitted from view (for drawing clarity), will not be reintroduced in detail.

In some embodiments, coherence adjuster 900 can comprise a waveguide device 902, a multimode waveguide device 904, and an actuator 906. Actuator 906 can comprise a piezo tube.

In some embodiments, actuator 906 can be provided a signal (e.g., a current or voltage) to actuate waveguide device 902. The actuation can cause waveguide device 902 to translate and/or deflect by an amount denoted by θ. In some embodiments, actuating waveguide device 902 can change the impingement characteristic of radiation at an input facet 910 of multimode waveguide device 904. Similar to FIG. 5, FIG. 9 illustrates a non-limiting example of changing a position of a beam spot of the radiation at input facet 910. The change of the impingement characteristic comprises a change of a position of the focus spot the radiation at input facet 910. Further, in this non-limiting example, the change of position of the focus spot can be performed as described earlier in reference to raster scan pattern 520 (FIG. 5) (e.g., raster, spiral scan pattern, Lissajous, or the like). The modes of propagation used by radiation launched into multimode waveguide device 904 is changed over time as the focus spot of the radiation at input facet 910 is moved across input facet 910. Consequently, the speckle pattern also changes and evolves over time as input facet 910 is scanned.

In some embodiments, an apparent coherence of a beam of radiation that is output by multimode waveguide device 904 is reduced based on an adjustment of the speckle pattern in response to the change of the impingement characteristic. In other words, homogeneity of the beam of radiation output by multimode waveguide device 904, over an integrated time frame, is increased based on an adjustment of the interference pattern in response to the change of the impingement characteristic.

In some embodiments, size and modularity aspects of coherence adjuster 900 can be as described in reference to FIG. 5.

In some embodiments, a characteristic of the beam of radiation output by a multimode waveguide device (e.g., beam of radiation 518 (FIG. 5)) can be further adjusted as described in reference to FIGS. 10-13. The characteristic can be, for example, a beam diameter. Beam diameter adjustability (or spot size selector) can be useful for, e.g., allowing users of lithographic tools to implement their own, customized metrology targets rather than being constrained to factory-specified targets for the metrology system being used. For example, in the interest of miniaturization, smaller targets can be preferred in order to place more densely packed IC structures on a wafer. A consequence can be that a metrology system designed for larger targets may suffer inaccuracies when used on smaller targets since the beam diameter of the illuminator may be too large. For example, the radiation may fall on surrounding IC structures and introduce errors in the measurement. In another example, larger spots might not efficiently use all of the radiation when delivered to a small target (radiation falling outside of the target is unused radiation). Losslessly reducing the beam diameter conserves the energy in the beam and makes sure that all or most of it is sent to the target, preventing the 'waste' of the radiation that would otherwise fall outside of the target.

Figure 10:
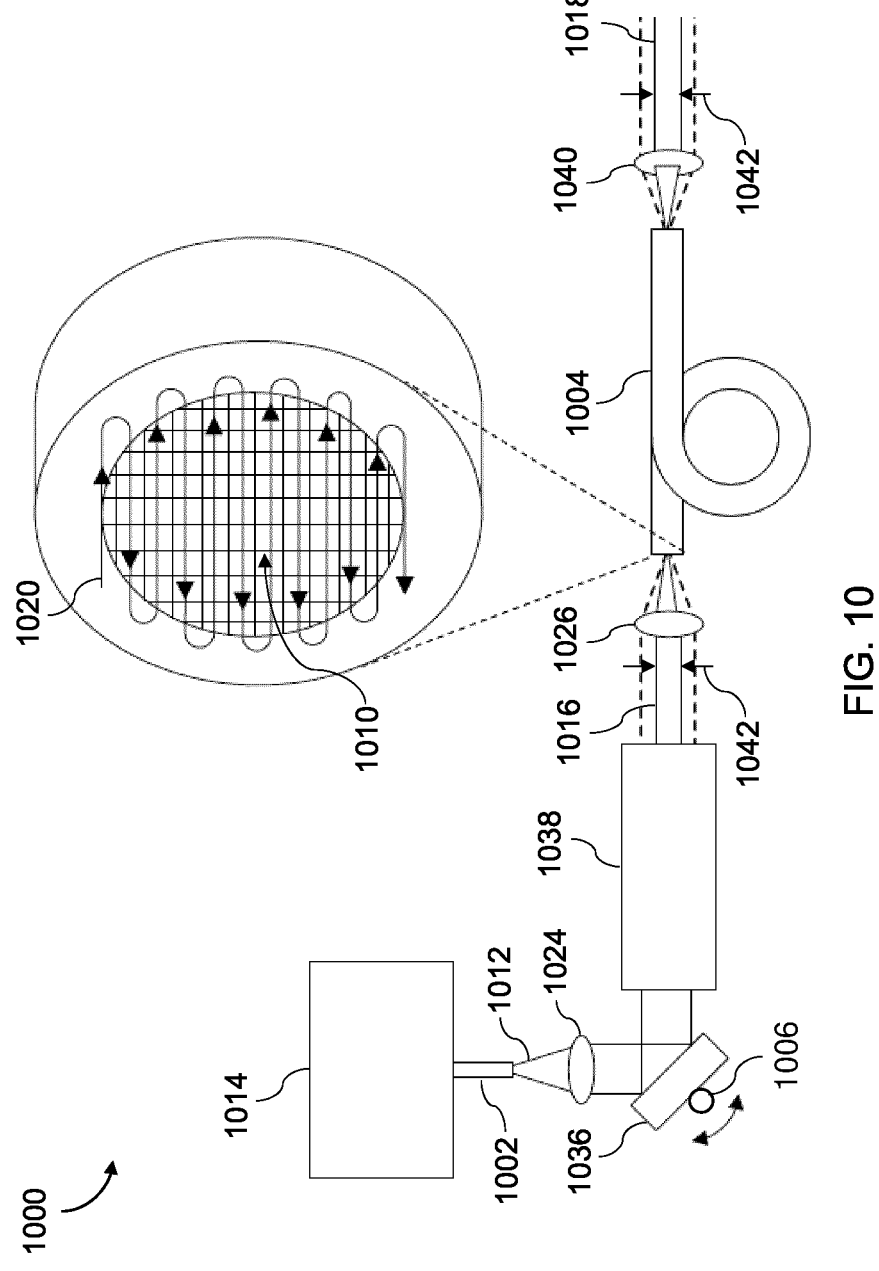

FIG. 10 shows a coherence adjuster 1000, according to some embodiments. In some embodiments, coherence adjuster 1000 can also represent a system that is similar to coherence adjuster 500 (FIG. 5), but with some parts rearranged or replaced. Unless otherwise noted, elements of FIG. 10 that have similar reference numbers as elements of FIGS. 5-9 (e.g., reference numbers sharing the two rightmost numeric digits) can have similar structures and functions. For simplicity, the similar structures, as well as structures that have been omitted from view (for drawing clarity), will not be reintroduced in detail.

In some embodiments, coherence adjuster 1000 can comprise a waveguide device 1002, a multimode waveguide device 1004, an actuator 1006, a reflective element 1036, and an adjustable beam expander 1038. Coherence adjuster 1000 can comprise additional optics, such as optical elements 1024, 1026, and/or 1040 (e.g., a lens or system of lenses).

In some embodiments, waveguide device 1002 has an input and an output. Multimode waveguide device 1004 has an input (e.g., input facet 1010) and an output. Actuator 1006 can comprise one or more galvanometer elements. Actuator 1006 can be coupled to reflective element 1036 as a galvo mirror arrangement. It should be appreciated that, in some embodiments, waveguide device 1002 can be optional. For example, coherent radiation 1012 can be incident on reflective element 1036 without having to interact with waveguide device 1002.

In some embodiments, the input of waveguide device 1002 can receive a beam of coherent radiation 1012. Waveguide device 1002 can guide coherent radiation 1012 such that coherent radiation 1012 is directed to reflective element 1036. Coherent radiation exits at the output of waveguide device 1002. Coherent radiation 1012 can be at least spatially coherent radiation (e.g., can also include temporally coherent radiation) and can be generated by a radiation source 1014 (e.g., a laser). Optical element 1024, disposed in the path of coherent radiation 1012, can collimate coherent radiation 1012 (e.g., make its propagation substantially parallel).

In some embodiments, reflective element 1036 directs radiation 1016 toward input facet 1010. Radiation 1016 is coherent radiation 1012 that has been adjusted before being received at input facet 1010. Multimode waveguide device 1004 can output a beam of radiation 1018 (also "coherence adjusted beam of radiation").

In some embodiments, adjustable beam expander 1038 can be disposed in the path of radiation 1016. Adjustable beam expander 1038 can allow size adjustments of a beam diameter 1042 of radiation 1016 in a lossless manner. The dashed lines around the beams of radiation denote a different beam diameter. This can be accomplished, for example, using transparent optical elements (a system of lenses), as opposed to a lossy method like using an aperture stop that clips a beam of radiation. Lossless methods are desirable for maximizing brightness and efficiency of coherence adjusters. To a metrology system used in conjunction with lithographic processes, lost photons results in potentially longer exposure times (longer measurements), which in turn reduces throughput in wafer production. The adjustments to beam diameter 1042 are performed in a manner that also controls the focus angles (or beam spread, or etendue) of radiation 1016 at input facet 1010. In turn, since multimode waveguide device 1004 can preserve the etendue of the received radiation, the etendue of beam of radiation 1018 can also be adjusted by adjustable beam expander 1038. In other words, a beam diameter 1042 of beam of radiation 1018 can be adjusted by adjustable beam expander 1038. Optical element 1040 can be disposed in the path of beam of radiation 1018 to collimate beam of radiation 1018 so as to make beam diameter 1042 constant or nearly constant. Here, an impingement characteristic of radiation 1016 at input facet 1010 comprises a distribution of incidence angles. In this manner, coherence adjuster 1000 can adjust beam diameter 1042 based on a change of the distribution of incidence angles.

In some embodiments, beam of radiation 1018 is radiation 1016 that has been guided by multimode waveguide device 1004. Beam of radiation 1018 can comprise an interference pattern (e.g., speckles) as a result of constructive and destructive interference. The form of the interference pattern depends on an impingement characteristic of radiation 1016 at input facet 1010. The impingement characteristic can further comprise a position of a focus spot of radiation 1016 at input facet 1010 (which influences which modes are used for propagation).

Consequently, in some embodiments, an adjustment of the interference pattern can be achieved by changing the impingement characteristic (or changing the etendue of radiation 1016). Or in other words, the change of the impingement characteristic comprises a change of etendue of the received radiation at input facet 1010 of multimode waveguide device 1004. The change of the impingement characteristic can comprise a change of a position of the focus spot of radiation 1016 at input facet 1010 of multimode waveguide device 1004. The change of position of the focus spot is illustrated as a raster scan pattern 1020 (or can be other patterns as described herein). The scanning can be achieved by actuating a portion of the coherence adjuster (e.g., actuating reflective element 1036). It should be appreciated that the distribution of angles of incidence is still controllable when moving the focus spot at input facet 1010, and therefore the beam diameter control is simultaneously achievable with coherence scrambling effects. Other examples of using a galvo mirror arrangement with a multimode fiber can be found in NL Published Application 2024394, filed on Dec. 5, 2019, which is incorporated by reference herein in its entirety.

It should also be appreciated that, in some embodiments, the galvo mirror arrangement can be replaced with any of the other actuation solutions described in reference to FIGS. 5-9 and still achieve the interference pattern adjustments as well as the beam diameter adjustments. In this context, it can be said that actuator 1006 can actuate a portion of coherence adjuster 1000 so as to change the impingement characteristic, wherein the actuated portion is waveguide device 1002 (whereas in the galvo mirror arrangement, the actuated portion would be reflective element 1036).

In some embodiments, actuator 1006 can be considered a specific example of a more general "adjusting device." For example, instead of an actuator, the adjusting device can comprise electronics (e.g., non-mechanical). In some embodiments, reflective element 1036 can be replaced with an optical adjuster that does not rely on mechanical parts (e.g., a liquid crystal device). In this example arrangement, the adjusting device and the liquid crystal device can be arranged as a liquid crystal spatial light modulator. The liquid crystal spatial light modulator can be of a reflective or transmissive type. And instead of actuating a portion of coherence adjuster 1000, the adjusting device can adjust a portion of coherence adjuster 1000 (e.g., the liquid crystal device), to achieve the change of the impingement characteristic.

In some embodiments, the adjusting device can be a plurality of actuators and reflective element 1036 can be a plurality of reflectors. In this example, the actuators and reflectors can be arranged as a digital micromirror device. And the adjusting device can adjust a portion of coherence adjuster 1000 (e.g., the reflectors), to achieve the change of the impingement characteristic.

In some embodiments, parts of coherence adjuster 1000 can be modular. For example, the output of waveguide device 1002 can be fashioned as a fiber connector. Input facet 1010 can also be part of a fiber connector. The arrangement involving the galvo mirror arrangement and adjustable beam expander can be housed in a module that waveguide device 1002 and multimode waveguide device 1004 connect to. It is desirable that the general dimensions of coherence adjuster 1000 be fairly compact. For example, considering the typical sizes of off-the-shelf galvo mirrors and beam expanders, coherence adjuster 1000 can be envisaged as fitting approximately on the palm of a user's hand (e.g., approximately tens of centimeters in breadth).

Figure 11:
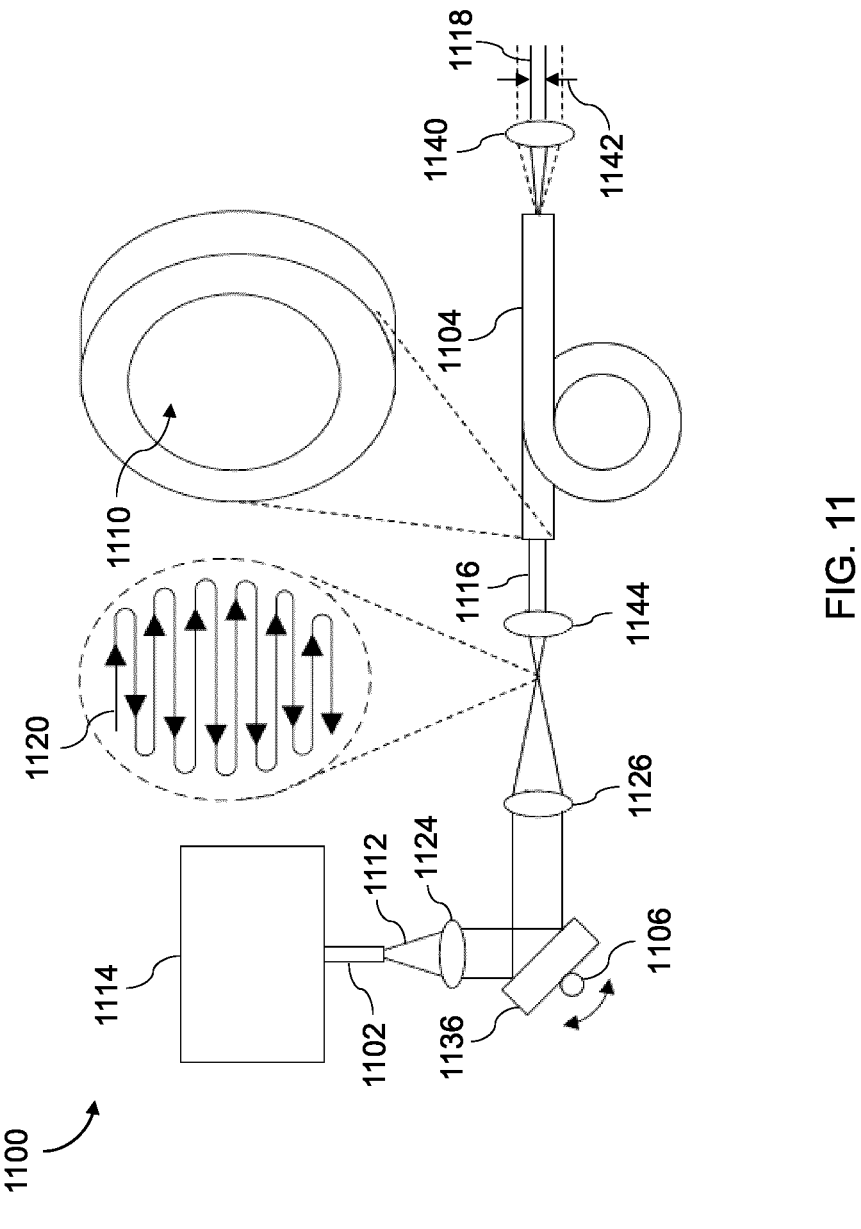

FIG. 11 shows a coherence adjuster 1100, according to some embodiments. In some embodiments, coherence adjuster 1100 can also represent a system that is similar to coherence adjuster 500 (FIG. 5), but with some parts rearranged or replaced. Unless otherwise noted, elements of FIG. 11 that have similar reference numbers as elements of FIGS. 5-10 (e.g., reference numbers sharing the two rightmost numeric digits) can have similar structures and functions. For simplicity, the similar structures, as well as structures that have been omitted from view (for drawing clarity), will not be reintroduced in detail.

In some embodiments, coherence adjuster 1100 can comprise a waveguide device 1102, a multimode waveguide device 1104, an actuator 1106, a reflective element 1136, and optical elements 1124, 1126, 1140 and/or 1144 (e.g., a lens or system of lenses).

In some embodiments, waveguide device 1102 has an input and an output. Multimode waveguide device 1104 has an input (e.g., input facet 1110) and an output. Actuator 1106 can comprise one or more galvanometer elements. Actuator 1106 can be coupled to reflective element 1136 as a galvo mirror arrangement. A difference between FIGS. 10 and 11 is that adjustments of beam diameter 1142 of a beam of radiation 1118 is handled by the galvo mirror arrangement rather than a beam expander. Beam of radiation 1118 exits the output of multimode waveguide device 1104.

In some embodiments, coherent radiation 1112 generated by radiation source 1114 is directed to reflective element 1136. Optical elements 1124, 1126 and 1144 are arranged in the path of coherent radiation 1112 and 1116. Radiation 1116 is coherent radiation 1112 that has been adjusted before being received at input facet 1110. Optical element 1124 can collimate coherent radiation 1112. The arrangement of optical elements 1126 and 1144 have the effect of collimating radiation 1116 at input facet 1110 rather than focusing the beam at input facet 1110. The focus of radiation 1116 occurs at a far field of input facet 1110. When scanning is performed using the galvo mirror arrangement, a scan pattern 1120 is used at the focus of radiation 1116 (e.g., at a plane that is a Fourier conjugate of the plane at input facet 1110). The result is that radiation 1116 can form a larger beam spot at input facet 1110. The beam spot of radiation 1116 can fill or nearly fill input facet 1110. However, even when the beam spot at input facet 1110 is stationary during the scanning, by Fourier conjugate considerations, a distribution of incidence angles of radiation 1116 at input facet 1110 can change in response to the scanning. In other words, a change of an impingement characteristic of radiation 1116 can comprise a change of a focus spot at a conjugate plane of input facet 1110. In this manner, an interference pattern of beam of radiation 1118 can be adjusted based on the change of the impingement characteristic.

In some embodiments, size and modularity aspects can be similar to those described in reference to FIG. 10.

Similar to embodiments referencing FIG. 10, in some embodiments, coherence adjuster 1100 can also adjust beam diameter 1142 by changing the distribution of incidence angles of radiation 1116 at input facet 1110 (e.g., by scanning focus spot at the conjugate plane of input facet 1110). The dashed lines around beam of radiation 1118 denotes a different beam diameter. This method of scanning the conjugate plane of input facet 1110 can be implemented in embodiments referencing, e.g., FIGS. 5-13, with appropriate arrangement of the optics.

Furthermore, in some embodiments, the arrangements regarding liquid crystal spatial light modulators and digital micromirror devices can be implemented as described in reference to FIG. 10.

Figure 12:
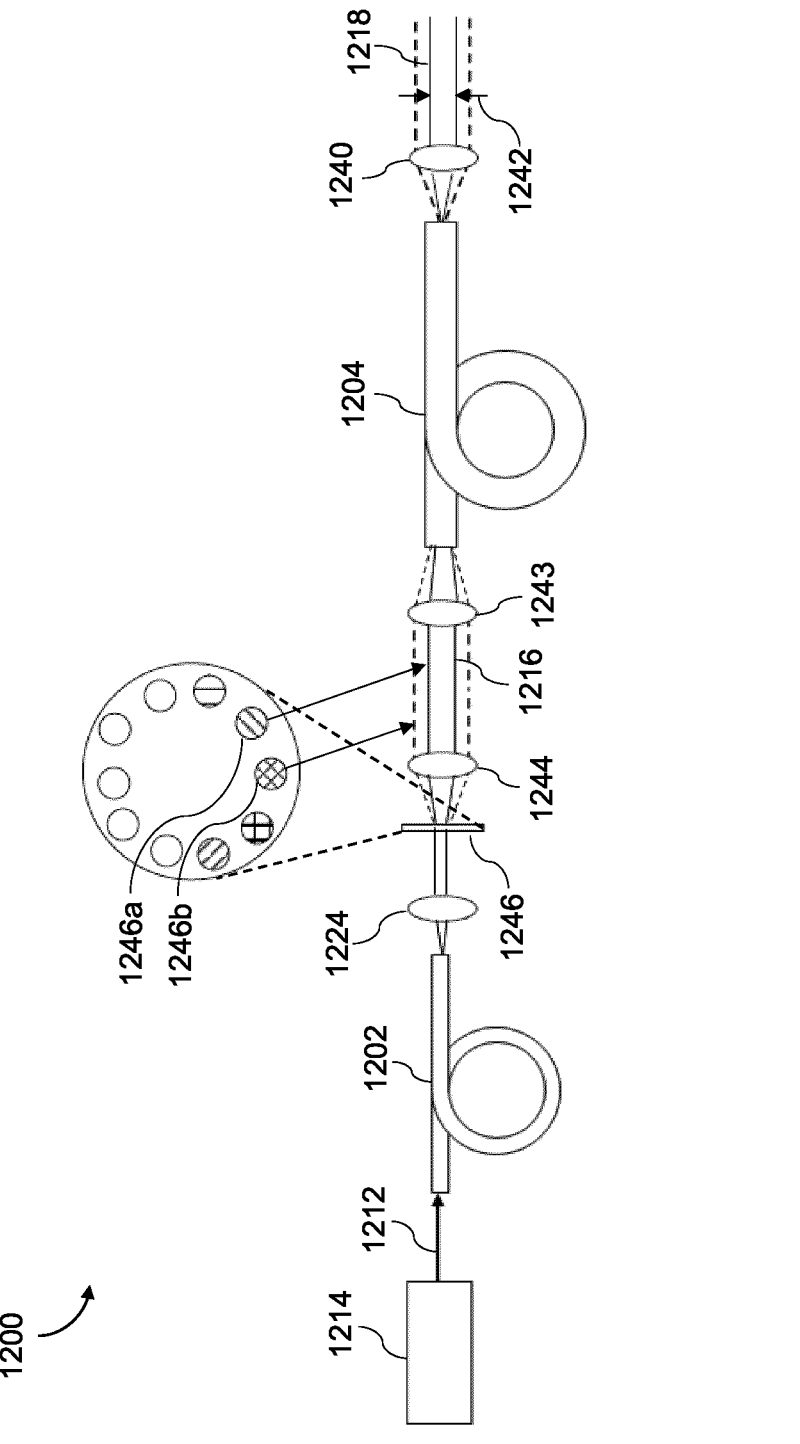

FIG. 12 shows a coherence adjuster 1200 based on a diffuser implementation, according to some embodiments. In some embodiments, coherence adjuster 1200 can also represent a system that is similar to coherence adjuster 500 (FIG. 5), but with some parts rearranged or replaced. Unless otherwise noted, elements of FIG. 12 that have similar reference numbers as elements of FIGS. 5-11 (e.g., reference numbers sharing the two right-most numeric digits) can have similar structures and functions. For simplicity, the similar structures, as well as structures that have been omitted from view (for drawing clarity), will not be reintroduced in detail.

In some embodiments, coherence adjuster 1200 can comprise a waveguide device 1202, a multimode waveguide device 1204, a diffuser device 1246, and optical elements 1224, 1240, 1243 and/or 1244 (e.g., a lens or system of lenses). Diffuser device 1246 can comprise two or more selectable diffuser elements, e.g., diffuser elements 1246*a* and 1246*b* are labeled as non-limiting examples. Each diffuser element can comprise a diffuse materials that provide different scattering patterns (e.g., different spreads of incidence angles or different etendues). Though the diffuser elements are illustrated as separate circles on a wheel, it should be appreciated that such an arrangement of diffuser elements is not limiting. For example, other arrangements are possible, such as circle segments (e.g., pie-chart style), concentric rings, a combination of circle segments and concentric rings, or the like.

In some embodiments, waveguide device 1202 has an input and an output. Multimode waveguide device 1204 has an input and an output. A difference between FIG. 12 and previous figures is that adjustments of beam diameter 1242, and interference pattern, of a beam of radiation 1218 is handled by diffuser device 1246. Beam of radiation 1218 exits at the output of multimode waveguide device 1204.

In some embodiments, diffuser device 1246 can be disposed at a conjugate plane of the input of multimode waveguide device 1204. Diffuser device 1246 can be disposed downstream of waveguide device 1202 and upstream of multimode waveguide device 1204. Optical elements 1243 and 1243 are used to collimate radiation 1216 onto the input of multimode waveguide device 1204 (as opposed to narrowly focusing to a small spot). Therefore, it should be appreciated that coherence adjuster 1200 implements changing a distribution of incidence angles at the input of multimode waveguide device 1204 similar to embodiments referencing FIG. 11.

In some embodiments, diffuser element 1246a can comprise diffuse material that provides a particular spread of radiation 1216, which determines the spread of incidence angles at the input of multimode waveguide device 1204. Diffuser element 1246b can comprise diffuse material that provides a spread of radiation 1216 that is different from the one provided by diffuser element 1246a. Any suitable diffuse materials can be used as long as the spread of radiation 1216 is defined and different for each diffuser element. One example of such a diffuser element is an engineered diffuser (non-limiting example). Furthermore, it is desirable that the diffuse material spread the radiation in a lossless manner-again, engineered diffusers are an example of diffusers capable of lossless or nearly lossless diffusion. As discussed previously with respect to other figures, the distribution of incidence angles can determine the size of beam diameter 1242. Therefore, by selecting adjusting the appropriate diffuser element 1246a or 1246b to be in the path of radiation 1246, the size of beam diameter 1242 can be selected (a different beam diameter is shown by dashed lines). Furthermore, while diffuser device 1246 can provide coherence scrambling on its own, when used in conjunction with multimode waveguide device 1204, coherence scrambling effects can be further enhanced.

In some embodiments, in the absence of diffuser device 1246, rays of radiation 1216 can have a particular distribution of impingement positions at the input of multimode waveguide device 1204. Therefore, a particular set of modes of propagation of multimode waveguide device 1204 are coupled into. Furthermore, a particular distribution of incidence angles impinge on at the input of multimode waveguide device 1204. Consequently, rays of beam of radiation 1218 emerge from a particular locations of the output of multimode waveguide 1208 and with a particular distribution of exit angles. The exiting rays superimpose and interfere to form a speckle pattern of beam of radiation 1218. In other words, an interference pattern of beam of radiation 1218 is based on the particular distribution of impingement positions and incidence angles at the input of multimode waveguide device 1204.

However, in some embodiments, when radiation 1216 is allowed to interact with diffuser device 1246, the rays of radiation 1216 can become scattered such that the distribution of impingement positions and angles of incidence is now vastly different from the scenario where no diffuser device is used. Consequently, the modes of propagation of multimode waveguide device 1204 are coupled into differently. In turn, the rays of beam of radiation 1218 emerge from altered locations of the output of multimode waveguide device 1204 and at altered exit angles. The result is that an interference pattern of beam of radiation 1218 can be vastly different from when no diffuser device is used.

In some embodiments, in the absence of multimode waveguide device 1204, a translation/rotation of diffuser device 1246 can result in a mere translation/rotation of the interference pattern of beam of radiation 1218 (or other actuating motions can also be used, e.g., vibrating, moved back and forth, or the like). Depending on the diffuse material, a slow translation/rotation may not produce an adequate number of pattern variations within short integration times (e.g., short enough for a metrology system to perform fast measurements). Therefore, it may be desired to actuate diffuser device 1246 at faster speeds at the risk of undesirable vibrations and catastrophic failure.

However, in some embodiments that include both multimode waveguide device 1204 and diffuser device 1246, even a small translation/rotation of diffuser device 1246 can cause a distinguishable change to the impingement of radiation 1216 at the input of multimode waveguide device 1204. That small difference can cause a change in how radiation 1216 couples into modes of propagation of multimode waveguide device 1204. The configuration of the emerging rays of beam of radiation 1218 from multimode waveguide device 1204 can be vastly altered in response to the small movement of diffuser device 1246. In this manner, diffuser device 1246 can be used for fast coherence scrambling without resorting to actuate diffuser device 1246 at unsafe speeds.

In some embodiments, coherence adjuster 1200 works well using small movements of diffuser device 1246, the size of diffuser device 1246 can be substantially smaller than traditional diffusers plates. Therefore, the size and modularity of coherence adjuster 1200 can be similar to what has been described above regarding galvo mirror arrangements (e.g., palm sized and coupled via detachable fiber connectors).

Figure 13:
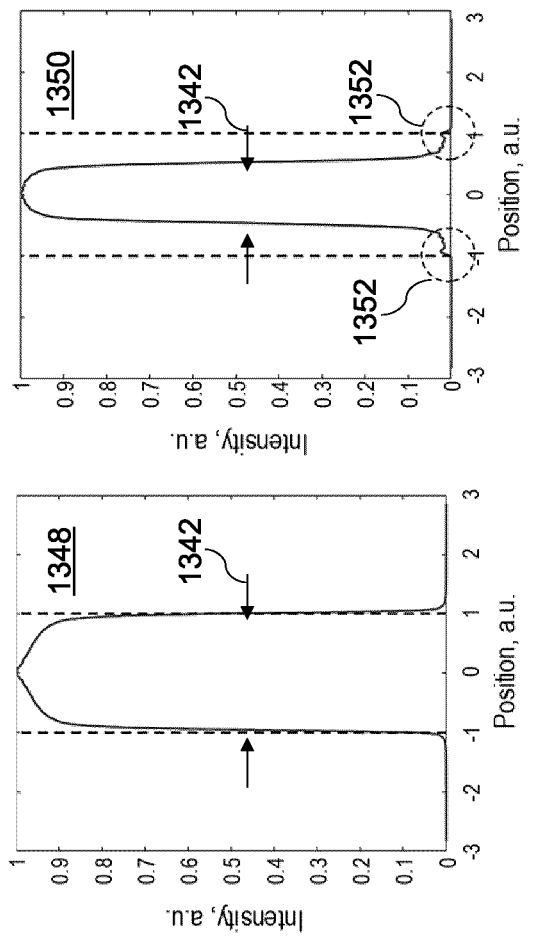
FIG. 13 shows graphs for describing spot size of a beam of radiation, according to some embodiments.
Figure 13:
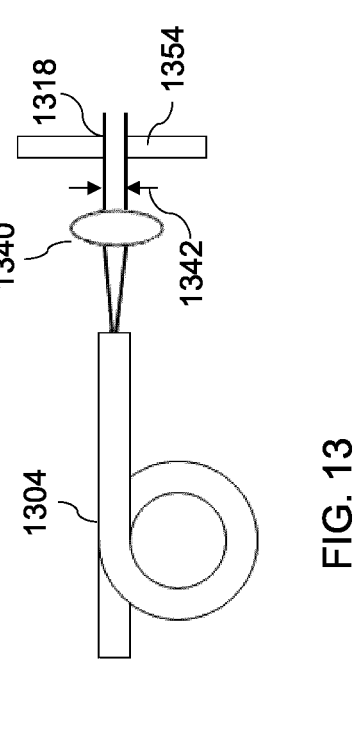

FIG. 13 shows graphs for describing spot size of a beam of radiation 1318, according to some embodiments. In some embodiments, some of the structures shown in FIG. 13 can be similar to those of coherence adjuster 500 (FIG. 5), but with some parts rearranged or replaced. Unless otherwise noted, elements of FIG. 13 that have similar reference numbers as elements of FIGS. 5-12 (e.g., reference numbers sharing the two right-most numeric digits) can have similar structures and functions. For simplicity, the similar structures, as well as structures that have been omitted from view (for drawing clarity), will not be reintroduced in detail.

In some embodiments, graphs 1348 and 1350 show intensity vs. beam diameter plot of beam of radiation 1318 (simulated). The horizontal axes represent a radial position with respect to an optical axis of beam of radiation 1318, in arbitrary units (a.u.). The vertical axis represents radiation intensity in arbitrary units (a.u.). In graph 1348, a beam diameter 1342 of beam of radiation 1318 is approximately 2 distance units. However, when using one of the methods described herein to shrink beam diameter 1342 to the values in graph 1350, "intensity tails" 1352 can form. The formation of intensity tails is a known issue in applications that require small beam diameters. In the non-limiting example illustrated in graph 1350, the intended beam diameter 1342 can be approximately 1 distance unit while the tails 1352 extend further out to a diameter of 2 distance units. Intensity tails 1352 cause problems by illuminating features outside of the intended beam diameter (e.g., when coherence adjuster is used in a metrology system for a lithographic process, while the main central beam is used to illuminate a target, intensity tails can unintendedly illuminate other structures). The illumination of extra features can introduce errors in metrology applications.

Therefore, in some embodiments, an aperture device 1354 can be used to block intensity tails 1352. While the use of apertures was earlier described as less than ideal for their potential to reduce intensity (higher intensity is desirable), in the case of intensity tails, the use of aperture device 1354 can provide an acceptable trade-off between minimal intensity loss and prevention of metrology errors. After all, intensity tails 1352 make up only a small, negligible fraction of the total energy in beam of radiation 1318. The radiation energy lost by blocking intensity tails 1352 can be marginal.

In some embodiments, radiation with a spectrum of wavelengths (e.g., non-zero bandwidth) can be used with a long multimode waveguide device 1304 (e.g., a long multimode fiber). Since propagation constants of waveguide modes are wavelength dependent and refractive index of multimode waveguide can be wavelength dependent, the radiation propagating within waveguide device 1304 can be delayed differently for different wavelengths. For a long enough fiber with suitable core material, the relative modes differ as a function of wavelength. The result is that an interference pattern of beam of radiation 1318 can be further adjusted using this mechanism. This can add another layer of faster scrambling to, e.g., the diffuser device implementation of FIG. 12 (but embodiments referencing any of the other figures can also use the long fiber and multi-wavelength features). It should be appreciated that, for long enough fibers and/or large enough bandwidths that provide adequate a desired amount of scrambling, certain actuation or adjustment features of a coherence adjuster can be omitted. As a non-limiting example, in the diffuser example of FIG. 12, a 2-meter long multimode fiber can provide adequate scrambling such that the diffuser need not be actuated.

In some embodiments, multimode waveguide device 1304 can have a length of greater than approximately 2 meters, greater than approximately 5 meters, greater than approximately 10 meters, or greater than approximately 100 meters. In some embodiments, the length of multimode waveguide device 1304 can be determined based on the wavelength (and also based on a given amount of coherence scrambling). For example, multimode waveguide device 1304 can have a length of greater than approximately $10^6$ times an input wavelength, greater than approximately $10^7$ times an input wavelength, or greater than approximately $10^8$ times an input wavelength.

Furthermore, regarding embodiments referencing FIGS. 5-13, the impingement characteristic of radiation at an input of a multimode waveguide can be changed deterministically, randomly, pseudo-randomly, or using a combination of deterministic and random changes. The goal is to provide a changing speckle pattern that disappears (e.g., appears homogeneous) in a short integration time.

In some embodiments, structures and functions of coherence adjusters of FIGS. 5-13 can be implemented in metrology systems (e.g., metrology system 400 (FIGS. 4A and 4B)). Coherence adjusters can be implemented, for example, as part of illumination system 412 (FIGS. 4A and 4B).

Exemplary Systems and Methods for Controlling Beam Homogeneity

For incoherent (or partially coherent) sensors, the efficiency of coupling light into the sensor can be a trade-off between the amount of light available on a measurement target and the beam quality of the light at, for example, the measurement target. In some examples, the beam quality can include, but is not limited to, the homogeneity of the light. In some examples, for incoherent light, the efficiency of light coupling can be related to the etendue associated to a light source, the etendue associated to the sensor, or both. In one example, the etendue associated with an optical system can be proportional to the product of the area of the spread of the radiation intensity at the optical system (e.g., $D^2$, where D is a diameter associated with the area associated with the optical system) and the square of the angle (e.g., a solid angle associated with the optical system—$NA^2$) in an small-angle limit. In other words, the etendue of the light beam can be proportional to $D^2 NA^2$ in the small-angle limit. In a non-limiting example, $D^2$ can be the area of a cross-section of a fiber and NA can be the numerical aperture associated with the fiber.

According to some examples, a multimode waveguide device (a multimode fiber as a non-limiting example) can be used to transport the light from the light source to the incoherent (or partially coherent) sensor. In some examples, the multimode waveguide device can be configured to provide the light with desirable properties to the sensor. The desirable properties can include, but are not limited to, one or more of good mode mixing, a homogeneous illumination in the near field (e.g., the output of the multimode waveguide device), and a homogeneous illumination in the far field. In some examples, the desirable properties of the light provided to the sensor can be achieved by using a multimode waveguide device with a larger diameter at the input of the multimode waveguide device and/or higher NA. However, the embodiments of this disclosure are not limited to these examples.

For incoherent (or partially coherent) sensors, the etendue associated with the light source is to be matched with the etendue associated with the sensor. Using a multimode waveguide device with a small diameter and/or low NA can result in the inhomogeneity of the light outputted from the sensor. On the other hand, using a multimode waveguide device with a large diameter and/or high NA can result in the mismatch between the etendue associated with the light source and the etendue associated with the sensor.

According to some examples, when a radiation source generates a coherent radiation (e.g., spatially coherent and/or temporally coherent), the coherent radiation can have a very small etendue (e.g., the etendue associated with the radiation source is very small). Additionally, or alternatively, the coherent radiation can have a very high brightness. For the incoherent (or partially coherent) sensors, the coherent radiation from the light source can be scrambled into incoherent or quasi-incoherent light. The scrambling can be done using, for example, one or more coherence adjusters 500, 600, 700, 800, 900, 1000, 1100, and 1200 discussed above. In some examples, using the coherence adjuster can result in an increase in the etendue of the light that the sensor receives. If the etendue of the light of the coherence adjuster is larger than the etendue associated with the sensor, a net light loss can occur, which can negate the advantages of using the radiation source that generated the coherent radiation.

Some embodiments of this disclosure are directed to system, method and/or computer program product aspects, and/or combinations and sub-combinations thereof to mitigate the homogeneity effects in both near field and far field by pre-adjusting and/or dynamically adjusting the light distribution at the output of a coherence adjuster and/or an input of a waveguide device coupled to a detector. In some embodiments (e.g., for partially coherent illumination), where the light distribution can be non-uniform in both area and NA, the light distribution in one or both of area and NA can be controlled and can be made to conform to predetermined distributions.

Figure 14:
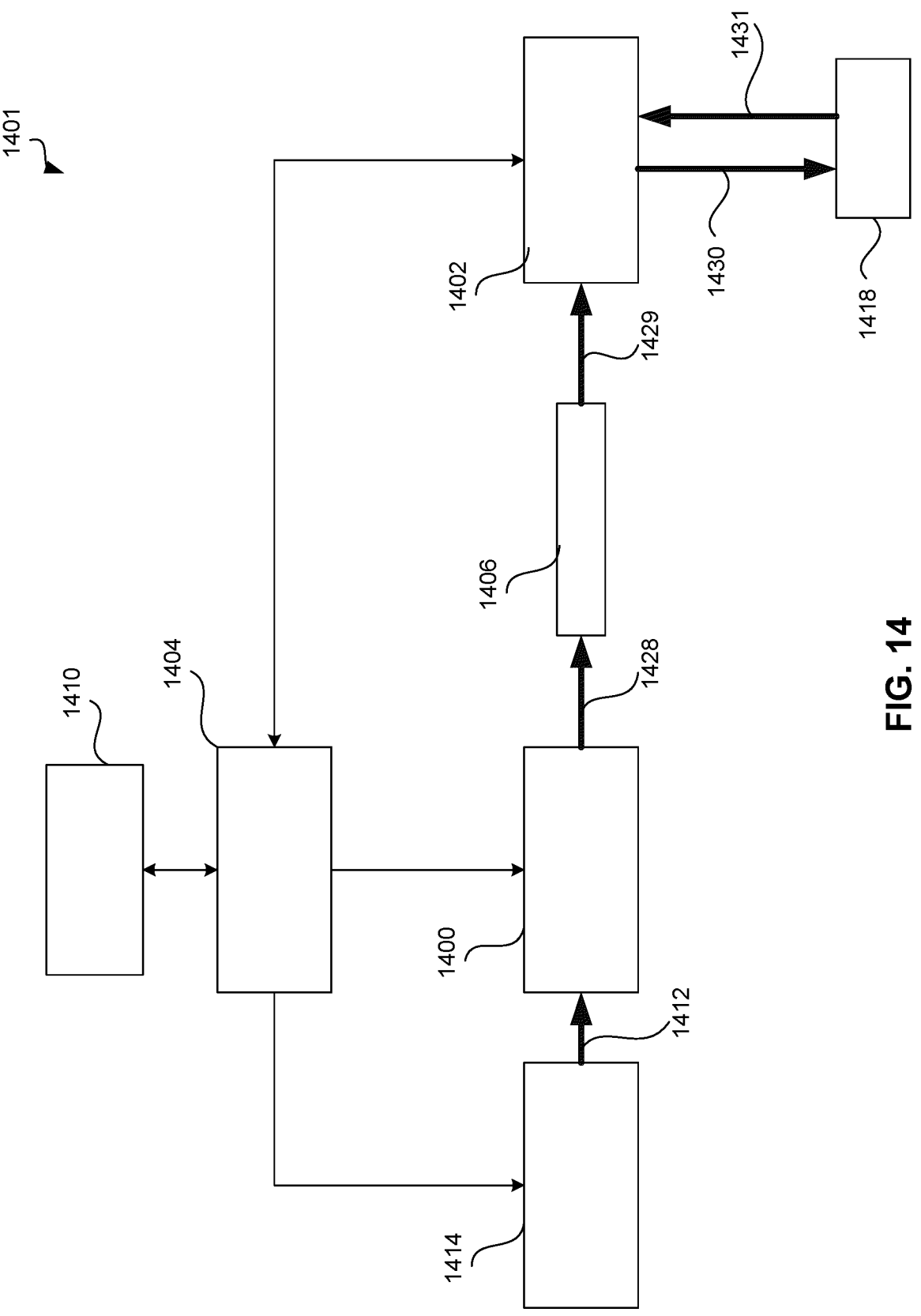
FIG. 14 shows a schematic of a system for adjusting light distribution, according to some embodiments.

FIG. 14 shows a schematic of a system 1401 for adjusting light distribution, according to some embodiments. System 1401 can be a metrology system. System 1401 can be implemented as part of metrology system 400 of FIG. 4A and/or FIG. 4B. Additionally, or alternatively, system 1401 can be implemented in addition to metrology system 400 of FIG. 4A and/or FIG. 4B. According to some embodiments, system 1401 can include radiation source 1414, coherence adjuster 1400, optional waveguide device 1406, detector 1402, processor 1404, storage device 1410, and target 1418.

In some embodiments, radiation source 1414 can include a radiation source configured to generate coherent radiation 1412. As a non-limiting example, radiation source 1414 can include a white light laser. Coherent radiation 1412 can be at least spatially coherent radiation (e.g., can also include temporally coherent radiation) generated by radiation source 1414. According to some embodiments, radiation source 1414 can include or be part of radiation source 412 of FIG. 4A or 4B, radiation source 514 of FIG. 5, radiation source 1014 of FIG. 10, radiation source 1114 of FIG. 11, and/or radiation source 1214 of FIG. 12.

According some embodiments, radiation source 1414 can be coupled to coherence adjuster 1400. Alternatively, radiation source 1414 can be part of coherence adjuster 1400. In some embodiments, coherence adjuster 1400 can include one or more coherence adjusters 500, 600, 700, 800, 900, 1000, 1100, and 1200 discussed above. Coherence adjuster 1400 is configured to receive coherent radiation 1412 from radiation source 1414 and generate and output a beam of radiation 1428 (also "coherence adjusted beam of radiation"). Beam of radiation 1428 can include an interference pattern (e.g., speckles) as a result of constructive and destructive interference. The form of the interference pattern can depends on an impingement characteristic of radiation within coherence adjuster 1400 as discussed above with respect to, for example, FIGS. 5-13.

Although radiation source 1414 and coherence adjuster 1400 are illustrated as separate systems/devices, the embodiments of this disclosure are not limited to these examples. Radiation source 1414 and coherence adjuster 1400 can be part of one system/device. According to some embodiments, coherence adjuster 1400 can include a multimode waveguide device as illustrated in FIGS. 5-13. In some embodiments, the multimode waveguide device can include a radially symmetric multimode fiber that can generate various radially symmetric field and angular illumination distributions including top-hat and annular patterns with sharp or smooth edge transitions. The multimode waveguide device can include other multimode waveguide devices of other symmetries that can generate a variety of other illumination distributions including, but not limited to, square patterns. In some examples, the distribution and edge control can minimize error associated to mark edges.

According to some embodiments, beam of radiation 1428 can be input to detector 1402. For example, coherence adjuster 1400 and detector 1402 are coupled such that beam of radiation 1428 output by coherence adjuster 1400 is input to detector 1402 to be used by detector 1402 for measurement. In some embodiments, coherence adjuster 1400 can be coupled to detector 1402 using one or more optical elements (e.g., lenses, systems of lenses), one or more beam splitters, and the like. Additionally, or alternatively, coherence adjuster 1400 can be coupled to detector 1402 using one or more additional waveguide devices. As one example, optional waveguide 1406 is illustrated in FIG. 14 that couples coherence adjuster 1400 to detector 1402. In a non-limiting example, optional waveguide 1406 can include a fiber. In another example, optional waveguide device 1406 can include a multimode waveguide device. In the example that optional waveguide device 1406 is used, waveguide device 1406 can include an input configured to receive beam of radiation 1418. Optional waveguide device 1406 can include an output configured to output beam of radiation 1429 to detector 1402. Beam of radiation 1429 is also a coherence adjusted beam of radiation. In some embodiments, target 1418 can be the same as or similar to target 418 of FIGS. 4A and 4B. Target 1418 can include other suitable targets.

In some embodiments, coherence adjuster 1400 (with or without waveguide device 1406) can direct beam of radiation 1428 (or 1429) to target 1418 without first going through detector 1402. For example, beam of radiation 1430, which can irradiate target 1418, can be (and/or include) beam of radiation 1428 (or 1429) (or part of beam of radiation 1428 (or 1429)).

In some embodiments, coherent radiation 1412 is from radiation source 1414 is delivered to coherence adjuster 1400 using a fiber (e.g., a single-mode fiber).

According to some embodiments, detector 1402 can be configured to measure one or more parameters associated with beam of radiation 1428 and/or one or more parameters associated with beam of radiation 1429. In some embodiments, the one or more parameters associated with beam of radiation 1428 (and/or beam of radiation 1429) can include a field distribution of beam of radiation 1428 (and/or beam of radiation 1429). The field distribution as used herein includes intensity distribution in a field. For example, detector 1402 can be configured to measure a near field distribution of beam of radiation 1428 (and/or beam of radiation 1429). In some embodiments, the near field distribution can include an intensity distribution (e.g., a spatial distribution—the image of the intensity) of the beam of radiation (e.g., beam of radiation 1428 and/or beam of radiation 1429) measured/determined at a field plane. In other words, the near field distribution includes measuring the intensity distribution of the light at the field plane. Additionally, or alternatively, detector 1402 can measure a far field distribution of beam of radiation 1428 (and/or beam of radiation 1429). In some embodiments, the far field distribution can include an intensity distribution (e.g., a spatial distribution—the image of the intensity) of the beam of radiation (e.g., beam of radiation 1428 and/or beam of radiation 1429) measured/determined at a pupil plane. In other words, the far field distribution includes measuring the intensity distribution of the light at the pupil plane. Although field distribution is provided as one example for one or more parameters associated with beam of radiation 1428 (and/or beam of radiation 1429), the embodiments of this disclosure are not limited to these examples and detector 1402 can be configured to measure other parameters of beam of radiation 1428 (and/or beam of radiation 1429).

According to some embodiments, detector 1402 can include one or more optical detectors (e.g., one or more field cameras) to measure the near field distribution (intensity distribution at the near field) of beam of radiation 1428 (and/or beam of radiation 1429). In some embodiments, the optical detector can be a detector positioned at a field plane. In some embodiments, the field plane can include an optical plane where an image of a target is focused. Although the optical detector is not explicitly illustrated in FIG. 14, the optical detector can include, for example, beam analyzer 430' of FIG. 4B. In some embodiments, the optical detector (e.g., beam analyzer 430' of FIG. 4B) can be configured to receive beam of radiation 1431 (or part of beam of radiation 1431) diffracted and/or scattered from target 1418 and determine an optical state of beam of radiation 1431. The optical state can be a measure of beam wavelength, polarization, beam profile, or field distribution. According to some embodiments, by measuring the field distribution of beam of radiation 1431 (or part of beam of radiation 1431), the optical detector can be configured to determine the near field distribution (intensity distribution at the near field) of beam of radiation 1428 (and/or beam of radiation 1429). According to some embodiments, target 1418 includes a suitably chosen target used by the field camera to measure the near field distribution of beam of radiation 1428 (and/or beam of radiation 1429). According to some aspects, the suitably chosen target can be a target of interest, which is being used in a particular metrology application (e.g., one of the alignment or overlay targets). Additionally, or alternatively, the suitably chosen target can include a calibration target that, for example, provides a detectable signal on a field camera, has a spatial extent for at least the size of the beam area to be qualified, and/or is homogeneous in (reflection or diffraction) properties across a measurement area.

Although one example of the optical detector is provided, the embodiments of this disclosure are not limited to this example and detector 1402 can include one or more other detectors configured to measure the near field distribution (intensity distribution at the near field) of beam of radiation 1428 (and/or beam of radiation 1429). For example, the optical detector can include a detector located at a field plane of system 1401 that receives beam of radiation 1428 (and/or beam of radiation 1429) or part of beam of radiation 1428 (and/or part of beam of radiation 1429) without the beam of radiation being diffracted from target 1418. In a non-limiting example, the optical detector can include a detector located at the position of interferometer 426 of FIGS. 4A and 4B that is configured to receive beam of radiation 1428 (and/or beam of radiation 1429) or part of beam of radiation 1428 (and/or part of beam of radiation 1429) without the beam of radiation being diffracted from target 1418.

In some embodiments, the near field distribution (intensity distribution at the near field) can refer to the field distribution of beam of radiation 1429 at output of waveguide device 1406 (or input of detector 1402), when waveguide device 1406 is used. Additionally, or alternatively, the near field distribution (intensity distribution at the near field) can refer to the field distribution of beam of radiation 1428 at the output of coherence adjuster 1400 (or input of detector 1402), when waveguide device 1406 is not used.

According to some embodiments, detector 1402 can include one or more optical detectors (e.g., one or more pupil cameras) to measure the far field distribution (intensity distribution at the far field) of beam of radiation 1428 (and/or beam of radiation 1429). Detector 1402 can include the pupil camera in addition to, or in alternative to, the optical detector discussed above. In some embodiments, the pupil camera can be a detector positioned at a pupil plane. In some embodiments, the pupil camera can include an optical plane where a radiation source is focused. Although the pupil camera is not explicitly illustrated in FIG. 14, the pupil camera can include, for example, beam analyzer 430 of FIGS. 4A and 4B. In some embodiments, the pupil camera (e.g., beam analyzer 430 of FIGS. 4A and 4B) can be configured to receive beam of radiation 1431 (or part of beam of radiation 1431) diffracted and/or scattered from target 1418 and determine an optical state of beam of radiation 1431. The optical state can be a measure of beam wavelength, polarization, beam profile, or field distribution. According to some embodiments, by measuring the field distribution of beam of radiation 1431 (or part of beam of radiation 1431), the pupil camera can be configured to determine the far field distribution (intensity distribution at the far field) of beam of radiation 1428 (and/or beam of radiation 1429).

Although one example of the pupil camera is provided, the embodiments of this disclosure are not limited to this example and detector 1402 can include one or more other detectors configured to measure the far field distribution (intensity distribution at the far field) of beam of radiation 1428 (and/or beam of radiation 1429). For example, the pupil camera can include a detector located at a pupil plane of system 1401 that receives beam of radiation 1428 (and/or beam of radiation 1429) or part of beam of radiation 1428 (and/or part of beam of radiation 1429) without the beam of radiation being diffracted from target 1418.

In addition to, or in alternate to, measuring one or more parameters associated with beam of radiation 1428 and/or one or more parameters associated with beam of radiation 1429 (e.g., the field distribution), detector 1402 (alone or in combination with processor 1404) can be configured to measure one or more parameters associated with target 1418. For example, detector 1402 can include one or more of detector 428, beam analyzer 430, and beam analyzer 430' of FIGS. 4A and 4B. The one or more parameters associated with target 1418 can include, but are not limited to, a position of target 1418, a position of the center of symmetry of an alignment mark or target 1418, an overlay of target 1418, a critical dimension of target 1418, a focus of target 1418, and the like.

Detector 1402 can be configured to receive beam of radiation 1431 diffracted and/or scattered by target 1408 and generate a measurement signal based on the received radiation. For example, detector 1402 (alone or in combination with processor 1404) can be configured to determine a position of a state (e.g., stage 422 of FIGS. 4A and 4B) and correlate the position of stage with the position of the center of symmetry of an alignment mark or target 1418. As such, the position of alignment mark or target 1418 and, consequently, the position of a substrate (e.g., substrate 420 of FIGS. 4A and 4B) can be accurately known with reference to the stage. Alternatively, detector 1402 can be configured to determine a position of system 1401 or any other reference element such that the center of symmetry of alignment mark or target 1418 can be known with reference to system 1400 or any other reference element. Detector 1402 (alone or in combination with processor 1404) can be further configured to determine the overlay data between two patterns and a model of the product stack profile of a substrate including target 1418. Detector 1402 (alone or in combination with processor 1404) can also be configured to measure overlay, critical dimension, and focus of target 1418.

According to some embodiments, system 1401 can be configured to adjust one or more parameters of coherence adjuster 1400 and/or adjust one or more parameters of radiation source 1414 using the determined/measured one or more parameters associated with beam of radiation 1428 (and/or one or more parameters associated with beam of radiation 1429). Additionally, or alternatively, system 1401 can be configured to adjust one or more parameters of coherence adjuster 1400 and/or adjust one or more parameters of radiation source 1414 using the determined/measured one or more parameters associated with target 1418. Therefore, system 1401 can be configured to dynamically adjust the light distribution at the output of a coherence adjuster and/or an input of a waveguide device coupled to a detector so that mitigate the homogeneity effects in both near field and far field.

Although some embodiments are discussed with respect to coherence adjuster 1400 and/or radiation source 1414 adjusting their parameter(s) based on the measured parameter(s) of the coherence adjusted beam of radiation 1428 (or 1429) and/or measured parameter(s) of target 1418, this disclosure is not limited to these embodiments. Some embodiments of this disclosure (as discussed in more detail below) can include coherence adjuster 1400 and/or radiation source 1414 being pre-adjusted (e.g., being calibrated) based on one or more models.

According to some embodiments, detector 1402 can be configured to send the measured one or more parameters associated with beam of radiation 1428 and/or the measured one or more parameters associated with beam of radiation 1429 to processor 1404. As discussed above, the one or more parameters associated with beam of radiation 1428 (and/or beam of radiation 1429) can include a field distribution of beam of radiation 1428 (and/or beam of radiation 1429). The field distribution can include one or more of a near field distribution and the far field distribution. Although field distribution is provided as one example for the measured one or more parameters, the embodiments of this disclosure are not limited to these examples and detector 1402 can be configured to send other measured parameters of beam of radiation 1428 (and/or beam of radiation 1429) to processor 1404. In some embodiments, processor 1404 can include processor 432 of FIGS. 4A and 4B.

Additionally, or alternatively, processor 1404 can be configured to determine one or more parameters associated with target 1418. For example, as discussed above, detector 1402 can be configured to receive beam of radiation 1431 diffracted and/or scattered by target 1408 and generate a measurement signal based on the received radiation. Detector 1402 can send the measurement signal to processor 1404 for further processing. Processor 1404 can determine the one or more parameters associated with target 1418 using the measurement signal received from detector 1402. The one or more parameters associated with target 1418 can include, but are not limited to, a position of target 1418, a position of the center of symmetry of an alignment mark or target 1418, an overlay of target 1418, a critical dimension of target 1418, a focus of target 1418, and the like.

According to some embodiments, processor 1404 can use the parameter(s) of the coherence adjusted beam of radiation (beam of radiation 1428 and/or 1429), the determined parameters of target 1418, or any combination of them to determine one or more parameters for coherence adjuster 1400. Additionally, or alternatively, processor 1404 can use the parameter(s) of the coherence adjusted beam of radiation (beam of radiation 1428 and/or 1429), the determined parameters of target 1418, or any combination of them to determine one or more parameters for radiation source 1414.

For example, processor 1404 can use the measured near field distribution of the coherence adjusted beam of radiation (beam of radiation 1428 and/or 1429) alone to determine one or more parameters for coherence adjuster 1400 (and/or to determine one or more parameters for radiation source 1414). In one embodiment, processor 1404 can use the measured near field distribution of the coherence adjusted beam of radiation (beam of radiation 1428 and/or 1429) with the determined parameter(s) of target 1418 to determine one or more parameters for coherence adjuster 1400 (and/or to determine one or more parameters for radiation source 1414).

In one embodiment, processor 1404 can use the measured far field distribution of the coherence adjusted beam of radiation (beam of radiation 1428 and/or 1429) alone to determine the one or more parameters for coherence adjuster 1400 (and/or to determine one or more parameters for radiation source 1414). In one embodiment, processor 1404 can use the measured far field distribution of the coherence adjusted beam of radiation (beam of radiation 1428 and/or 1429) with the determined parameter(s) of target 1418 to determine the one or more parameters for coherence adjuster 1400 (and/or to determine one or more parameters for radiation source 1414).

In one embodiment, processor 1404 can use the measured near field distribution and the measured far field distribution of the coherence adjusted beam of radiation (beam of radiation 1428 and/or 1429) to determine the one or more parameters for coherence adjuster 1400 (and/or to determine one or more parameters for radiation source 1414). In one example, processor 1404 can use the measured near field distribution and the measured far field distribution of the coherence adjusted beam of radiation (beam of radiation 1428 and/or 1429) with the determined parameter(s) of target 1418 to determine the one or more parameters for coherence adjuster 1400 (and/or to determine one or more parameters for radiation source 1414).

In one embodiment, processor 1404 can use the determined parameter(s) of target 1418 alone to determine the one or more parameters for coherence adjuster 1400 with the determined parameters of target 1418 (and/or to determine one or more parameters for radiation source 1414).

According to some embodiments, a desired value for each one of the one or more parameters of the coherence adjusted beam of radiation (beam of radiation 1428 and/or 1429) can be stored in storage device 1410 accessible by processor 1404. For example, storage device 1410 can store a desired distribution for the coherence adjusted beam of radiation (beam of radiation 1428 and/or 1429). The desired distribution can include a desired far field distribution, a desired near field distribution, and the like. In some embodiments, the desired value(s) for the parameter(s) of the coherence adjusted beam of radiation (beam of radiation 1428 and/or 1429) can be determined based on the structure of system 1401, the requirements for system 1401, the requirements for one or more devices in system 1401, and the like. In some embodiments, the desired values for the parameter(s) of the coherence adjusted beam of radiation (beam of radiation 1428 and/or 1429) can be set by a user/operator of system 1401 and/or of a lithographic apparatus (e.g., lithographic apparatus 100 or 100') associated with system 1401.

According to some embodiments, to determine one or more parameters for coherence adjuster 1400 and/or one or more parameters for radiation source 1414, processor 1404 compares the measured parameter(s) of the coherence adjusted beam of radiation (beam of radiation 1428 and/or 1429) with their associated desired values. In some examples, processor 1404 can further use a model (e.g., a mathematical model) to apply to the difference between the measured value(s) and the desired value(s) to determine one or more parameters for coherence adjuster 1400 and/or one or more parameters for radiation source 1414.

In an embodiment, the model can include a model between parameter(s) of coherence adjuster 1400 and a distribution (e.g., near field distribution, far field distribution) of the coherence adjusted beam of radiation (beam of radiation 1428 and/or 1429). Additionally, or alternatively, the model can include a model between parameter(s) of radiation source 1414 and a distribution (e.g., near field distribution, far field distribution) of the coherence adjusted beam of radiation (beam of radiation 1428 and/or 1429). In a non-limiting example, the model can include predetermined inverse correction coefficients. In some embodiments, processor 1404 can use artificial intelligence and machine learning techniques and technologies such as, but not limited to, logistic regression, random forest regression models, decision tree based algorithms, and the like to determine the inverse correction coefficients for the model.

According to some embodiments, a desired value for each one of the one or more parameters of target 1418 can be stored in storage device 1410 accessible by processor 1404. For example, storage device 1410 can store a desired value for, but not limited to, a position of target 1418, a position of the center of symmetry of an alignment mark or target 1418, an overlay of target 1418, a critical dimension of target 1418, a focus of target 1418, and the like. In some embodiments, the desired value(s) for the parameter(s) of target 1418 can be determined based on the structure of system 1401, the requirements for system 1401, the requirements for one or more devices in system 1401, the requirement for a corresponding lithographic apparatus and the like. In some embodiments, the desired values for the parameter(s) of target 1418 can be set by a user/operator of system 1401 and/or of a lithographic apparatus (e.g., lithographic apparatus 100 or 100') associated with system 1401.

According to some embodiments, to determine one or more parameters for coherence adjuster 1400 and/or one or more parameters for radiation source 1414, processor 1404 compares the measured parameter(s) of target 1418 with their associated desired values. In some examples, processor 1404 can further use a model (e.g., a mathematical model) to apply to the difference between the measured value(s) and the desired value(s) to determine one or more parameters for coherence adjuster 1400 and/or one or more parameters for radiation source 1414.

In an example, the model can include a model between parameter(s) of coherence adjuster 1400 and parameter(s) of target 1418. Additionally, or alternatively, the model can include a model between parameter(s) of radiation source 1414 and parameter(s) of target 1418. In a non-limiting example, the model can include predetermined inverse correction coefficients. In some embodiments, processor 1404 can use artificial intelligence and machine learning techniques and technologies such as, but not limited to, logistic regression, random forest regression models, decision tree based algorithms, and the like to determine the inverse correction coefficients for the model.

In some embodiments, processor 1404 can use the model between parameter(s) of coherence adjuster 1400 and the distribution of the coherence adjusted beam of radiation, the model between parameter(s) of coherence adjuster 1400 and parameter(s) of target 1418, or a combination of both to determine the one or more parameters for coherence adjuster 1400. Additionally, or alternatively, processor 1404 can use the model between parameter(s) of radiation source 1414 and the distribution of the coherence adjusted beam of radiation, the model between parameter(s) of radiation source 1414 and parameter(s) of target 1418, or a combination of both to determine the one or more parameters for radiation source 1414.

According to some embodiments, after determining the one or more parameters for coherence adjuster 1400 and/or the one or more parameters for radiation source 1414, processor 1404 can communicate these parameter(s) to coherence adjuster 1400 and/or radiation source 1414, respectively, to adjust the coherence adjuster 1400 and/or radiation source 1414.

According to some embodiments, coherence adjuster 1400 can include coherence adjuster 500 of FIG. 5 or coherence adjuster 700 of FIG. 7. In these embodiments, the determined parameter(s) for coherence adjuster 1400 can include determined parameter(s) for coherence adjuster 500 or 700. Processor 1404 can communicate the determined parameter(s) for coherence adjuster 500 or 700 to coherence adjuster 500 or 700, respectively, to adjust coherence adjuster 500 or 700 based on the determined parameter(s). Additionally, or alternatively, processor 1404 can adjust or control coherence adjuster 500 or 700 based on the determined parameter(s). Adjusting coherence adjuster 500 or 700 can include changing the impingement characteristic of radiation 516 (or 716) at input facet 510 (or 910). The impingement characteristic can include, for example, a position the beam spot of radiation 516 (or 716) at input facet 510 (or 710) (which influences which modes are used for propagation). Additionally or alternatively, the impingement characteristic can include angle(s) of incidence of radiation 516 (or 716) at input facet 510 (or 710) using, for example, small lens modifications.

In some embodiments, adjusting coherence adjuster 500 or 700 based on the determined parameter(s) can include using a variable dwell time for applying radiation 516 (or 716) at different locations at input facet 510 (or 710) of multimode waveguide device 504 (or 704). Additionally, or alternatively, adjusting coherence adjuster 500 or 700 based on the determined parameter(s) can include modulating an intensity of beam of radiation 518 (or 718) (the coherence adjusted beam of radiation) as a function of a position of the beam spot of radiation 516 (or 716) at input facet 510 (or 710) of multimode waveguide device 504 (or 704).

In some embodiments, processor 1404 can communicate the determined parameter(s) for coherence adjuster 500 to coherence adjuster 500 to control or adjust parameter(s) of actuator 506 and/or restoring device 508 so as to change the impingement characteristic of radiation 516 at input facet 510. For example, determined parameter(s) for coherence adjuster 500 can include parameter(s) associated with actuator 506 and/or restoring device 508. In some embodiments, actuator 506, and/or restoring device 508 can be provided a signal (e.g., a current or voltage) by processor 1404 to change the states/parameter(s) of actuator 506, and/or restoring device 508. Additionally, or alternatively, actuator 506, and/or restoring device 508 can be provided a signal (e.g., a current or voltage) by processor 1404 to actuate their corresponding waveguide device (502) based on the determined parameter(s).

In some embodiments, processor 1404 can communicate the determined parameter(s) for coherence adjuster 700 to coherence adjuster 700 to control or adjust parameter(s) of actuator 706 and/or restoring device 708 so as to change the impingement characteristic of radiation 716 at input facet 710. For example, determined parameter(s) for coherence adjuster 700 can include parameter(s) associated with actuator 706 and/or restoring device 708. In some embodiments, actuator 706 and/or restoring device 708 can be provided a signal (e.g., a current or voltage) by processor 1404 to change the states/parameter(s) of actuator 706 and/or restoring device 708. Additionally, or alternatively, actuator 706 and/or restoring device 708 can be provided a signal (e.g., a current or voltage) by processor 1404 to actuate waveguide device 702 based on the determined parameter(s). In some embodiments, processor 1404 can communicate the determined parameter(s) for coherence adjuster 700 to coherence adjuster 700 to control or adjust parameter(s) of optical elements 724 and 726 (e.g., a lens or a system of lenses), beam splitter device 730, and/or optical element 732 (e.g., a lens or a system of lenses).

According to some embodiments, coherence adjuster 1400 can include coherence adjuster 800 of FIG. 8 and/or coherence adjuster 900 of FIG. 9. In these embodiments, the determined parameter(s) for coherence adjuster 1400 can include determined parameter(s) for coherence adjuster 800 (or 900). Processor 1404 can communicate the determined parameter(s) for coherence adjuster 800 (or 900) to coherence adjuster 800 (or 900) to adjust coherence adjuster 800 (or 900) based on the determined parameter(s). Additionally, or alternatively, processor 1404 can adjust or control coherence adjuster 800 (or 900) based on the determined parameter(s). Adjusting coherence adjuster 800 (or 900) can include changing the impingement characteristic of radiation 816 at the input facet (e.g., 910). The impingement characteristic can include, for example, a position and/or size of the beam spot of radiation 816 at the input facet (e.g., 910) (which influences which modes are used for propagation). Additionally or alternatively, the impingement characteristic can include angle(s) of incidence of radiation 816 at the input facet (e.g., 910) using, for example, small lens modifications.

In some embodiments, adjusting coherence adjuster 800 (or 900) based on the determined parameter(s) can include using a variable dwell time for applying radiation 816 at different locations at the input facet (e.g., 910) of multimode waveguide device 804 (or 904). Additionally, or alternatively, adjusting coherence adjuster 800 (or 900) based on the determined parameter(s) can include modulating an intensity of beam of radiation (the coherence adjusted beam of radiation) as a function of a position of the beam spot of radiation 816 at the input facet (e.g., 910) of multimode waveguide device 804 (or 904). Additionally, or alternatively, adjusting coherence adjuster 800 (or 900) based on the determined parameter(s) can include modulating an intensity of beam of radiation (the coherence adjusted beam of radiation) as a function of angle(s) of incidence of radiation 816 at the input facet (e.g., 910) of multimode waveguide device 804 (or 904) using, for example, small lens modifications.

In some embodiments, processor 1404 can communicate the determined parameter(s) for coherence adjuster 800 (or 900) to coherence adjuster 800 (or 900) to control or adjust parameter(s) of actuator 806 and/or actuator 906 so as to change the impingement characteristic of radiation 816 at the input facet (e.g., 910). For example, determined parameter(s) for coherence adjuster 800 (or 900) can include parameter(s) associated with actuator 806 and/or actuator 906. In some embodiments, actuator 806 and/or actuator 906 can be provided a signal (e.g., a current or voltage) by processor 1404 to change the states/parameter(s) of actuator 806 and/or actuator 906. Additionally, or alternatively, actuator 806 and/or actuator 906 can be provided a signal (e.g., a current or voltage) by processor 1404 to actuate their corresponding waveguide device (802 or 902) based on the determined parameter(s).

In some embodiments, processor 1404 can communicate the determined parameter(s) for coherence adjuster 800 to coherence adjuster 800 to control or adjust parameter(s) of optical elements 824 and 826 (e.g., a lens or a system of lenses).

According to some embodiments, coherence adjuster 1400 can include coherence adjuster 1000 of FIG. 10, coherence adjuster 1100 of FIG. 11, and/or coherence adjuster 1200 of FIG. 12. In these embodiments, the determined parameter(s) for coherence adjuster 1400 can include determined parameter(s) for coherence adjuster 1000 (1100, or 1200). Processor 1404 can communicate the determined parameter(s) for coherence adjuster 1000 (1100, or 1200) to coherence adjuster 1000 (1100, or 1200, respectively) to adjust coherence adjuster 1000 (1100, or 1200) based on the determined parameter(s). Additionally, or alternatively, processor 1404 can adjust or control coherence adjuster 1000 (1100, or 1200) based on the determined parameter(s). Adjusting coherence adjuster 1000 (1100, or 1200) can include changing the impingement characteristic of radiation 1016 (1116, or 1216) at input facet 1010 (or 1110).

For example, considering coherence adjuster 1000 of FIG. 10, processor 1404 can communicate the determined parameter(s) for coherence adjuster 1000 to coherence adjuster 1000 to control or adjust parameter(s) of adjustable beam expander 1038 of FIG. 10. For example, determined parameter(s) for coherence adjuster 1000 can include parameter(s) associated with adjustable beam expander 1038. In some embodiments, adjustable beam expander 1038 can be provided a signal (e.g., a current or voltage) by processor 1404 to change the states/parameter(s) of adjustable beam expander 1038. As discussed with respect to FIG. 10, adjustable beam expander 1038 can allow size adjustments of a beam diameter 1042 of radiation 1016 in a lossless manner, according to some embodiments. The adjustments to beam diameter 1042 are performed in a manner that also controls the focus angles (or beam spread, or etendue) of radiation 1016 at input facet 1010. In turn, since multimode waveguide device 1004 can preserve the etendue of the received radiation, the etendue of beam of radiation 1018 can also be adjusted by adjustable beam expander 1038. Here, an impingement characteristic of radiation 1016 at input facet 1010 can include a distribution of incidence angles.

As another example, considering coherence adjuster 1000 of FIG. 10, processor 1404 can communicate the determined parameter(s) for coherence adjuster 1000 to coherence adjuster 1000 to control or adjust parameter(s) of actuator 1006 and/or reflective element 1036 of FIG. 10 (or the adjusting device discussed with respect to FIG. 10). For example, determined parameter(s) for coherence adjuster 1000 can include parameter(s) associated with actuator 1006 and/or reflective element 1036. In some embodiments, actuator 1006 can be provided a signal (e.g., a current or voltage) by processor 1404 to change the states/parameter(s) of actuator 1006 and/or reflective element 1036. As discussed with respect to FIG. 10, the change of the impingement characteristic can include a change of a position of the focus spot of radiation 1016 at input facet 1010 of multimode waveguide device 1004.

In some embodiments, processor 1404 can communicate the determined parameter(s) for coherence adjuster 1000 to coherence adjuster 1000 to control or adjust parameter(s) of optical elements 1024, 1026, and/or 1040 (e.g., a lens or a system of lenses).

In some embodiments, considering coherence adjuster 1100 of FIG. 11, processor 1404 can communicate the determined parameter(s) for coherence adjuster 1100 to coherence adjuster 1100 to control or adjust parameter(s) of actuator 1106 and/or reflective element 1136 of FIG. 11 (or the adjusting device discussed with respect to FIG. 11). For example, determined parameter(s) for coherence adjuster 1100 can include parameter(s) associated with actuator 1106 and/or reflective element 1136. In some embodiments, actuator 1106 can be provided a signal (e.g., a current or voltage) by processor 1404 to change the states/parameter(s) of actuator 1106 and/or reflective element 1136. As discussed with respect to FIG. 11, a change of an impingement characteristic of radiation 1116 can include a change of a focus spot at a conjugate plane of input facet 1110. In this manner, an interference pattern of beam of radiation 1118 can be adjusted based on the change of the impingement characteristic.

In some embodiments, processor 1404 can communicate the determined parameter(s) for coherence adjuster 1100 to coherence adjuster 1100 to control or adjust parameter(s) of optical elements 1126 and/or 1140 (e.g., a lens or a system of lenses).

In some embodiments, considering coherence adjuster 1200 of FIG. 12, processor 1404 can communicate the determined parameter(s) for coherence adjuster 1200 to coherence adjuster 1200 to control or adjust parameter(s) of diffuser device 1246 of FIG. 12. For example, the determined parameter(s) for coherence adjuster 1200 can include parameter(s) associated with diffuser device 1246. In some embodiments, actuator 1206 can be provided a signal (e.g., a current or voltage) by processor 1404 to change the states/parameter(s) of diffuser device 1246. As discussed with respect to FIG. 12, by selecting and/or adjusting the appropriate diffuser element 1246a or 1246b of diffuser device 1246 to be in the path of radiation, the size of beam diameter 1242 can be selected (a different beam diameter is shown by dashed lines). In some embodiments, the determined parameter(s) for diffuser device 1246 sent by processor 1404 to coherence adjuster 1200 can include which diffuser element to use. Additionally, or alternatively, the determined parameter(s) for diffuser device 1246 sent by processor 1404 to coherence adjuster 1200 can include a rotation, a vibration, and/or a speed of rotation for diffuser device 1246.

In some embodiments, processor 1404 can communicate the determined parameter(s) for coherence adjuster 1200 to coherence adjuster 1200 to control or adjust parameter(s) of optical elements 1224, 1240, 1243, and/or 1244 (e.g., a lens or a system of lenses).

It is noted that although some exemplary parameters of coherence adjuster 1400 are discussed above that can be controlled and adjusted by processor 1404, the embodiments of this disclosure are not limited to these parameters. Processor 1404 can control and adjust other parameters of coherence adjuster 1400 based on information processor 1404 receives from detector 1402 and/or based on information stored in, for example, storage device 1410.

In addition to, or in alternate to, controlling and adjusting coherence adjuster 1400 discussed above, processor 1404 can control and adjust radiation source 1414 based, at least, on determining the one or more parameters for radiation source 1414. In some embodiments, the one or more parameters for radiation source 1414 can include, but are not limited to, a wavelength of the radiation (e.g., radiation 1412) generated by radiation source 1414 and/or a frequency band of the radiation (e.g., radiation 1412) generated by radiation source 1414. In some embodiments, the one or more parameters for radiation source 1414 can include, but are not limited to, an angle of incidence of the radiation (e.g., radiation 1412) generated by radiation source 1414 at coherence adjuster 1400. In some embodiments, the one or more parameters for radiation source 1414 can include, but are not limited to, an intensity of the radiation (e.g., radiation 1412) generated by radiation source 1414 as a function of the position of a focus point of the radiation (e.g., radiation 1412) at coherence adjuster 1400. In some embodiments, the one or more parameters for radiation source 1414 can include, but are not limited to, dwell time of the spot of the radiation (e.g., radiation 1412) generated by radiation source 1414 at different locations in coherence adjuster 1400.

Figure 15A:
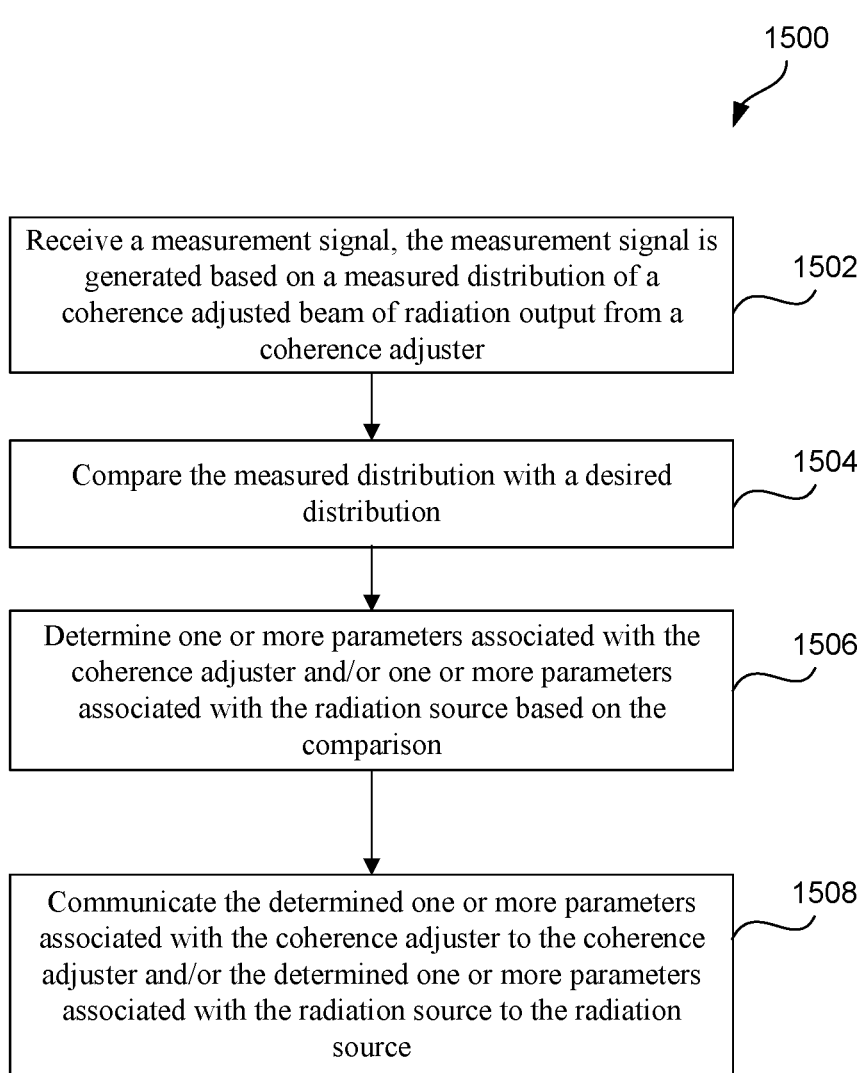
FIG. 15A illustrates an example method for determining parameter(s) for a coherence adjuster and/or a radiation source and adjusting the coherence adjuster and/or the radiation source using the determined parameter(s), according to some embodiments of the disclosure.

FIG. 15A illustrates an example method 1500 for determining parameter(s) for a coherence adjuster and/or a radiation source and adjusting the coherence adjuster and/or the radiation source using the determined parameter(s), according to some embodiments of the disclosure. As a convenience and not a limitation, FIG. 15A may be described with regard to elements of FIG. 14. Method 1500 may represent the operation of a system (e.g., system 1401) implementing operations for determining parameter(s) for a coherence adjuster and/or a radiation source and adjusting the coherence adjuster and/or the radiation source using the determined parameter(s). Method 1500 may also be performed by computer system 2100 of FIG. 21. But method 1500 is not limited to the specific embodiments depicted in those figures, and other systems may be used to perform the method as will be understood by those skilled in the art. It is to be appreciated that not all operations may be needed, and the operations may not be performed in the same order as shown in FIG. 15A.

At 1502, a measurement signal is received. For example, processor 1404 of FIG. 14 can receive the measurement signal from detector 1402 of FIG. 14. In some embodiments, the measurement signal can be generated by, for example, detector 1402 based on a measured distribution (intensity distribution in a field) of a coherence adjusted beam of radiation output from the coherence adjuster. In some embodiments, the measured distribution can include measured near field distribution (measured intensity distribution of the coherence adjusted beam of radiation in the near field). Additionally, or alternatively, the measured distribution can include measured far field distribution (measured intensity distribution of the coherence adjusted beam of radiation in the far field).

At 1504, the measured distribution is compared with a desired distribution. For example, processor 1404 can compare the measured distribution with the desired distribution. In some embodiments, processor 1404 is configured to determine (e.g., extract) the measured distribution from the received measurement signal. In some examples, the desired distribution can desired near field distribution (desired intensity distribution of the coherence adjusted beam of radiation in the near field). Additionally, or alternatively, the desired distribution can include desired far field distribution (desired intensity distribution of the coherence adjusted beam of radiation in the far field).

At 1506, one or more parameters associated with the coherence adjuster or one or more parameters associated with a radiation source are determined based on the comparison. For example, processor 1404 can determine one or more parameters associated with the coherence adjuster based on the comparison 1504 and/or a difference between the measured distribution and the desired distribution. Additionally, or alternatively, processor 1404 can determine one or more parameters associated with the radiation source based on the comparison 1504 and/or a difference between the measured distribution and the desired distribution.

According to some embodiments, determining the one or more parameters associated with the coherence adjuster can include using a model between parameters of the coherence adjuster and a distribution of the coherence adjusted beam of radiation. In some embodiments, the model can include one or more inverse correction coefficients. In some embodiments, determining the one or more parameters associated with the coherence adjuster and/or using the one or more inverse correction coefficients can include using a machine learning model. In some embodiments, the model can be stored in, for example, storage device 1410 accessible by processor 1404. In some embodiments, determining the one or more parameters associated with the coherence adjuster can include using an iteratively optimization method optimizing the one or more parameters associated with the coherence adjuster based on the comparison 1504.

According to some embodiments, determining the one or more parameters associated with the radiation source can include using a model between parameters of the radiation source and a distribution of the coherence adjusted beam of radiation. In some embodiments, the model can include one or more inverse correction coefficients. In some embodiments, determining the one or more parameters associated with the radiation source and/or using the one or more inverse correction coefficients can include using a machine learning model. In some embodiments, the model can be stored in, for example, storage device 1410 accessible by processor 1404. In some embodiments, determining the one or more parameters associated with the radiation source can include using an iteratively optimization method optimizing the one or more parameters associated with the radiation source based on the comparison 1504.

At 1508, the determined one or more parameters associated with the coherence adjuster is communicated to the coherence adjuster and/or the determined one or more parameters associated with the radiation source are communicated to the radiation source. For example, processor 1404 can communicate the determined one or more parameters associated with the coherence adjuster to coherence adjuster 1400. Additionally, or alternatively, processor 1404 can communicate the determined one or more parameters associated with the radiation source to radiation source 1414.

Instead of (or in addition to) communicating the determined parameter(s), operation 1508 can include adjusting or controlling (for example, using processor 1404) coherence adjuster 1400 using the determined one or more parameters associated with the coherence adjuster. Additionally, or alternatively, operation 1508 can include adjusting or controlling (for example, using processor 1404) radiation source 1414 using the determined one or more parameters associated with radiation source.

In some embodiments, at 1506, processor 1404 determines a value of a parameter of coherence adjuster 1400. And at 1508, processor 1404 communicates the determined value of the parameter to coherence adjuster 1400. Coherence adjuster 1400 adjusts the parameter associated with coherence adjuster 1400 based at least on the determined value of the parameter. In some embodiments, coherence adjuster 1400 can adjust the parameter associated with coherence adjuster 1400 using other values in addition to the determined value of the parameter. In some embodiments, adjusting the parameter associated with coherence adjuster 1400 based at least on the determined value of the parameter can include using a variable dwell time for the received spatially coherent radiation at different locations at an input of the multimode waveguide device of the coherence adjuster. Additionally, or alternatively, adjusting the parameter associated with coherence adjuster 1400 based at least on the determined value of the parameter can include modulating an intensity of the coherence adjusted beam of radiation as a function of position of a spatially coherent radiation (received from, for example, radiation source 1414) at the input of the multimode waveguide device of the coherence adjuster. Additionally, or alternatively, adjusting the parameter associated with coherence adjuster 1400 based at least on the determined value of the parameter can include modulating an intensity of the coherence adjusted beam of radiation as a function of an angle of incidence of the spatially coherent radiation (received from, for example, radiation source 1414) at the input of the multimode waveguide device of the coherence adjuster.

In some embodiments, at 1506, processor 1404 determines a value of a parameter of radiation source 1414. And at 1508, processor 1404 communicates the determined value of the parameter to radiation source 1414. Radiation source 1414 adjusts the parameter associated with radiation source 1414 based at least on the determined value of the parameter. In some embodiments, radiation source 1414 can adjusts the parameter associated with radiation source 1414 using other values in addition to the determined value of the parameter. In some embodiments, adjusting the parameter associated with radiation source 1414 based at least on the determined value of the parameter can include adjusting wavelength associated with the radiation beam generated by the radiation source. In some embodiments, adjusting the parameter associated with radiation source 1414 based at least on the determined value of the parameter can include using a variable dwell time for the spot of the radiation beam generated by the radiation source at different locations at an input of the coherence adjuster. Additionally, or alternatively, adjusting the parameter associated with radiation source 1414 based at least on the determined value of the parameter can include modulating an intensity of the radiation beam generated by the radiation source as a function of the position of the radiation beam generated by the radiation source at the input of the coherence adjuster.

FIG. 15B illustrates an example method 1520 for determining parameter(s) for a coherence adjuster and/or a radiation source and adjusting the coherence adjuster and/or the radiation source using the determined parameter(s), according to some embodiments of the disclosure. As a convenience and not a limitation, FIG. 15B may be described with regard to elements of FIG. 14. Method 1520 may represent the operation of a system (e.g., system 1401) implementing operations for determining parameter(s) for a coherence adjuster and/or a radiation source and adjusting the coherence adjuster and/or the radiation source using the determined parameter(s). Method 1520 may also be performed by computer system 2100 of FIG. 21. But method 1520 is not limited to the specific embodiments depicted in those figures, and other systems may be used to perform the method as will be understood by those skilled in the art. It is to be appreciated that not all operations may be needed, and the operations may not be performed in the same order as shown in FIG. 15B.

At 1522, a measurement signal is received. For example, processor 1404 of FIG. 14 can receive the measurement signal from detector 1402 of FIG. 14. In some embodiments, the measurement signal can be generated by, for example, detector 1402 based on radiation scattered by a target (e.g., target 1418) irradiated by a coherence adjusted beam of radiation from a coherence adjuster (e.g., coherence adjuster 1400).

At 1524, one or more parameters associated with the target is determined based on the measurement signal. The parameter(s) associated with the target can include, but is not limited to, overlay, alignment, critical dimension, focus, and the like.

At 1526, the determined parameter(s) is compared with a desired parameter associated with the target. For example, processor 1404 can compare the determined parameter(s) with a desired parameter(s) associated with the target. In some embodiments, processor 1404 is configured to determine (e.g., extract) the parameter(s) from the received measurement signal. In some embodiments, the desired parameter(s) associated with the target can include, but is not limited to, overlay, alignment, critical dimension, focus, and the like.

At 1528, one or more parameters associated with the coherence adjuster or one or more parameters associated with a radiation source are determined based on the comparison. For example, processor 1404 can determine one or more parameters associated with the coherence adjuster based on the comparison 1504 and/or a difference between the determined parameter(s) and the desired parameter(s). Additionally, or alternatively, processor 1404 can determine one or more parameters associated with the radiation source based on the comparison 1504 and/or a difference between the determined parameter(s) and the desired parameter(s).

According to some embodiments, determining the one or more parameters associated with the coherence adjuster can include using a model between parameters of the coherence adjuster and parameters of the target. In some embodiments, the model can include one or more inverse correction coefficients. In some embodiments, determining the one or more parameters associated with the coherence adjuster and/or using the one or more inverse correction coefficients can include using a machine learning model. In some embodiments, the model can be stored in, for example, storage device 1410 accessible by processor 1404. In some embodiments, determining the one or more parameters associated with the coherence adjuster can include using an iteratively optimization method optimizing the one or more parameters associated with the coherence adjuster based on the comparison 1504.

According to some embodiments, determining the one or more parameters associated with the radiation source can include using a model between parameters of the radiation source and parameters of the target. In some embodiments, the model can include one or more inverse correction coefficients. In some embodiments, determining the one or more parameters associated with the radiation source and/or using the one or more inverse correction coefficients can include using a machine learning model. In some embodiments, the model can be stored in, for example, storage device 1410 accessible by processor 1404. In some embodiments, determining the one or more parameters associated with the radiation source can include using an iteratively optimization method optimizing the one or more parameters associated with the radiation source based on the comparison 1504.

At 1530, the determined one or more parameters associated with the coherence adjuster is communicated to the coherence adjuster and/or the determined one or more parameters associated with the radiation source are communicated to the radiation source. For example, processor 1404 can communicate the determined one or more parameters associated with the coherence adjuster to coherence adjuster 1400. Additionally, or alternatively, processor 1404 can communicate the determined one or more parameters associated with the radiation source to radiation source 1414.

Instead of (or in addition to) communicating the determined parameter(s), operation 1530 can include adjusting or controlling (for example, using processor 1404) coherence adjuster 1400 using the determined one or more parameters associated with the coherence adjuster. Additionally, or alternatively, operation 1530 can include adjusting or controlling (for example, using processor 1404) radiation source 1414 using the determined one or more parameters associated with radiation source.

In some embodiments, at 1528, processor 1404 determines a value of a parameter of coherence adjuster 1400. And at 1530, processor 1404 communicates the determined value of the parameter to coherence adjuster 1400. Coherence adjuster 1400 adjusts the parameter associated with coherence adjuster 1400 based at least on the determined value of the parameter. In some embodiments, coherence adjuster 1400 can adjust the parameter associated with coherence adjuster 1400 using other values in addition to the determined value of the parameter. In some embodiments, adjusting the parameter associated with coherence adjuster 1400 based at least on the determined value of the parameter can include using a variable dwell time for the received spatially coherent radiation at different locations at an input of the multimode waveguide device of the coherence adjuster. Additionally, or alternatively, adjusting the parameter associated with coherence adjuster 1400 based at least on the determined value of the parameter can include modulating an intensity of the coherence adjusted beam of radiation as a function of position of a spatially coherent radiation (received from, for example, radiation source 1414) at the input of the multimode waveguide device of the coherence adjuster. Additionally, or alternatively, adjusting the parameter associated with coherence adjuster 1400 based at least on the determined value of the parameter can include modulating an intensity of the coherence adjusted beam of radiation as a function of an angle of incidence of the spatially coherent radiation (received from, for example, radiation source 1414) at the input of the multimode waveguide device of the coherence adjuster.

In some embodiments, at 1528, processor 1404 determines a value of a parameter of radiation source 1414. And at 1530, processor 1404 communicates the determined value of the parameter to radiation source 1414. Radiation source 1414 adjusts the parameter associated with radiation source 1414 based at least on the determined value of the parameter. In some embodiments, radiation source 1414 can adjust the parameter associated with radiation source 1414 using other values in addition to the determined value of the parameter. In some embodiments, adjusting the parameter associated with radiation source 1414 based at least on the determined value of the parameter can include adjusting wavelength associated with the radiation beam generated by the radiation source. In some embodiments, adjusting the parameter associated with radiation source 1414 based at least on the determined value of the parameter can include using a variable dwell time for the spot of the radiation beam generated by the radiation source at different locations at an input of the coherence adjuster. Additionally, or alternatively, adjusting the parameter associated with radiation source 1414 based at least on the determined value of the parameter can include modulating an intensity of the radiation beam generated by the radiation source as a function of the position of the radiation beam generated by the radiation source at the input of the coherence adjuster.

Although methods 1500 and 1520 are discussed as separate methods, the embodiments of this disclosure can include a combination of methods 1500 and 1520 or a combination of one or more steps of methods 1500 and 1520. For example, processor 1404 can control or adjust coherence adjuster 1400 using measured distribution of the coherence adjusted beam of radiation and the determined parameter(s) of the target. Similarly, processor 1404 can control or adjust radiation source 1414 using measured distribution of the coherence adjusted beam of radiation and the determined parameter(s) of the target.

Figure 16A:
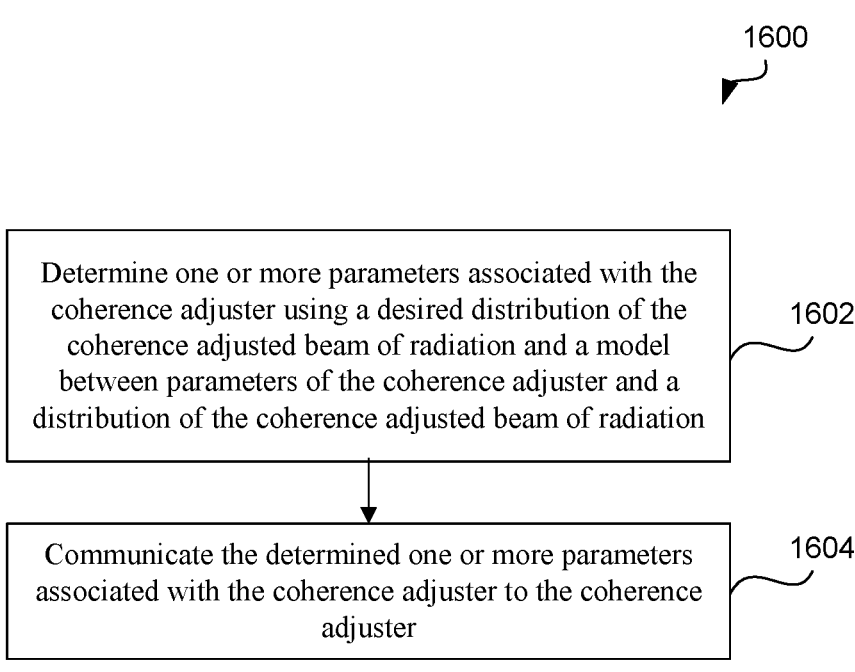
FIG. 16A illustrates an example feedforward method for determining parameter(s) for a coherence adjuster and adjusting the coherence adjuster based on the determined parameter(s), according to some embodiments of the disclosure.

FIG. 16A illustrates an example feedforward (e.g., open loop) method 1600 for determining parameter(s) for a coherence adjuster and adjusting the coherence adjuster based on the determined parameter(s), according to some embodiments of the disclosure. As a convenience and not a limitation, FIG. 16A may be described with regard to elements of FIG. 14. Method 1600 may represent the operation of a system (e.g., system 1401) implementing operations for determining parameter(s) for a coherence adjuster and adjusting the coherence adjuster based on the determined parameter(s). Method 1600 may also be performed by computer system 2100 of FIG. 21. But method 1600 is not limited to the specific embodiments depicted in those figures, and other systems may be used to perform the method as will be understood by those skilled in the art. It is to be appreciated that not all operations may be needed, and the operations may not be performed in the same order as shown in FIG. 16A.

In addition to, or in alternate to, methods 1500 and 1520 that can operate based on feedback information provided by detector 1402, method 1600 can be performed by processor 1404 without the feedback information. In some embodiments, method 1600 can be performed as a calibration (e.g., open loop) method for calibrating system 1401 before and/or during operation of system 1401.

At 1602, one or more parameters associated with the coherence adjuster is determined using a desired distribution of the coherence adjusted beam of radiation and a model between parameters of the coherence adjuster and a distribution of the coherence adjusted beam of radiation. For example, processor 1404 can determine one or more parameters associated with coherence adjuster 1400 using a desired distribution of the coherence adjusted beam of radiation (e.g., beam of radiation 1428 or 1429) and a model between parameters of the coherence adjuster and a distribution of the coherence adjusted beam of radiation.

In some embodiments, the model can stored in storage device 1410 accessible by processor 1404. In some embodiments, the model can include one or more inverse correction coefficient.

At 1604, the determined one or more parameters associated with the coherence adjuster are communicated to the coherence adjuster. For example, processor 1404 communicates the determined one or more parameters to coherence adjuster 1400. Operation 1604 can be similar to operation 1508 of FIG. 15A.

Although method 1600 is discussed with respect to a model between parameters of the coherence adjuster and a distribution of the coherence adjusted beam of radiation, similar operations can be performed using a model between parameters of the coherence adjuster and parameter(s) of a target (e.g., target 1418).

Figure 16B:
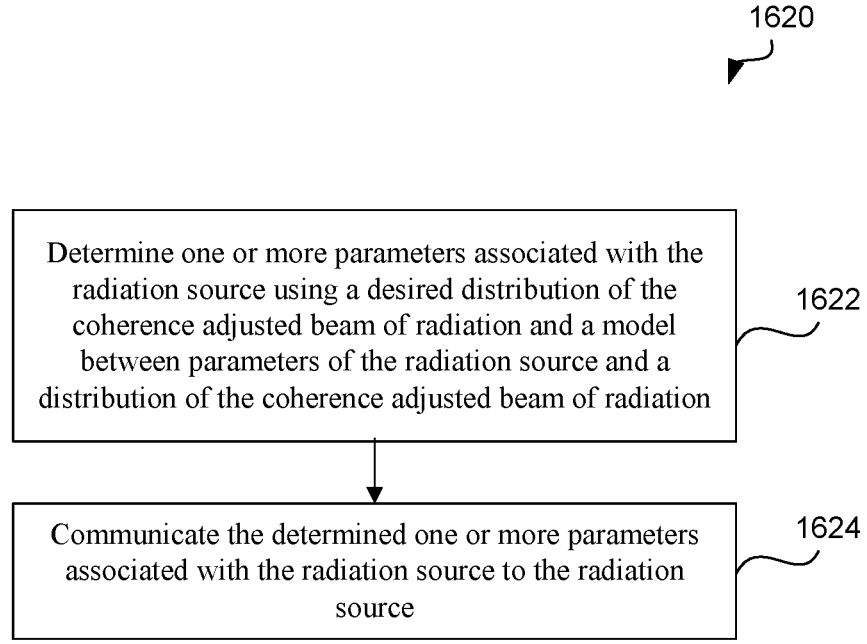
FIG. 16B illustrates an example feedforward method for determining parameter(s) for a radiation source and adjusting the radiation source based on the determined parameter(s), according to some embodiments of the disclosure.

FIG. 16B illustrates an example feedforward (e.g., open loop) method 1620 for determining parameter(s) for a radiation source and adjusting the radiation source based on the determined parameter(s), according to some embodiments of the disclosure. As a convenience and not a limitation, FIG. 16B may be described with regard to elements of FIG. 14. Method 1620 may represent the operation of a system (e.g., system 1401) implementing operations for determining parameter(s) for a radiation source and adjusting the radiation source based on the determined parameter(s). Method 1620 may also be performed by computer system 2100 of FIG. 21. But method 1620 is not limited to the specific embodiments depicted in those figures, and other systems may be used to perform the method as will be understood by those skilled in the art. It is to be appreciated that not all operations may be needed, and the operations may not be performed in the same order as shown in FIG. 16B.

In addition to, or in alternate to, methods 1500 and 1520 that can operated based on feedback information provided by detector 1402, method 1620 can be performed by processor 1404 without the feedback information. In some embodiments, method 1620 can be performed as a calibration (e.g., open loop) method for calibrating system 1401 before and/or during operation of system 1401.

At 1622, one or more parameters associated with the radiation source is determined using a desired distribution of the coherence adjusted beam of radiation and a model between parameters of the radiation source and a distribution of the coherence adjusted beam of radiation. For example, processor 1404 can determine one or more parameters associated with radiation source 1414 using a desired distribution of the coherence adjusted beam of radiation (e.g., beam of radiation 1428 or 1429) and a model between parameters of the radiation source and a distribution of the coherence adjusted beam of radiation.

In some embodiments, the model can stored in storage device 1410 accessible by processor 1404. In some embodiments, the model can include one or more inverse correction coefficient.

At 1624, the determined one or more parameters associated with the radiation source are communicated to the radiation source. For example, processor 1404 communicates the determined one or more parameters to radiation source 1414. Operation 1624 can be similar to operation 1508 of FIG. 15A.

Although method 1620 is discussed with respect to a model between parameters of the radiation source and a distribution of the coherence adjusted beam of radiation, similar operations can be performed using a model between parameters of the radiation source and parameter(s) of a target (e.g., target 14180).

Exemplary Multi-Source Radiation Systems for Coherence Scrambling

Some embodiments of this disclosure are directed to using multi-source radiation systems with the coherence adjusters discussed above. In some embodiments, the multi-source radiation system includes two or more radiation sources (e.g., spatially coherent radiation sources). Each of the two or more radiation sources of the multi-source radiation system can generate coherent radiation. The generated coherent radiations from the radiation sources of the multi-source radiation system can be at least spatially coherent radiations. Additionally, or alternatively, the generated coherent radiations from the radiation sources of the multi-source radiation system can include temporally coherent radiations.

According to some embodiments, the multi-source radiation system can parallelize the generated radiations from the two or more radiation sources and combine the power of the generated radiations to increase the power of the radiation that is input to the coherence adjuster. Therefore, the multi-source radiation system of this disclosure can increase the power of coherence adjusted beam of radiation generated by the coherence adjuster. For example, the multi-source radiation system combines spatially coherent radiation sources and scan the radiation sources simultaneously or substantially simultaneously over a facet of a multimode waveguide device. Doing so can enable the multi-source radiation system to combine the power or the beam of radiations from multiple radiation sources to increase the power of the coherence adjusted beam of radiation at the output of the multimode waveguide device.

Additionally, or alternatively, the multi-source radiation system can include two or more radiation sources with orthogonal polarization states. For example, the multi-source radiation system can include two radiation sources with orthogonal polarization states. The multi-source radiation system combines the radiations from the two radiation sources to a combined radiation to increase the power of the combined radiation.

According to some embodiments, and as discussed in more detail below, the multi-source radiation system can be used with one or more of coherence adjusters 500, 600, 700, 800, 900, 1000, 1100, 1200, and 1400 of FIGS. 5-12 and 14.

Figure 17:
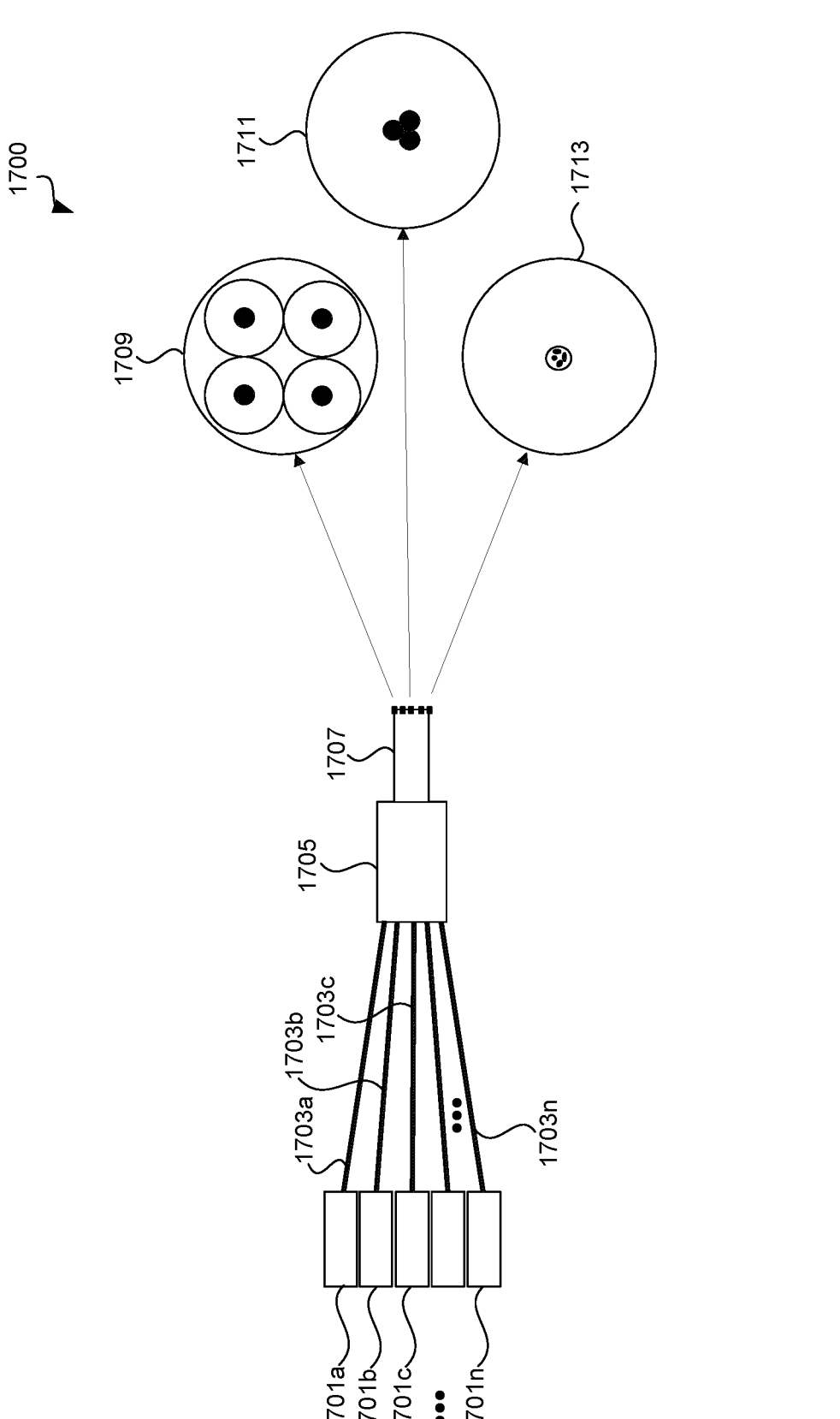
FIG. 17 illustrates a schematic of a multi-source radiation system, according to some embodiments of this disclosure.

FIG. 17 illustrates a schematic of multi-source radiation system 1700, according to some embodiments. Multi-source radiation system 1700 can include plurality of radiation sources 1701, plurality of waveguide devices 1703, waveguide combining element 1705, and combined waveguide device 1707, according to some embodiments.

Plurality of radiation sources 1701a-1701n (herein referred to as radiation sources 1701) can include coherent radiation sources. For example, one or more of radiation sources 1701 can include spatially coherent radiation sources. Additionally, or alternatively, one or more of radiation sources 1701 can include temporally coherent radiation sources. In some examples, one or more of radiation sources 1701 can include a laser source (for example, but not limited to, a vertical-cavity surface-emitting laser (VCSEL)).

In some embodiments, each radiation source 1701 (e.g., radiation sources 1701a-1701n) can be coupled to waveguide combining element 1705 using a corresponding waveguide device 1703 (e.g., waveguide devices 1703a-1703n). In some examples, waveguide device 1703 can include a single-mode fiber. However, the embodiments of this disclosure are not limited to this example, and waveguide device 1703 can include other devices/fibers. Each of waveguide devices 1703 can include an input that receives a beam of radiation (e.g., a coherent beam of radiation) from its corresponding radiation source. Each of waveguide devices 1703 can also include an output from which a beam of radiation (e.g., an adjusted coherent beam of radiation) exits.

Waveguide combining element 1705 can receive the coherent beams of radiation from radiation sources 1701 through corresponding waveguide devices 1703. Waveguide combining element 1705 can include an input that receives the beams of radiation (e.g., the adjusted coherent beams of radiation) from waveguide devices 1703. Waveguide combining element 1705 can combine the coherent beams of radiation from radiation sources 1701 and output the combined coherent beams of radiation to combined waveguide device 1707. Waveguide combining element 1705 can include an output from which the combined coherent beams of radiation exit.

Combined waveguide device 1707 includes an input that receives the combined coherent beams of radiation from waveguide combining element 1705. According to some embodiments, waveguide combining element 1705 can have different structures resulting in different multi-source fiber facets 1709-1713 at the output of combined waveguide device 1707. Although some exemplary multi-source fiber facets 1709-1713 are provided in FIG. 17, the embodiments of this disclosure are not limited to these examples and the multi-source fiber facets can include other arrangements.

In some embodiments, waveguide combining element 1705 can include a bundled single-mode fiber with thinned or adiabatically tapered cladding. Additionally, or alternatively, waveguide combining element 1705 can include bundled single-mode fibers fused into a multimode fiber. Additionally, or alternatively, waveguide combining element 1705 can include a Photonic Integrated Circuit (PIC) configured to combine single-mode waveguide devices (e.g., fibers) into a multimode waveguide device (e.g., a fiber). PIC can also be configured to combine radiation into a multi-core waveguide device. However, the embodiments of this disclosure are not limited to these examples and waveguide combining element 1705 can include other devices configured to combine a plurality of radiation source into a multi-source fiber facet.

According to some embodiments, the output of multi-source radiation system 1700 (e.g., the multi-source fiber facet) can include different arrangements. In some embodiments, the different arrangements for the output of multi-source radiation system 1700 can depend on, for example, waveguide combining element 1705. The output of multi-source radiation system 1700 combines the power of radiation sources 1701 to provide a combined power to the coherence adjusters discussed above. According to some embodiments, the output of multi-source radiation system 1700 can include a bundle of single-mode waveguide devices (e.g., fibers). For example, the output of multi-source radiation system 1700 can include a fiber bundle with coarsely or densely spaced cores. Single-mode fiber bundle 1709 illustrates one example of the fiber bundle with coarsely or densely spaced cores. In this example, four radiation sources 1701 and/or four waveguide devices 1703 are combined into single-mode fiber bundle 1709 (e.g., a bundle of 4 fibers). In a non-limiting example, the centers of the waveguide devices (e.g., fibers) in single-mode fiber bundle 1709 can be separated from each other by approximately 100 µm. However, the embodiments of this disclosure can include single-mode fiber bundle 1709 generated based on the combination of any number of radiations sources and/or waveguide devices. Also, the embodiments of this disclosure can include single-mode fiber bundle 1709 having different measurements between the centers of the waveguide devices in single-mode fiber bundle 1709.

In some embodiments, the output of multi-source radiation system 1700 can include multi-core fiber (MCF) 1711. In this example, three radiation sources 1701 and/or three waveguide devices 1703 are combined into MCF 1711 (e.g., 3-cores). In a non-limiting example, the centers of the waveguide devices in MCF 1711 can be separated from each other by approximately 10 µm. However, the embodiments of this disclosure can include MCF 1711 generated based on the combination of any number of radiations sources and/or waveguide devices. Additionally, the embodiments of this disclosure can include MCF 1711 having different measurements between the centers of the waveguide devices in MCF 1711.

In some embodiments, the output of multi-source radiation system 1700 can include small core multimode fiber 1713, which combines waveguide devices 1703 (e.g., a plurality of single-mode fibers) into a multimode waveguide device.

As discussed above, multi-source radiation system 1700 can be used at least with one or more of coherence adjusters 500, 600, 700, 800, 900, 1000, 1100, 1200, and 1400 of FIGS. 5-12 and 14.

In one embodiment, multi-source radiation system 1700 can be used as radiation source 514 and waveguide device 502 of FIG. 5. For example, radiation source 514 of FIG. 5 can include radiation sources 1701, waveguide devices 1703, and waveguide combining element 1705 of FIG. 17. And waveguide device 502 of FIG. 5 can include combined waveguide device 1707 of FIG. 17. In other words, the output of multi-source radiation system 1700 (e.g., single-mode fiber bundle 1709, MCF 1711, and/or small core multimode fiber 1713) can be input to input facet 510 of multimode waveguide device 504 of FIG. 5. In this example, beam of radiation 516 of FIG. 5 can include one or more beams of radiation exiting multi-source radiation system 1700.

According to some embodiments, actuator 506 and/or restoring device 508 of FIG. 5 can be applied to combined waveguide device 1707. Therefore, the output of multi-source radiation system 1700 (e.g., single-mode fiber bundle 1709, MCF 1711, and/or small core multimode fiber 1713) can be scanned over input facet 510 of multimode waveguide device 504 of FIG. 5. For example, actuator 506 and/or restoring device 508 of FIG. 5 can be configured to change impingement characteristic of the one or more beams of radiation exiting multi-source radiation system 1700 at input 510 of multimode waveguide device 504.

In some embodiments, actuator 506 and/or restoring device 508 can be configured to change impingement characteristic of each one of the one or more beams of radiation exiting multi-source radiation system 1700 at the input of multimode waveguide device 1204. For example, actuator 506 and/or restoring device 508 can be configured to change a impingement characteristic of a first one of the one or more beams of radiation exiting multi-source radiation system 1700 at input 510 of multimode waveguide device 504 and can be configured to change the impingement characteristic of a second one of the one or more beams of radiation exiting multi-source radiation system 1700 at input 510 of multimode waveguide device 504.

Similarly, multi-source radiation system 1700 can be used as waveguide device 602 of FIG. 6. For example, waveguide device 602 of FIG. 6 can include combined waveguide device 1707 of FIG. 17.

In one embodiment, multi-source radiation system 1700 can be used as a radiation source (not shown in FIG. 7) and waveguide device 702 of FIG. 7. For example, waveguide device 702 of FIG. 7 can include combined waveguide device 1707 of FIG. 17. In other words, the output of multi-source radiation system 1700 (e.g., single-mode fiber bundle 1709, MCF 1711, and/or small core multimode fiber 1713) can be input to input facet 710 of multimode waveguide device 704 of FIG. 7. In this example, beam of radiation 716 of FIG. 7 can include one or more beams of radiation exiting multi-source radiation system 1700. According to some embodiments, actuator 706 and/or restoring device 708 of FIG. 7 can be applied to combined waveguide device 1707. Therefore, the output of multi-source radiation system 1700 (e.g., single-mode fiber bundle 1709, MCF 1711, and/or small core multimode fiber 1713) can be scanned over input facet 710 of multimode waveguide device 704 of FIG. 7.

For example, actuator 706 and/or restoring device 708 of FIG. 7 can be configured to change impingement characteristic of the one or more beams of radiation exiting multi-source radiation system 1700 at input 710 of multimode waveguide device 704. In some embodiments, actuator 706 and/or restoring device 708 can be configured to change impingement characteristic of each one of the one or more beams of radiation exiting multi-source radiation system 1700 at the input of multimode waveguide device 1204. For example, actuator 706 and/or restoring device 708 can be configured to change a first impingement characteristic of a first one of the one or more beams of radiation exiting multi-source radiation system 1700 at input 710 of multimode waveguide device 704. Actuator 706 and/or restoring device 708 can also be configured to change a second impingement characteristic of a second one of the one or more beams of radiation exiting multi-source radiation system 1700 at input 710 of multimode waveguide device 704.

Similarly, multi-source radiation system 1700 can be used as a radiation source (not shown in FIG. 8) and waveguide device 802 of FIG. 8. For example, waveguide device 802 of FIG. 8 can include combined waveguide device 1707 of FIG. 17. In some embodiments, 834 can be the output of multi-source radiation system 1700 (e.g., single-mode fiber bundle 1709, MCF 1711, and/or small core multimode fiber 1713). In this example, beam of radiation 816 of FIG. 8 can include one or more beams of radiation exiting multi-source radiation system 1700. According to some embodiments, actuator 806 of FIG. 8 can be applied to combined waveguide device 1707.

Multi-source radiation system 1700 can be used as a radiation source (not shown in FIG. 9) and waveguide device 902 of FIG. 9. For example, waveguide device 902 of FIG. 9 can include combined waveguide device 1707 of FIG. 17. In this example, actuator 906 of FIG. 9 can be applied to combined waveguide device 1707. The output of multi-source radiation system 1700 (e.g., single-mode fiber bundle 1709, MCF 1711, and/or small core multimode fiber 1713) can be scanned over input facet 910 of multimode waveguide device 904 of FIG. 9.

In one embodiment, multi-source radiation system 1700 can be used as radiation source 1014 and waveguide device 1002 of FIG. 10. For example, radiation source 1014 of FIG. 10 can include radiation sources 1701, waveguide devices 1703, and waveguide combining element 1705 of FIG. 17. And waveguide device 1002 of FIG. 10 can include combined waveguide device 1707 of FIG. 17. In other words, the output of multi-source radiation system 1700 (e.g., single-mode fiber bundle 1709, MCF 1711, and/or small core multimode fiber 1713) can be input to input facet 1010 of multimode waveguide device 1004 of FIG. 10. In this example, beam of radiation 1012 of FIG. 10 can include one or more beams of radiation exiting multi-source radiation system 1700. According to some embodiments, the output of multi-source radiation system 1700 (e.g., single-mode fiber bundle 1709, MCF 1711, and/or small core multimode fiber 1713) can be scanned over input facet 1010 of multimode waveguide device 1004 of FIG. 10. In this example, multiple radiation source (in multi-source radiation system 1700) can be scanned simultaneously or substantially simultaneously over the input facet of the multimode waveguide device.

For example, the impingement characteristic of the one or more beams of radiation exiting multi-source radiation system 1700 can be changed at input 1010 of multimode waveguide device 1004 of FIG. 10. In some embodiments, impingement characteristic of each one of the one or more beams of radiation exiting multi-source radiation system 1700 can be changed at input 1010 of multimode waveguide device 1004. For example, a first impingement characteristic of a first one of the one or more beams of radiation exiting multi-source radiation system 1700 can be changed at input 1010 of multimode waveguide device 1004. And a second impingement characteristic of a second one of the one or more beams of radiation exiting multi-source radiation system 1700 can be changed at input 1010 of multimode waveguide device 1004.

In one embodiment, multi-source radiation system 1700 can be used as radiation source 1114 and waveguide device 1102 of FIG. 11. For example, radiation source 1114 of FIG. 11 can include radiation sources 1701, waveguide devices 1703, and waveguide combining element 1705 of FIG. 17. And waveguide device 1102 of FIG. 11 can include combined waveguide device 1707 of FIG. 17. In other words, the output of multi-source radiation system 1700 (e.g., single-mode fiber bundle 1709, MCF 1711, and/or small core multimode fiber 1713) can be input to input facet 1110 of multimode waveguide device 1104 of FIG. 11. In this example, beam of radiation 1112 of FIG. 11 can include one or more beams of radiation exiting multi-source radiation system 1700. According to some embodiments, the output of multi-source radiation system 1700 (e.g., single-mode fiber bundle 1709, MCF 1711, and/or small core multimode fiber 1713) can be scanned over a far field plane of input facet 1110 of multimode waveguide device 1104 of FIG. 11. In this example, multiple radiation source (in multi-source radiation system 1700) can be scanned simultaneously or substantially simultaneously over the far-field plane of the input facet of the multimode waveguide device.

For example, the impingement characteristic of the one or more beams of radiation exiting multi-source radiation system 1700 can be changed at the far field plane of input 1110 of multimode waveguide device 1104 of FIG. 11. In some embodiments, impingement characteristic of each one of the one or more beams of radiation exiting multi-source radiation system 1700 can be changed at input 1110 of multimode waveguide device 1104. For example, a first impingement characteristic of a first one of the one or more beams of radiation exiting multi-source radiation system 1700 can be changed at the far field plane of input 1110 of multimode waveguide device 1104. Additionally, a second impingement characteristic of a second one of the one or more beams of radiation exiting multi-source radiation system 1700 can be changed at the far field plane of input 1110 of multimode waveguide device 1104.

In one embodiment, multi-source radiation system 1700 can be used as radiation source 1214 and waveguide device 1202 of FIG. 12. For example, radiation source 1214 of FIG. 12 can include radiation sources 1701, waveguide devices 1703, and waveguide combining element 1705 of FIG. 17. And waveguide device 1202 of FIG. 12 can include combined waveguide device 1707 of FIG. 17. In other words, the output of multi-source radiation system 1700 (e.g., single-mode fiber bundle 1709, MCF 1711, and/or small core multimode fiber 1713) can be input to input facet of multimode waveguide device 1204 of FIG. 12. Diffuser device 1246 of FIG. 12 can be disposed downstream of multi-source radiation system 1700 and upstream of multimode waveguide device 1204 of FIG. 12.

According to some embodiments, diffuser device 1246 of FIG. 12 can be configured to change an impingement characteristic associated with the output of multi-source radiation system 1700 (e.g., single-mode fiber bundle 1709, MCF 1711, and/or small core multimode fiber 1713) at the input facet of multimode waveguide device 1204 of FIG. 12. For example, diffuser device 1246 of FIG. 12 can be configured to change an impingement characteristic of the one or more beams of radiation exiting multi-source radiation system 1700 at the input of multimode waveguide device 1246.

In some embodiments, diffuser device 1246 can be configured to change impingement characteristic of each one of the one or more beams of radiation exiting multi-source radiation system 1700 at the input of multimode waveguide device 1204. For example, diffuser device 1246 can be configured to change a first impingement characteristic of a first one of the one or more beams of radiation exiting multi-source radiation system 1700 at the input of multimode waveguide device 1204. Additionally, diffuser device 1246 can be configured to change a second impingement characteristic of a second one of the one or more beams of radiation exiting multi-source radiation system 1700 at the input of multimode waveguide device 1204.

In one embodiment, multi-source radiation system 1700 can be used as radiation source 1414 of FIG. 14. In other words, the output of radiation source 1414 of FIG. 14 is can be the same as the output of multi-source radiation system 1700 (e.g., single-mode fiber bundle 1709, MCF 1711, and/or small core multimode fiber 1713).

Figure 18C:
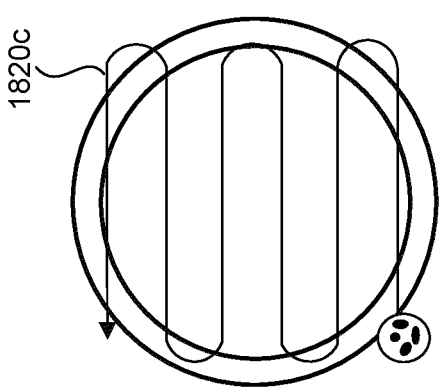
FIGS. 18A-18C illustrate example schematics of scan pattern of multi-source fiber facets of a multi-source radiation system, according to some embodiments.
Figure 18B:
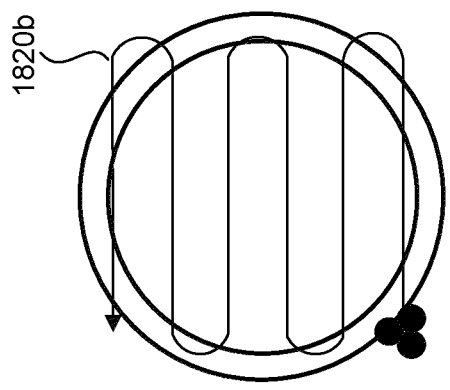
Figure 18A:
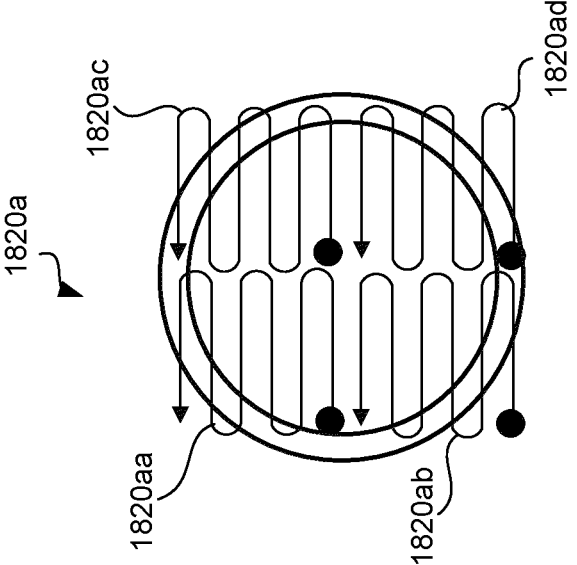

FIGS. 18A-18C show example schematics of scan pattern of multi-source fiber facets of multi-source radiation system 1700, according to some embodiments. For example, FIG. 18A illustrates scan pattern 1820a for single-mode fiber bundle 1709 of FIG. 17, according to some embodiments. FIG. 18B illustrates scan pattern 1820b for MCF 1711 of FIG. 17, according to some embodiments. FIG. 18C illustrates scan pattern 1820c for small core multimode fiber 1713 of FIG. 17, according to some embodiments.

Scan patterns 1820a-1820c can include one or more of scan patterns 520, 720, 920, 1020, and 1120 (e.g., raster, spiral scan pattern, Lissajous, or the like) of FIGS. 5, 7, and 9-11.

According to some embodiments, the scan patterns of FIGS. 18A-18C can depend on the multi-source fiber facets of multi-source radiation system 1700. For example, scan pattern 1820a of FIG. 18A can be used for a fiber bundle with coarsely or densely spaced cores as illustrated in single-mode fiber bundle 1709 of FIG. 17. FIG. 18A illustrates a non-limiting example including four fibers associated with four radiation sources. In this example, each fiber (e.g., each corresponding beam of radiation) can be scanned over a part of the input facet of the multimode waveguide device of the coherence adjuster of this disclosure. For example, scan pattern 1820a can include four scan pattern 1820aa, 1820ab, 1820ac, and 1820ad, each corresponding to one of the fibers (e.g., corresponding beams of radiation).

In some embodiments, by scanning each fiber (e.g., each corresponding beam of radiation) over a part of the input facet of the multimode waveguide device of the coherence adjuster, the whole input facet of the multimode waveguide device can be covered. Alternatively, scanning each fiber over a part of the input facet of the multimode waveguide device of the coherence adjuster can result scanning part of (e.g., not the whole of) the input facet of the multimode waveguide device. In some embodiments, the fibers (e.g., their corresponding beams of radiation) can be scanned simultaneously or substantially simultaneously.

According to some embodiments, scan pattern 1820b of FIG. 18B can be used for a multi-core fiber (e.g., densely spaced fiber/radiation sources) as illustrated in MCF 1711 of FIG. 17. FIG. 18B illustrates a non-limiting example including three fibers associated with three radiation sources. In this example, all the fibers (e.g., all the corresponding beams of radiation) can be scanned together over the input facet of the multimode waveguide device of the coherence adjuster of this disclosure. For example, scan pattern 1820b can include the scan pattern for scanning all the fibers together over the input facet of the multimode waveguide device of the coherence adjuster. In some embodiments, all the fibers can be scanned together over a part of the input facet of the multimode waveguide device of the coherence adjuster. In some embodiments, a first subset of the fibers can be scanned together over the input facet of the multimode waveguide device of the coherence adjuster and then other subset(s) of the fibers can be scanned.

In a non-limiting example, a Photonic Integrated Circuit (PIC) can be used to achieve one or more of multi-source fiber facets 1709-1713. However, the embodiments of this disclosure are not limited to this example and other techniques can be used for achieving one or more of multi-source fiber facets 1709-1713. FIG. 18C illustrates a non-limiting example including multiple modes (e.g., N modes, where N is greater than or equal to a number of fibers/radiation sources). In some embodiments, scan pattern 1820*c* is a scan pattern for a small specked pattern. In the example of FIG. 18C, speckle pattern from a small core multimode fiber can be scanned over the input facet of the multimode waveguide device of the coherence adjuster of this disclosure. For example, scan pattern 1820*c* can include the scan pattern for scanning the speckle pattern from the small core multimode fiber over the input facet of the multimode waveguide device of the coherence adjuster. In some embodiments, the speckle pattern from the small core multimode fiber can be scanned over a part of the input facet of the multimode waveguide device of the coherence adjuster.

Figure 19A:
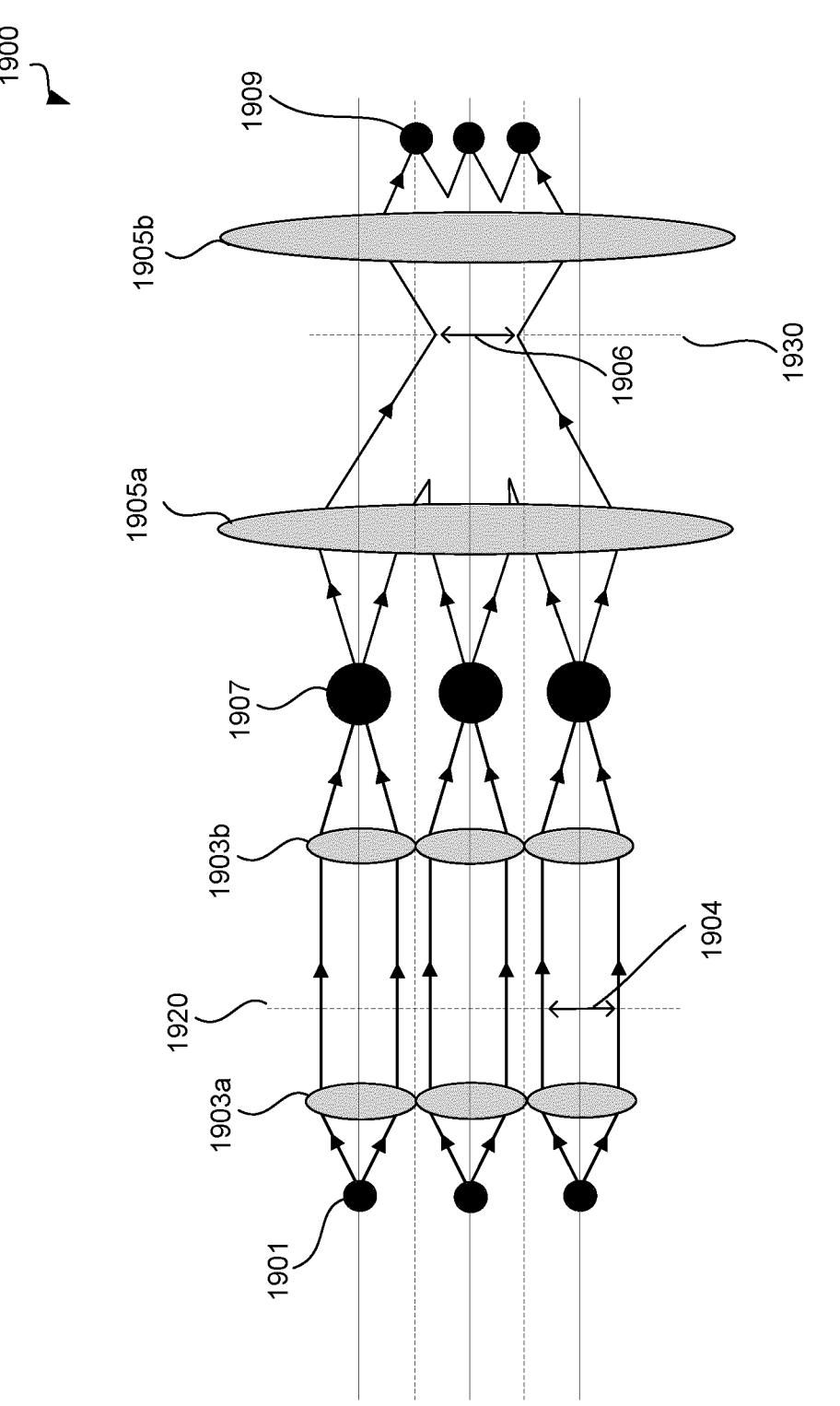
FIGS. 19A and 19B illustrate an exemplary system for changing a coarsely spaced source array to a densely spaced source array, according to some embodiments.
Figure 19B:
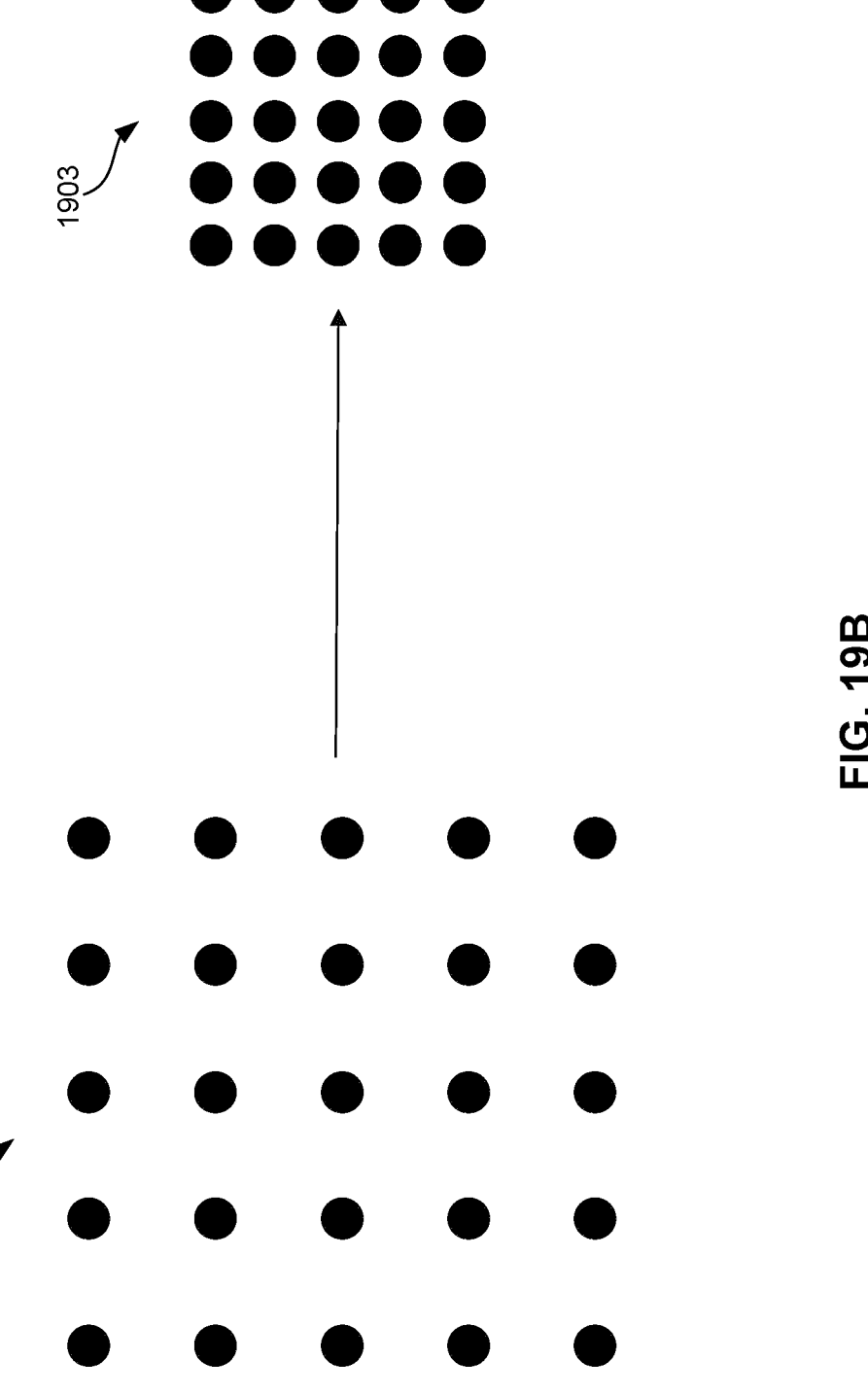

FIGS. 19A and 19B illustrate an exemplary system 1900 for changing a coarsely spaced source array to a densely spaced source array, according to some embodiments. As discussed above, according to some embodiments, the output of multi-source radiation system 1700 can include MCF 1711 and/or small core multimode fiber 1713. In some embodiments, MCF-like source can be generated based on a fiber bundle with coarsely spaced cores (e.g., a fiber bundle with coarsely spaced cores used in single-mode fiber bundle 1709). In the MCF-like source, the images of coarsely spaced cores from fiber bundle will be spaced denser. FIGS. 19A and 19B illustrate one exemplary system that can be used to generate MCF 1711 based on the fiber bundle with coarsely spaced cores.

As illustrated in FIGS. 19A and 19B, source array 1901 can include a coarsely spaced array of radiation sources (and/or fibers/cores). As a non-limiting example, the coarsely spaced array of radiation sources of source array 1901 can be spaced about 100 μm, which then can become densely spaced about 20 μm. However, the embodiments of this disclosure are not limited to this example and the coarsely spaced array of radiation sources of source array 1901 can be spaced using different measurements and can become densely spaced at different measurement. In some examples, source array 1901 can include a plurality of radiation sources 1701 of FIG. 17 that are arranged coarsely spaced with respect to each other. For example, source array 1901 can include a plurality of radiation sources with small spot size and large spacing. Additionally, or alternatively, source array 1901 can include a plurality of waveguide devices 1703 of FIG. 17 (e.g., the outputs of waveguide devices 1703), according to some embodiments.

System 1900 includes optical elements 1903 (e.g., micro-lens arrays) and optical elements 1905 (e.g., free-space optics), according to some embodiments. Optical elements 1903*a* can be configured to collimate the beams of radiation from their corresponding source in radiation source 1901. Optical elements 1903*b* can receive the collimated beams of radiation and generate intermediate source image array 1907. In some embodiments, intermediate source image array 1907 can include sources images with large spot size and large spacing. For example, source array 1901 and intermediate source image array 1907 can have similar (e.g., the same or substantially the same) spacing. However, each source image on intermediate source image array 1907 can have larger spot size than its corresponding source on source array 1901.

According to some embodiments, optical elements 1905*a* and 1905*b* (collectively referred to as optical elements 1905) are configured to convert intermediate source image array 1907 to source array 1909. Each source on source array 1909 can have similar (e.g., the same or substantially the same) spot size than its corresponding source on source array 1901. However, source array 1909 has smaller spacing between its sources compare to source array 1901. Therefore, system 1900 can be configured to change a coarsely spaced source array (e.g., source array 1901) to a densely spaced source array (e.g., source array 1909).

In some embodiments, the NA remains the same or substantially the same in system 1900 although a coarsely spaced source array is changed to a densely spaced source array. In other words, NA associated with optical elements 1903 is the same or substantially the same as the NA associated with optical elements 1905. For example, the width of the radiation between optical elements 1903*a* and 1930*b* (e.g., width 1904) is the same or substantially the same as the width of the radiation between optical elements 1905*a* and 1905*b* (e.g., width 1906). In some examples, width 1904 is measured at pupil plane 1920 of optical elements 1903*a* and width 1906 is measured at pupil plane 1930 of optical element 1905*a*.

It is noted that although FIGS. 19A and 19B are discussed with respect to optical elements 1903 and 1905, other optical elements and/or arrangements can be used to a coarsely spaced source array (e.g., source array 1901) to a densely spaced source array (e.g., source array 1909). For example, reflective optical elements can be used in addition to, or in place of, optical elements 1903 and/or 1905.

Additionally, or alternatively, system 1900 of FIG. 19A can be used as waveguide combining element 1705 of FIG. 17 to, for example, couple a plurality of single-mode sources (e.g., single-mode waveguide devices 1703) into a multi-mode multi-core fiber (MCF—e.g., MCF 1711).

Figure 20:
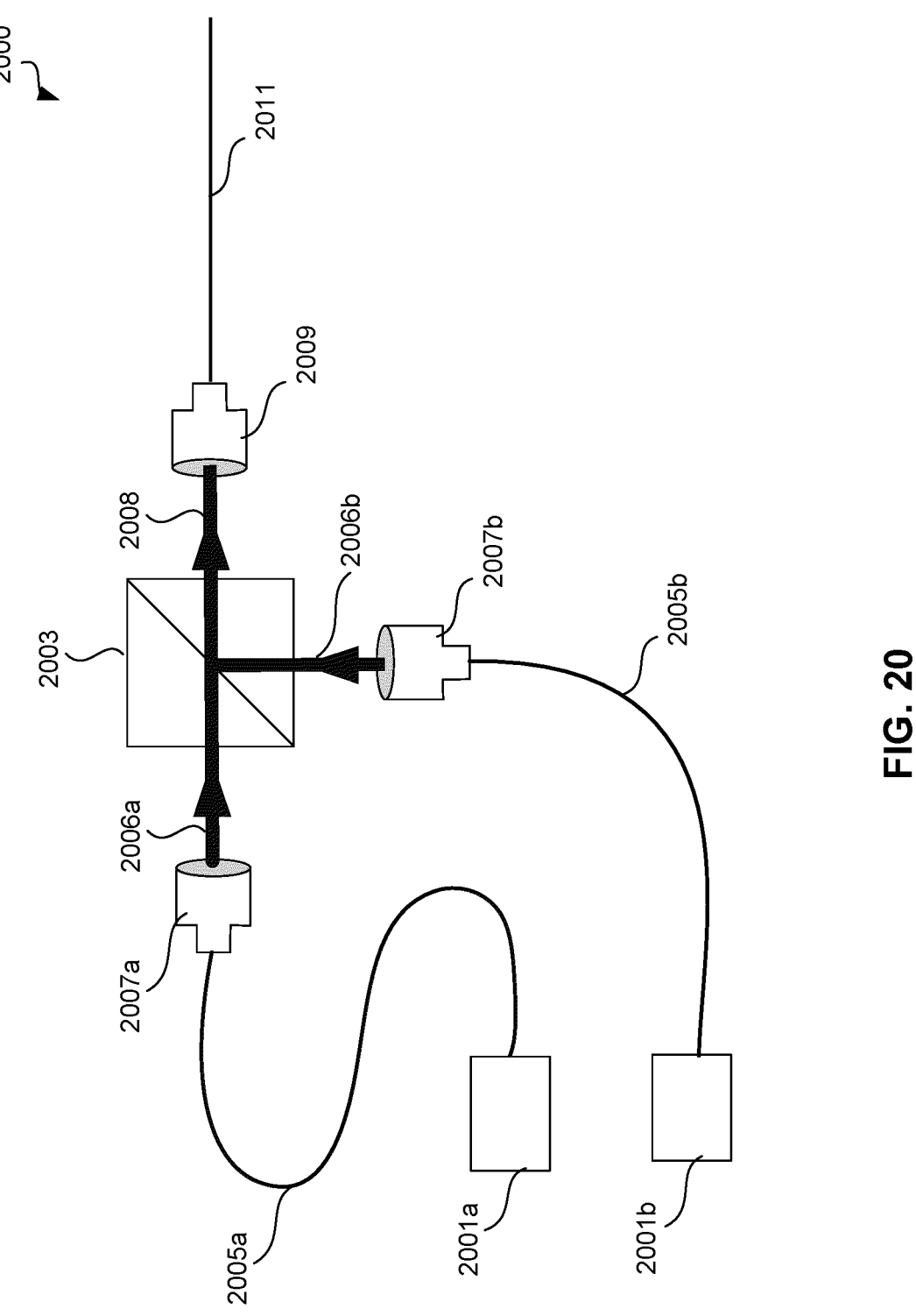
FIG. 20 illustrates a schematic of another multi-source radiation system, according to some embodiments.

FIG. 20 shows a schematic of a multi-source radiation system 2000, according to some embodiments. Multi-source radiation system 2000 can be configured to generate coherent radiation (e.g., spatially coherent radiation). Multi-source radiation system 2000 can include a first radiation source 2001*a* configured to generate a first radiation with a first polarization state. Multi-source radiation system 2000 can include a second radiation source 2001*b* configured to generate a second radiation with a second polarization state. According to some embodiments, the second polarization state is orthogonal to the first polarization state. Multi-source radiation system 2000 can also include a combining element 2003 configured to generate the coherent radiation by combining the first radiation and the second radiation.

According to some embodiments, multi-source radiation system 2000 can include optional waveguide devices 2005*a*, 2005*b*, and 2011 (e.g., a polarization-maintaining (PM) fiber). Multi-source radiation system 2000 can also include optional collimators 2007*a*, 2007*b*, and 2009.

According to some embodiments, combining element 2003 can include a polarizing beam splitter (PBS). However, the embodiments of this disclosure are not limited to this example, and combining element 2003 can include other optical elements configured to combine two radiations from two radiation sources. For example, combining element 2003 can be configured to combine two radiations with orthogonal polarization states. Combining element 2003 can receive a first radiation 2006*a* with a first polarization state (e.g., a vertical polarization state or a s polarization state) from radiation source 2001*a*. Combining element 2003 can receive the first radiation 2006*a* using optional waveguide device 2005*a* and/or optional collimator 2007*a*. However, the embodiments of this disclosure are not limited to optional collimator 2007*a* and/or optional waveguide device 2005*a*, and other optical elements can be used to carry radiation 2006a to combining element 2003. First radiation 2006a can include a coherent radiation (e.g., a spatially coherent radiation).

Combining element 2003 can also receive a second radiation 2006b with a second polarization state (e.g., a horizontal polarization state or a p polarization state) from radiation source 2001b. According to some embodiments, the second polarization state is orthogonal to the first polarization state. Combining element 2003 can receive the second radiation 2006b using optional waveguide device 2005b and/or optional collimator 2007b. However, the embodiments of this disclosure are not limited to optional collimator 2007b and/or optional waveguide device 2005b, and other optical elements can be used to carry radiation 2006b to combining element 2003. According to some embodiments, the second polarization state is orthogonal to the first polarization state. Second radiation 2006b can include a coherent radiation (e.g., a spatially coherent radiation).

Combining element 2003 can combine first radiation 2006a and second radiation 2006b to generate coherent radiation 2008 (e.g., spatially coherent radiation). In some examples, coherent radiation 2008 can have the first and second polarization sates of first and second radiations 2005a and 2005b. Coherent radiation 2008 is output from multi-source radiation system 2000 to the coherent adjusters of this disclosure. Coherent radiation 2008 can have a radiation power as the combination of the radiation power of radiation 2006a and the radiation power of radiation 2006b. For example, coherent radiation 2008 can have a radiation twice the radiation power of radiation 2006a (or radiation 2006b). In some embodiments, optional collimator 2009a and/or optional waveguide device 2011 can be used to connect multi-source radiation system 2000 with the coherent adjusters of this disclosure. However, the embodiments of this disclosure are not limited to optional collimator 2009a and/or optional waveguide device 2011 and other optical elements can be used to carry coherent radiation 2008 to the coherent adjusters of this disclosure.

Multi-source radiation system 2000 can be used with one or more of coherence adjusters 500, 600, 700, 800, 900, 1000, 1100, 1200, and 1400 of FIGS. 5-12 and 14.

In one embodiment, multi-source radiation system 2000 can be used as radiation source 514 (and/or radiation source 514 and waveguide device 502) of FIG. 5. For example, coherent radiation 2008 can include radiation 512 or radiation 516 of FIG. 5. According to some embodiments, if coherent radiation 2008 includes radiation 516 of FIG. 5, actuator 506 and/or restoring device 508 of FIG. 5 can be applied to waveguide device 2011. Coherent radiation 2008 can be scanned over input facet 510 of multimode waveguide device 504 of FIG. 5. For example, actuator 506 and/or restoring device 508 of FIG. 5 can be configured to change impingement characteristic of coherent radiation 2008 at input 510 of multimode waveguide device 504.

Similarly, multi-source radiation system 2000 can be used with waveguide device 602 of FIG. 6. In some embodiments, waveguide device 602 of FIG. 6 can include waveguide device 2011 of FIG. 11. Additionally, or alternatively, waveguide device 602 of FIG. 6 can be coupled to multi-source radiation system 2000 to receive coherent radiation 2008.

In one embodiment, multi-source radiation system 2000 can be used as a radiation source (not shown in FIG. 7) with (or instead of) waveguide device 702 of FIG. 7. For example, coherent radiation 2008 can include radiation to waveguide device 702 or radiation 716 of FIG. 7. According to some embodiments, if coherent radiation 2008 includes radiation 716 of FIG. 7, actuator 706 and/or restoring device 708 of FIG. 7 can be applied to waveguide device 2011. Coherent radiation 2008 can be scanned over input facet 710 of multimode waveguide device 704 of FIG. 7. For example, actuator 706 and/or restoring device 708 can be configured to change impingement characteristic of coherent radiation 2008 at input 710 of multimode waveguide device 704. Similarly, multi-source radiation system 2000 can be used with waveguide device 602 of FIG. 6.

Similarly, multi-source radiation system 2000 can be used as a radiation source with (or instead of) waveguide device 802 of FIG. 8. For example, coherent radiation 2008 can include radiation to waveguide device 802 or radiation 816 of FIG. 8. According to some embodiments, if coherent radiation 2008 includes radiation 816 of FIG. 8, actuator 806 of FIG. 8 can be applied to waveguide device 2011. Multi-source radiation system 2000 can be used as a radiation source with (or instead of) waveguide device 902 of FIG. 9. In some embodiments, actuator 906 of FIG. 9 can be applied to waveguide device 2011. Coherent radiation 2008 can be scanned over input facet 910 of multimode waveguide device 904 of FIG. 9.

In one embodiment, multi-source radiation system 2000 can be used as radiation source 1014 (and/or radiation source 1014 and waveguide device 1002) of FIG. 10. For example, coherent radiation 2008 can include radiation 1012 of FIG. 10. According to some embodiments, coherent radiation 2008 can be scanned over input facet 1010 of multimode waveguide device 1004 of FIG. 10. For example, the impingement characteristic of coherent radiation 2008 can be changed at input 1010 of multimode waveguide device 1004 of FIG. 10.

In one embodiment, multi-source radiation system 2000 can be used as radiation source 1114 (and/or radiation source 1114 and waveguide device 1102) of FIG. 11. For example, coherent radiation 2008 can include radiation 1112 of FIG. 10. According to some embodiments, coherent radiation 2008 can be scanned over a far field plane of input facet 1110 of multimode waveguide device 1104 of FIG. 11. For example, the impingement characteristic of coherent radiation 2008 can be changed at the far field plane of input 1110 of multimode waveguide device 1104.

In one embodiment, multi-source radiation system 2000 can be used as radiation source 1214 (and/or radiation source 1214 and waveguide device 1202) of FIG. 12. For example, coherent radiation 2008 can include radiation 1212 of FIG. 12. In another example, coherent radiation 2008 can include radiation out of waveguide 1202 of FIG. 12. Coherent radiation 2008 can be input to input facet of multimode waveguide device 1204 of FIG. 12. Diffuser device 1246 of FIG. 12 can be disposed downstream of multi-source radiation system 2000 and upstream of multimode waveguide device 1204. According to some embodiments, diffuser device 1246 of FIG. 12 can be configured to change an impingement characteristic associated with coherent radiation 2008 at the input facet of multimode waveguide device 1204. For example, diffuser device 1246 of FIG. 12 can be configured to change an impingement characteristic of coherent radiation 2008 at the input of multimode waveguide device 1246.

In one embodiment, multi-source radiation system 2000 can be used as radiation source 1414 of FIG. 14. In other words, the output of radiation source 1414 of FIG. 14 is can be the same as the output of multi-source radiation system 2000 (e.g., coherent radiation 1412 can be the same as coherent radiation 2008.

Figure 21:
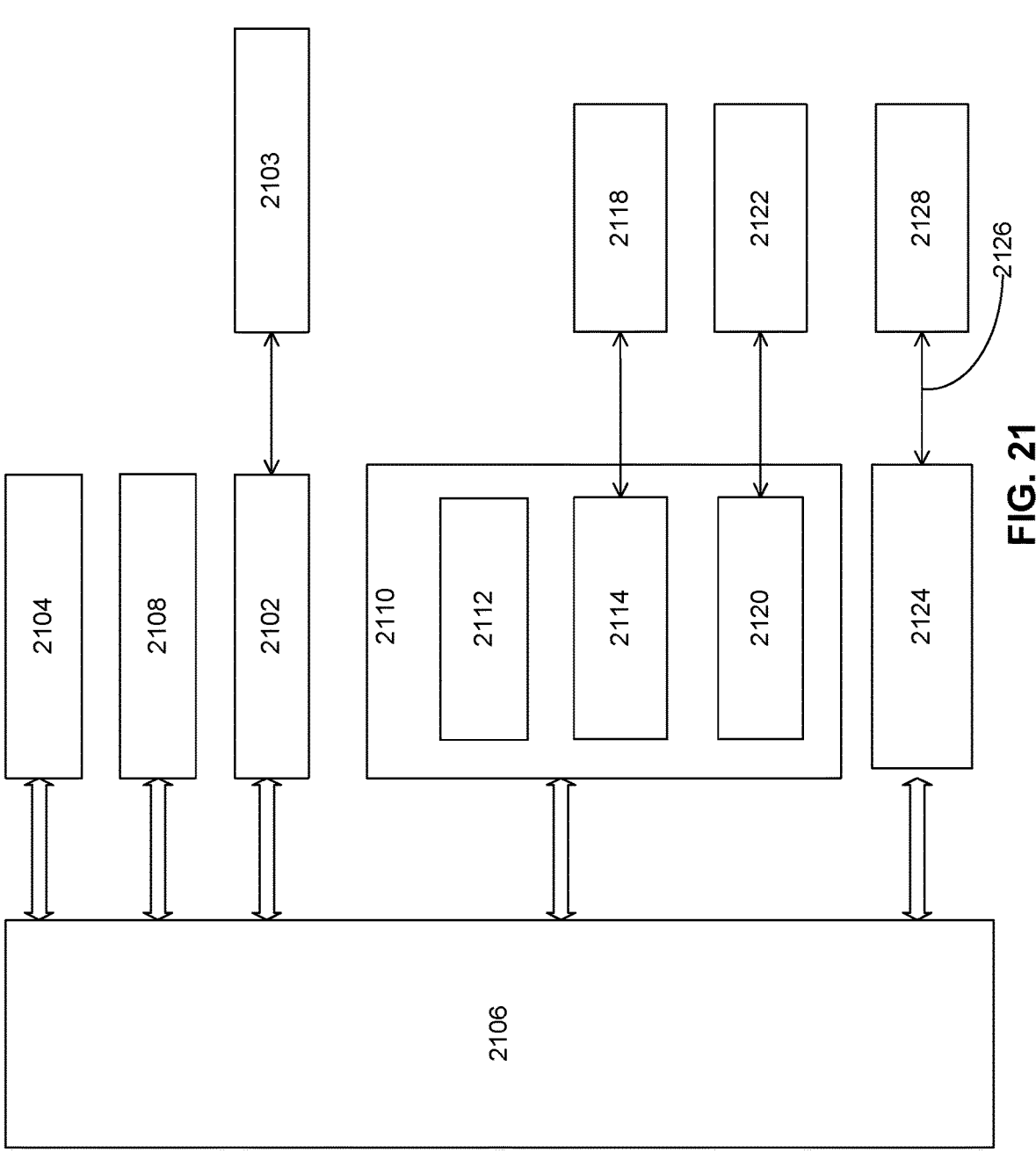
FIG. 21 is an example computer system useful for implementing various embodiments.

Various embodiments may be implemented, for example, using one or more well-known computer systems, such as computer system 2100 shown in FIG. 21. One or more computer systems 2100 may be used, for example, to implement any aspect of the disclosure discussed herein, as well as combinations and sub-combinations thereof.

Computer system 2100 may include one or more processors (also called central processing units, or CPUs), such as a processor 2104. Processor 2104 may be connected to a communication infrastructure or bus 2106.

Computer system 2100 may also include customer input/output device(s) 2103, such as monitors, keyboards, pointing devices, etc., which may communicate with communication infrastructure 2106 through customer input/output interface(s) 2102.

One or more of processors 2104 may be a graphics processing unit (GPU). In an embodiment, a GPU may be a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computer system 2100 may also include a main or primary memory 2108, such as random access memory (RAM). Main memory 2108 may include one or more levels of cache. Main memory 2108 may have stored therein control logic (i.e., computer software) and/or data.

Computer system 2100 may also include one or more secondary storage devices or memory 2110. Secondary memory 2110 may include, for example, a hard disk drive 2112 and/or a removable storage device or drive 2114. Removable storage drive 2114 may be a floppy disk drive, a magnetic tape drive, a compact disk drive, an optical storage device, tape backup device, and/or any other storage device/drive.

Removable storage drive 2114 may interact with a removable storage unit 2118. Removable storage unit 2118 may include a computer usable or readable storage device having stored thereon computer software (control logic) and/or data. Removable storage unit 2118 may be a floppy disk, magnetic tape, compact disk, DVD, optical storage disk, and/any other computer data storage device. Removable storage drive 2114 may read from and/or write to removable storage unit 2118.

Secondary memory 2110 may include other means, devices, components, instrumentalities or other approaches for allowing computer programs and/or other instructions and/or data to be accessed by computer system 2100. Such means, devices, components, instrumentalities or other approaches may include, for example, a removable storage unit 2122 and an interface 2120. Examples of the removable storage unit 2122 and the interface 2120 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 2100 may further include a communication or network interface 2124. Communication interface 2124 may enable computer system 2100 to communicate and interact with any combination of external devices, external networks, external entities, etc. (individually and collectively referenced by reference number 2128). For example, communication interface 2124 may allow computer system 2100 to communicate with external or remote devices 2128 over communications path 2126, which may be wired and/or wireless (or a combination thereof), and which may include any combination of LANs, WANs, the Internet, etc. Control logic and/or data may be transmitted to and from computer system 2100 via communication path 2126.

Computer system 2100 may also be any of a personal digital assistant (PDA), desktop workstation, laptop or notebook computer, netbook, tablet, smart phone, smart watch or other wearable, appliance, part of the Internet-of-Things, and/or embedded system, to name a few non-limiting examples, or any combination thereof.

Computer system 2100 may be a client or server, accessing or hosting any applications and/or data through any delivery paradigm, including but not limited to remote or distributed cloud computing solutions; local or on-premises software ("on-premise" cloud-based solutions); "as a service" models (e.g., content as a service (CaaS), digital content as a service (DCaaS), software as a service (SaaS), managed software as a service (MSaaS), platform as a service (PaaS), desktop as a service (DaaS), framework as a service (FaaS), backend as a service (BaaS), mobile backend as a service (MBaaS), infrastructure as a service (IaaS), etc.); and/or a hybrid model including any combination of the foregoing examples or other services or delivery paradigms.

Any applicable data structures, file formats, and schemas in computer system 2100 may be derived from standards including but not limited to JavaScript Object Notation (JSON), Extensible Markup Language (XML), Yet Another Markup Language (YAML), Extensible Hypertext Markup Language (XHTML), Wireless Markup Language (WML), MessagePack, XML User Interface Language (XUL), or any other functionally similar representations alone or in combination. Alternatively, proprietary data structures, formats or schemas may be used, either exclusively or in combination with known or open standards.

In some embodiments, a tangible, non-transitory apparatus or article of manufacture comprising a tangible, non-transitory computer useable or readable medium having control logic (software) stored thereon may also be referred to herein as a computer program product or program storage device. This includes, but is not limited to, computer system 2100, main memory 2108, secondary memory 2110, and removable storage units 2118 and 2122, as well as tangible articles of manufacture embodying any combination of the foregoing. Such control logic, when executed by one or more data processing devices (such as computer system 2100), may cause such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 21. In particular, embodiments can operate with software, hardware, and/or operating system implementations other than those described herein.

The embodiments may further be described using the following clauses:

1. A metrology system comprising:
    a radiation source configured to generate spatially coherent radiation;
    a coherence adjuster comprising:
        a waveguide device comprising:
            an input configured to receive the spatially coherent radiation; and
            an output;
        a multimode waveguide device comprising:
            an input configured to receive radiation from the waveguide device; and
            an output configured to output a coherence adjusted beam of radiation for irradiating a target; and
        an actuator coupled to the waveguide device and configured to actuate the waveguide device so as to change an impingement characteristic of the received radiation at the input of the multimode waveguide device, wherein an interference pattern of the coherence adjusted beam is adjusted based on the change of the impingement characteristic;
    a detector configured to receive radiation scattered by the target based on the irradiating and to generate a measurement signal based on the received radiation at the detector; and
    a processor configured to analyze the measurement signal to determine a characteristic of the target.

2. The metrology system of clause 1, wherein a homogeneity of the coherence adjusted beam, over an integrated time frame, is increased based on an adjustment of the interference pattern in response to the change of the impingement characteristic.

3. A coherence adjuster comprising:
    a waveguide device comprising:
        an input configured to receive spatially coherent radiation; and
        an output;
    a multimode waveguide device comprising:
        an input configured to receive radiation from the waveguide device; and
        an output configured to output a coherence adjusted beam of radiation; and
    an actuator coupled to the waveguide device and configured to actuate the waveguide device so as to change an impingement characteristic of the received radiation at the input of the multimode waveguide device, wherein an interference pattern of the coherence adjusted beam is adjusted based on the change of the impingement characteristic.

4. The coherence adjuster of clause 3, wherein an apparent coherence of the coherence adjusted beam, over an integrated time frame, is reduced based on an adjustment of the interference pattern in response to the change of the impingement characteristic.

5. The coherence adjuster of clause 3, wherein the change of the impingement characteristic comprises a change of etendue of the received radiation at the input of the multimode waveguide device.

6. The coherence adjuster of clause 3, further comprising one or more lenses configured to focus radiation from the waveguide device at the input of the multimode waveguide device.

7. The coherence adjuster of clause 6, wherein the change of the impingement characteristic comprises a change of position of a focus spot of radiation at the input of the multimode waveguide device.

8. The coherence adjuster of clause 3, further comprising one or more lenses configured to focus radiation from the waveguide device at a conjugate plane of the input of the multimode waveguide device.

9. The coherence adjuster of clause 8, wherein the change of the impingement characteristic comprises a change of position of a focus spot of radiation at the conjugate plane of the input of the multimode waveguide device.

10. The coherence adjuster of clause 3, wherein:
    the actuator comprises one or more piezo devices; and
    the actuating comprises deflecting and/or translating the waveguide device using the one or more piezo devices.

11. The coherence adjuster of clause 3, wherein the waveguide device and the actuator are configured to modularly detach from the multimode waveguide device.

12. The coherence adjuster of clause 3, the multimode waveguide device comprises a multimode fiber.

13. The coherence adjuster of clause 3, wherein the waveguide device comprises a single-mode fiber.

14. The coherence adjuster of clause 3, further comprising an oil or a gel disposed on the multimode waveguide device, wherein the waveguide device is in contact with the oil or gel.

15. The coherence adjuster of clause 3, further comprising:
    a detector configured to generate a detection signal based on received radiation; and
    a beam splitter configured to direct a portion radiation from the waveguide device to the detector, wherein the coherence adjuster is configured to determine the impingement characteristic based on the detection signal.

16. A coherence adjuster comprising:
    a multimode waveguide device comprising:
        an input configured to receive spatially coherent radiation; and
        an output configured to output a coherence adjusted beam of radiation; and
    an adjusting device coupled to a portion of the coherence adjuster and configured to adjust the portion so as to change an impingement characteristic of the received radiation at the input of the multimode waveguide device, wherein
        an interference pattern of the coherence adjusted beam is adjusted based on the change of the impingement characteristic,
        the impingement characteristic comprises a distribution of incidence angles, and
        the coherence adjuster is configured to adjust a beam diameter of the coherence adjusted beam based on a change of the distribution of incidence angles.

17. The coherence adjuster of clause 16, further comprising a reflective element configured to direct the spatially coherent radiation to the multimode waveguide device, wherein
    the adjusting device comprises an actuator,
    the reflective element and actuator are arranged as a galvo mirror, and
    the reflective element is the adjusted portion.

18. The coherence adjuster of clause 16, further comprising a liquid crystal device configured to direct the spatially coherent radiation to the multimode waveguide device, wherein the adjusting device and the liquid crystal device are arranged as a liquid crystal spatial light modulator, and the liquid crystal device is the adjusted portion.

19. The coherence adjuster of clause 16, further comprising reflectors configured to direct the spatially coherent radiation to the multimode waveguide device, wherein the adjusting device comprises actuators, the actuators and the reflectors are arranged as a digital micromirror device, and the reflectors are the adjusted portion.

20. The coherence adjuster of clause 16, further comprising a waveguide device disposed upstream of the multimode waveguide device, wherein the actuated portion is the waveguide device and the waveguide device comprises:

an input configured to receive the spatially coherent radiation; and an output configured to output the spatially coherent radiation before being received at the multimode waveguide device.

21. A coherence adjuster comprising:

a multimode waveguide device comprising:

an input configured to receive spatially coherent radiation; and an output configured to output a coherence adjusted beam of radiation; and a diffuser device disposed upstream of the multimode waveguide device and configured to change an impingement characteristic of the received radiation at the input of the multimode waveguide device, wherein an interference pattern of the coherence adjusted beam is adjusted based on the change of the impingement characteristic, the impingement characteristic comprises a distribution of angles of incidence, and the diffuser device is further configured to adjust a beam diameter of the coherence adjusted beam based on a change of the distribution of incidence angles.

22. The coherence adjuster of clause 21, wherein the diffuser device comprises first and second selectable diffuser elements corresponding to first and second different etendues of the radiation received at the input of the multimode waveguide device; and the system is further configured to select the beam diameter based on a selection from the first and second selectable diffuser structures.

23. The coherence adjuster of clause 21, wherein the diffuser devices is further configured to be rotated, translated, and/or vibrated to change the impingement characteristic.

24. The coherence adjuster of clause 21, wherein:

the coherent radiation comprises a non-zero wavelength bandwidth;

the multimode waveguide device is configured to change relative modes of radiation having different wavelengths; and the adjusting of the interference pattern is further based on the change of the relative modes.

25. The coherence adjuster of clause 21, wherein the multimode waveguide device has a length greater than approximately 2 meters.

26. A coherence adjuster comprising:

a multimode waveguide device comprising:

an input configured to receive spatially coherent radiation; and an output configured to output a coherence adjusted beam of radiation;

an adjusting device coupled to a portion of the coherence adjuster and configured to adjust the portion so as to change an impingement characteristic of the received radiation at the input of the multimode waveguide device, wherein an interference pattern of the coherence adjusted beam is adjusted based on the change of the impingement characteristic, and the impingement characteristic comprises a distribution of incidence angles; and an adjustable beam expander configured to adjust a beam diameter of the coherence adjusted beam.

27. A metrology system, comprising:

a radiation source configured to generate spatially coherent radiation;

a coherence adjuster comprising:

a multimode waveguide device comprising:

an input configured to receive the spatially coherent radiation; and an output configured to output a coherence adjusted beam of radiation;

a detector configured to measure a distribution of the coherence adjusted beam of radiation; and a processor configured to:

compare the measured distribution with a desired distribution;

determine a value for a parameter associated with the coherence adjuster based on the comparison; and communicate the determined value of the parameter associated with the coherence adjuster to the coherence adjuster, wherein the coherence adjuster is configured to adjust the parameter associated with the coherence adjuster based at least on the determined value.

28. The metrology system of clause 27, wherein the detector comprises a field camera configured to measure a near field distribution of the coherence adjusted beam of radiation.

29. The metrology system of clause 27, wherein the detector comprises a pupil camera configured to measure a far field distribution of the coherence adjusted beam of radiation.

30. The metrology system of clause 27, wherein the detector comprises a pupil camera configured to measure a far field distribution of the coherence adjusted beam of radiation and a field camera configured to measure a near field distribution of the coherence adjusted beam of radiation.

31. The metrology system of clause 27, wherein:

the detector is further configured to receive radiation scattered by the target based on the irradiating and to generate a measurement signal based on the received radiation at the detector, and the processor is further configured to:

determine a parameter associated with the target based on the measurement signal;

compare the determined parameter with a desired parameter associated with the target; and determine the value for the parameter associated with the coherence adjuster or a value for a parameter associated with the radiation source based on the comparing the measured distribution with the desired distribution and the comparing the determined parameter with the desired parameter.

32. The metrology system of clause 27, wherein to determine the value of the parameter associated with the coherence adjuster, the processor is further configured to use a model between parameters of the coherence adjuster and a distribution of the coherence adjusted beam of radiation.

33. The metrology system of clause 32, wherein the model comprises one or more inverse correction coefficients.

34. The metrology system of clause 32, wherein to determine the one or more parameters associated with the coherence adjuster, the processor is further configured to use a machine learning model.

35. The metrology system of clause 27, wherein:

the processor is further configured to:

determine a value for a parameter associated with the radiation source based on the comparison; and communicate the determined value for the parameter associated with the radiation source to the radiation source, and the radiation source is configured to adjust the parameter associated with the radiation source based on the determined value.

36. The metrology system of clause 35, wherein to determine the value of the parameter associated with the radiation source, the processor is further configured to use a model between parameters of the radiation source and a distribution of the coherence adjusted beam of radiation.

37. The metrology system of clause 36, wherein the model comprises one or more inverse correction coefficients.

38. The metrology system of clause 36, wherein to determine the value of the parameter associated with the radiation source, the processor is further configured to use a machine learning model.

39. The metrology system of clause 27, wherein to adjust the parameter associated with the coherence adjuster based on the determined value, the coherence adjuster is configured to use a variable dwell time for the received spatially coherent radiation at different locations at the input of the multimode waveguide device.

40. The metrology system of clause 27, wherein to adjust the parameter associated with the coherence adjuster based on the determined value, the coherence adjuster is configured to modulate an intensity of the coherence adjusted beam of radiation as a function of position of the received spatially coherent radiation at the input of the multimode waveguide device.

41. The metrology system of clause 27, wherein to adjust the parameter associated with the coherence adjuster based on the determined value, the coherence adjuster is configured to modulate an intensity of the coherence adjusted beam of radiation as a function of an angle of incidence of the received spatially coherent radiation at the input of the multimode waveguide device.

42. The metrology system of clause 27, wherein the processor is further configured to determine the value of the parameter associated with the coherence adjuster using the desired distribution of the coherence adjusted beam of radiation and a model between parameters of the coherence adjuster and a distribution of the coherence adjusted beam of radiation.

43. The metrology system of clause 42, wherein the model comprises one or more inverse correction coefficients.

44. The metrology system of clause 27, wherein the processor is further configured to determine the value of the parameter associated with the radiation source using the desired distribution of the coherence adjusted beam of radiation and a model between parameters of the radiation source and a distribution of the coherence adjusted beam of radiation.

45. The metrology system of clause 44, wherein the model comprises one or more inverse correction coefficients.

46. The metrology system of clause 27, wherein the coherence adjuster further comprises:

a waveguide device comprising an input configured to receive the spatially coherent radiation and an output.

47. The metrology system of clause 27, further comprising a waveguide device configured to carry the coherence adjusted beam of radiation from the coherence adjuster to the detector.

48. The metrology system of clause 27, wherein the coherence adjuster further comprises:

an adjusting device coupled to a portion of the coherence adjuster and configured to adjust the portion so as to change an impingement characteristic of the received spatially coherent radiation at the input of the multimode waveguide device in response to the determined value of the parameter.

49. The metrology system of clause 27, wherein the radiation source comprises a multi-source radiation system.

50. A metrology system comprising:

a radiation source configured to generate spatially coherent radiation;

a coherence adjuster comprising:

a multimode waveguide device comprising:

an input configured to receive the spatially coherent radiation; and an output configured to output a coherence adjusted beam of radiation for irradiating a target;

a detector configured to receive radiation scattered by the target based on the irradiating and to generate a measurement signal based on the received radiation;

a processor configured to:

determine a parameter associated with the target based on the measurement signal;

compare the determined parameter with a desired parameter associated with the target;

determine a value of a parameter associated with the coherence adjuster based on the comparison; and communicate the determined value of the parameter associated with the coherence adjuster to the coherence adjuster, wherein the coherence adjuster is configured to adjust the parameter associated with the coherence adjuster based at least on the determined value.

51. The metrology system of clause 50, wherein:

the detector is further configured to measure a distribution of the coherence adjusted beam of radiation, and the processor is further configured to:

compare the measured distribution with a desired distribution; and determine the value of the parameter associated with the coherence adjuster or a value of a parameter associated with the radiation source based on the comparing the measured distribution with the desired distribution and the comparing the determined parameter with the desired parameter.

52. The metrology system of clause 50, wherein to determine the value of the parameter associated with the coherence adjuster, the processor is further configured to use a model between parameters of the coherence adjuster and parameters of the target.

53. The metrology system of clause 52, wherein the model comprises one or more inverse correction coefficients.

54. The metrology system of clause 52, wherein to determine the value of the parameter associated with the coherence adjuster, the processor is further configured to use a machine learning model.

55. The metrology system of clause 50, wherein:
the processor is further configured to:
determine a value for a parameter associated with the radiation source based on the comparison; and
communicate the determined value for the parameter associated with the radiation source to the radiation source, and
the radiation source is configured to adjust the parameter associated with the radiation source based on the determined value.

56. The metrology system of clause 55, wherein to determine the value of the parameter associated with the radiation source, the processor is further configured to use a model between parameters of the radiation source and parameters of the target.

57. The metrology system of clause 56, wherein the model comprises one or more inverse correction coefficients.

58. The metrology system of clause 56, wherein to determine the value of the parameter associated with the radiation source, the processor is further configured to use a machine learning model.

59. The metrology system of clause 50, wherein to adjust the parameter associated with the coherence adjuster based on the determined value, the coherence adjuster is configured to use a variable dwell time for the received spatially coherent radiation at different locations at the input of the multimode waveguide device.

60. The metrology system of clause 50, wherein to adjust the parameter associated with the coherence adjuster based on the determined value, the coherence adjuster is configured to modulate an intensity of the coherence adjusted beam of radiation as a function of position of the received spatially coherent radiation at the input of the multimode waveguide device.

61. The metrology system of clause 50, wherein to adjust the parameter associated with the coherence adjuster based on the determined value, the coherence adjuster is configured to modulate an intensity of the coherence adjusted beam of radiation as a function of an angle of incidence of the received spatially coherent radiation at the input of the multimode waveguide device.

62. The metrology system of clause 50, wherein the processor is further configured to determine the value of the parameter associated with the coherence adjuster using the desired parameter of the target and a model between parameters of the coherence adjuster and parameters of the target.

63. The metrology system of clause 62, wherein the model comprises one or more inverse correction coefficients.

64. The metrology system of clause 50, wherein the processor is further configured to determine the value of the parameter associated with the radiation source using the desired parameter of the target and a model between parameters of the radiation source and parameters of the target.

65. The metrology system of clause 64, wherein the model comprises one or more inverse correction coefficients.

66. The metrology system of clause 50, wherein the coherence adjuster further comprises:
a waveguide device comprising an input configured to receive the spatially coherent radiation and an output.

67. The metrology system of clause 50, further comprising:
a waveguide device configured to carry the coherence adjusted beam of radiation from the coherence adjuster to the detector.

68. The metrology system of clause 50, wherein the coherence adjuster further comprises:
an adjusting device coupled to a portion of the coherence adjuster and configured to adjust the portion so as to change an impingement characteristic of the received spatially coherent radiation at the input of the multimode waveguide device in response to the determined value of the parameter.

69. The metrology system of clause 50, wherein the radiation source comprises a multi-source radiation system.

70. A method, comprising:
receiving a measurement signal, wherein the measurement signal is generated based on a measured distribution of a coherence adjusted beam of radiation output from a coherence adjuster;
comparing the measured distribution with a desired distribution;
determining a value of a parameter associated with the coherence adjuster based on the comparison; and
communicating the determined value of the parameter associated with the coherence adjuster to the coherence adjuster,
wherein the coherence adjuster is configured to adjust the parameter associated with the coherence adjuster based at least on the determined value.

71. A method, comprising:
receiving a measurement signal, wherein the measurement signal is generated based on radiation scattered by a target irradiated by a coherence adjusted beam of radiation from a coherence adjuster;
determining a parameter associated with the target based on the measurement signal;
comparing the determined parameter with a desired parameter associated with the target;
determining a value of a parameter associated with the coherence adjuster based on the comparison; and
communicating the determined value of the parameter associated with the coherence adjuster to the coherence adjuster,
wherein the coherence adjuster is configured to adjust the parameter associated with the coherence adjuster based at least on the determined value.

72. A non-transitory computer-readable medium storing instructions that, when executed by a processor, cause the processor to perform operations, the operations comprising:
receiving a measurement signal, wherein the measurement signal is generated based on a measured distribution of a coherence adjusted beam of radiation output from a coherence adjuster;

comparing the measured distribution with a desired distribution;

determining a value of a parameter associated with the coherence adjuster based on the comparison; and communicating the determined value of the parameter associated with the coherence adjuster to the coherence adjuster, wherein the coherence adjuster is configured to adjust the parameter associated with the coherence adjuster based at least on the determined value.

73. A non-transitory computer-readable medium storing instructions that, when executed by a processor, cause the processor to perform operations, the operations comprising:

receiving a measurement signal, wherein the measurement signal is generated based on radiation scattered by a target irradiated by a coherence adjusted beam of radiation from a coherence adjuster;

determining a parameter associated with the target based on the measurement signal;

comparing the determined parameter with a desired parameter associated with the target;

determining a value of a parameter associated with the coherence adjuster; and communicating the determined value of the parameter associated with the coherence adjuster to the coherence adjuster, wherein the coherence adjuster is configured to adjust the parameter associated with the coherence adjuster based at least on the determined value.

74. A metrology system comprising:

a multi-source radiation system comprising a combined waveguide device, wherein the multi-source radiation system is configured to generate one or more beams of radiation;

a coherence adjuster comprising a multimode waveguide device, the multimode waveguide device comprising:

an input configured to receive the one or more beams of radiation from the multi-source radiation system; and an output configured to output a coherence adjusted beam of radiation for irradiating a target; and an actuator coupled to the combined waveguide device and configured to actuate the combined waveguide device so as to change an impingement characteristic of the one or more beams of radiation at the input of the multimode waveguide device.

75. The metrology system of clause 74, wherein the multi-source radiation system further comprises:

a plurality of radiation sources configured to generate a plurality of spatially coherent beams of radiation; and a plurality of waveguide devices coupled to the plurality of radiation sources and configured to receive the plurality of spatially coherent beams of radiation.

76. The metrology system of clause 75, wherein:

the multi-source radiation system further comprises a waveguide combining element coupled between the plurality of waveguide devices and the combined waveguide device, and the waveguide combining element is configured to receive a plurality of beams of radiation from the plurality of waveguide devices and generate the one or more beams of radiation.

77. The metrology system of clause 74, wherein the waveguide combining element comprises at least one of a bundled single-mode fiber with thinned or adiabatically tapered cladding, a bundled single-mode fiber fused into a multimode fiber, or a Photonic Integrated Circuit (PIC) configured to combine single-mode waveguide devices into a multimode waveguide device.

78. The metrology system of clause 74, wherein the actuator is configured to actuate the combined waveguide device so as to change a first impingement characteristic of a first one of the one or more beams of radiation at the input of the multimode waveguide device and to change a second impingement characteristic of a second one of the one or more beams of radiation at the input of the multimode waveguide device.

79. The metrology system of clause 74, wherein:

the actuator comprises one or more motors, and the actuating comprises deflecting and/or translating the combined waveguide device using the one or more motors.

80. A metrology system comprising:

a multi-source radiation system comprising a combined waveguide device, wherein the multi-source radiation system is configured to generate one or more beams of radiation;

a coherence adjuster comprising a multimode waveguide device, the multimode device comprising:

an input configured to receive the one or more beams of radiation; and an output configured to output a coherence adjusted beam of radiation; and an adjusting device coupled to a portion of the coherence adjuster and configured to adjust the portion so as to change an impingement characteristic of the one or more beams of radiation at the input of the multimode waveguide device.

81. The metrology system of clause 80, further comprising a reflective element configured to direct the one or more beams of radiation to the multimode waveguide device, wherein:

the adjusting device comprises an actuator, the reflective element and actuator are arranged as a galvo mirror, and the reflective element is the adjusted portion.

82. The metrology system of clause 80, further comprising reflectors configured to direct the one or more beams of radiation to the multimode waveguide device, wherein:

the adjusting device comprises actuators, the actuators and the reflectors are arranged as a digital micromirror device, and the reflectors are the adjusted portion.

83. The metrology system of clause 80, wherein the multi-source radiation system further comprises:

a plurality of radiation sources configure to generate a plurality of spatially coherent beams of radiation;

a plurality of waveguide devices coupled to the plurality of radiation sources and configured to receive plurality of spatially coherent beams of radiation; and a waveguide combining element coupled between the plurality of waveguide devices and the combined waveguide device, wherein the waveguide combining element is configured to receive a plurality of beams of radiation from the plurality of waveguide devices and generate the one or more beams of radiation.

84. The metrology system of clause 80, wherein the waveguide combining element comprises at least one of a bundled single-mode fiber with thinned or adiabatically tapered cladding, a bundled single-mode fiber fused into a multimode fiber, a multi-core fiber (MFC), or a Photonic Integrated Circuit (PIC) configured to combine waveguide devices into a multimode waveguide device or to combine radiation into a multi-core waveguide device.

85. The metrology system of clause 80, wherein the actuator is configured to actuate the portion of the coherence adjuster so as to change a first impingement characteristic of a first one of the one or more beams of radiation at the input of the multimode waveguide device and to change a second impingement characteristic of a second one of the one or more beams of radiation at the input of the multimode waveguide device.

86. A metrology system comprising:
a multi-source radiation system configured to generate spatially coherent radiation, the multi-source radiation source comprising:
a first radiation source configured to generate a first radiation with a first polarization state;
a second radiations source configured to generate a second radiation with a second polarization state orthogonal to the first polarization state; and
a combining element configured to generate the spatially coherent radiation by combining the first radiation and the second radiation; and
a coherence adjuster comprising a multimode waveguide device, the multimode waveguide device comprising:
an input configured to receive the spatially coherent radiation from the multi-source radiation system; and
an output configured to output a coherence adjusted beam of radiation for irradiating a target.

87. The metrology system of clause 86, wherein the combining element comprises a polarizing beam splitter.

88. The metrology system of clause 86, further comprising:
an actuator coupled to the multi-source radiation system and configured to actuate a waveguide device of the coherence adjuster or a waveguide device of the multi-source radiation system so as to change an impingement characteristic of the spatially coherent radiation at the input of the multimode waveguide device.

89. The metrology system of clause 86, further comprising:
an adjusting device coupled to a portion of the coherence adjuster and configured to adjust the portion so as to change an impingement characteristic of the spatially coherent radiation at the input of the multimode waveguide device.

90. The metrology system of clause 86, further comprising:
a diffuser device disposed upstream of the multi-source radiation system and configured to change an impingement characteristic of the spatially coherent radiation at the input of the multimode waveguide device.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," or the like as used herein may encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A metrology system comprising:
a radiation source configured to generate spatially coherent radiation;
a coherence adjuster comprising:
a waveguide device comprising:
an input configured to receive the spatially coherent radiation; and
an output;

a multimode waveguide device comprising:
an input configured to receive radiation from the waveguide device; and
an output configured to output a coherence adjusted beam of radiation for irradiating a target; and
an actuator coupled to the waveguide device and configured to actuate the waveguide device to change a position of a focus spot of radiation at the input of the multimode waveguide device in a deterministic, non-random manner to increase a homogeneity or an apparent coherence of the coherence adjusted beam;
a detector configured to receive radiation scattered by the target based on the irradiating and to generate a measurement signal based on the received radiation at the detector; and
a processor configured to analyze the measurement signal to determine a characteristic of the target.

2. A coherence adjuster comprising:
a waveguide device comprising:
an input configured to receive spatially coherent radiation; and
an output;
a multimode waveguide device comprising:
an input configured to receive radiation from the waveguide device; and
an output configured to output a coherence adjusted beam of radiation; and
an actuator coupled to the waveguide device and configured to actuate the waveguide device to change a position of a focus spot of radiation at the input of the multimode waveguide device in a deterministic, non-random manner to increase a homogeneity or an apparent coherence of the coherence adjusted beam.

3. The coherence adjuster of claim 2, wherein the change of the position of a focus spot of radiation causes a change of etendue of the received radiation at the input of the multimode waveguide device.

4. The coherence adjuster of claim 2, further comprising one or more lenses configured to focus radiation from the waveguide device at the input of the multimode waveguide device.

5. The coherence adjuster of claim 2, further comprising one or more lenses configured to focus radiation from the waveguide device at a conjugate plane of the input of the multimode waveguide device.

6. The coherence adjuster of claim 2, wherein:
the actuator comprises one or more piezo devices; and
the actuating comprises deflecting and/or translating the waveguide device using the one or more piezo devices.

7. The coherence adjuster of claim 2, wherein the waveguide device and the actuator are configured to modularly detach from the multimode waveguide device.

8. The coherence adjuster of claim 2, the multimode waveguide device comprises a multimode fiber.

9. The coherence adjuster of claim 2, wherein the waveguide device comprises a single-mode fiber.

10. The coherence adjuster of claim 2, further comprising an oil or a gel disposed on the multimode waveguide device, wherein the waveguide device is in contact with the oil or gel.

11. The coherence adjuster of claim 2, further comprising:

a detector configured to generate a detection signal based on received radiation; and a beam splitter configured to direct a portion radiation from the waveguide device to the detector, wherein the coherence adjuster is configured to determine an impingement characteristic based on the detection signal.

12. A coherence adjuster comprising:

a multimode waveguide device comprising:

an input configured to receive spatially coherent radiation; and an output configured to output a coherence adjusted beam of radiation; and an adjusting device coupled to a portion of the coherence adjuster and configured to change a position of a focus spot of radiation, and thereby an impingement characteristic, at the input of the multimode waveguide device in a deterministic, non-random manner to increase a homogeneity or an apparent coherence of the coherence adjusted beam, wherein an interference pattern of the coherence adjusted beam is adjusted based on the change of the impingement characteristic, the impingement characteristic comprises a distribution of incidence angles, and the coherence adjuster is configured to adjust a beam diameter of the coherence adjusted beam based on a change of the distribution of incidence angles.

13. The coherence adjuster of claim 12, further comprising a reflective element configured to direct the spatially coherent radiation to the multimode waveguide device, wherein the adjusting device comprises an actuator, the reflective element and actuator are arranged as a galvo mirror, and the reflective element is the adjusted portion.

14. The coherence adjuster of claim 12, further comprising a liquid crystal device configured to direct the spatially coherent radiation to the multimode waveguide device, wherein the adjusting device and the liquid crystal device are arranged as a liquid crystal spatial light modulator, and the liquid crystal device is the adjusted portion.

15. The coherence adjuster of claim 12, further comprising reflectors configured to direct the spatially coherent radiation to the multimode waveguide device, wherein the adjusting device comprises actuators, the actuators and the reflectors are arranged as a digital micromirror device, and the reflectors are the adjusted portion.

16. The coherence adjuster of claim 12, further comprising a waveguide device disposed upstream of the multimode waveguide device, wherein the actuated portion is the waveguide device and the waveguide device comprises:

an input configured to receive the spatially coherent radiation; and an output configured to output the spatially coherent radiation before being received at the multimode waveguide device.

* * * * *